(12) United States Patent
Sato

(10) Patent No.: US 9,780,779 B2
(45) Date of Patent: Oct. 3, 2017

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Keita Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/221,703

(22) Filed: Jul. 28, 2016

(65) Prior Publication Data

US 2017/0040998 A1 Feb. 9, 2017

(30) Foreign Application Priority Data

Aug. 7, 2015 (JP) .................................. 2015-157366

(51) Int. Cl.
G09G 3/36 (2006.01)
H03K 17/687 (2006.01)
G09G 5/00 (2006.01)
H01L 27/12 (2006.01)

(52) U.S. Cl.
CPC ......... *H03K 17/6872* (2013.01); *G09G 5/003* (2013.01); *H01L 27/124* (2013.01); *G09G 2300/0426* (2013.01); *G09G 2310/0286* (2013.01); *G09G 2310/0289* (2013.01); *G09G 2310/0291* (2013.01); *G09G 2330/021* (2013.01)

(58) Field of Classification Search
CPC .. H03K 17/6872; H01L 27/124; G09G 5/003; G09G 2330/021; G09G 2310/0286; G09G 2310/0289; G09G 2310/0291; G09G 2300/0426
USPC ......................................................... 345/100
See application file for complete search history.

(56) References Cited

U.S. PATENT DOCUMENTS 5,898,322 A 4/1999 Kubota et al.
7,605,830 B2 10/2009 Date
(Continued)

FOREIGN PATENT DOCUMENTS

GB 2029658 3/1980
JP 55-018016 A 2/1980
(Continued)

*Primary Examiner* — Kenneth B Wells
(74) *Attorney, Agent, or Firm* — Fish & Richardson P.C.

(57) ABSTRACT

To provide a small driver IC, a driver IC with a narrow width, a driver IC capable of high-speed operation, a small semiconductor device, a semiconductor device with a narrow width, or a semiconductor device capable of high-speed operation. The semiconductor device includes first to third circuits. The first and second circuits each include transistors with a first channel width. The third circuit includes transistors with a second channel width. The second channel width is larger than the first channel width. The first circuit is configured to select one of first to 2N-th potentials (N is an integer of 1 or more). The second circuit is configured to select one of (2N+1)-th to 4N-th potentials. The third circuit is configured to select the potential selected by the first circuit or the potential selected by the second circuit. The first to third circuits are arranged in line.

23 Claims, 34 Drawing Sheets

(56) References Cited

U.S. PATENT DOCUMENTS

| | | | |
|---|---|---|---|
| 7,643,003 B2 * | 1/2010 | Chun | G09G 3/3677 345/100 |
| 8,094,107 B2 | 1/2012 | Nishimura et al. | |
| 8,446,403 B2 | 5/2013 | Tsuchi et al. | |
| 8,582,716 B2 * | 11/2013 | Koyama | G11C 19/28 326/97 |
| 2007/0091053 A1 | 4/2007 | Kajiwara et al. | |
| 2011/0205218 A1 | 8/2011 | Tsuchi et al. | |
| 2015/0255492 A1 | 9/2015 | Takahashi et al. | |
| 2016/0071463 A1 | 3/2016 | Takahashi et al. | |
| 2016/0071478 A1 | 3/2016 | Takahashi et al. | |

FOREIGN PATENT DOCUMENTS

| | | |
|---|---|---|
| JP | 2007-037191 A | 2/2007 |
| JP | 2007-286525 A | 11/2007 |

* cited by examiner

V-gene

U[1]

MU[0]

FIG. 30A
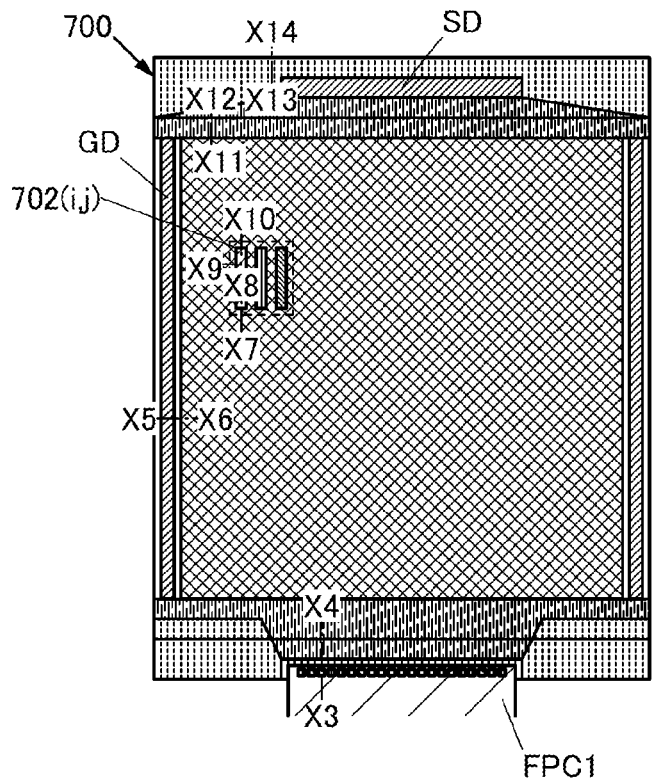
FIG. 30B1
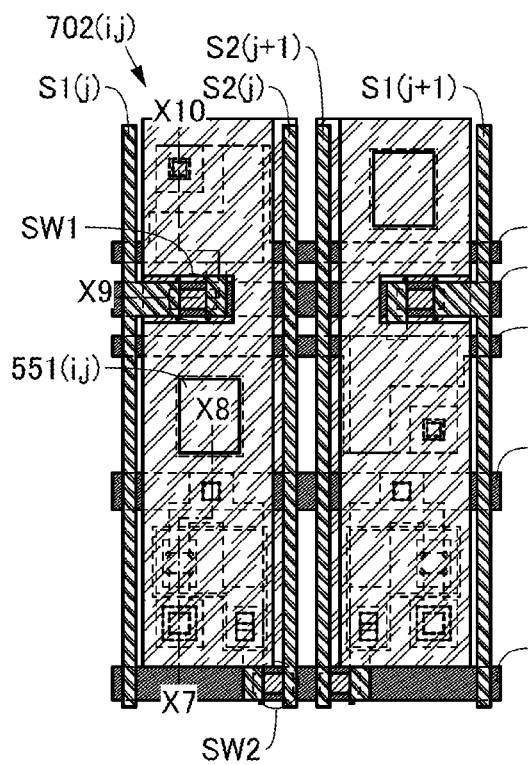
FIG. 30B2
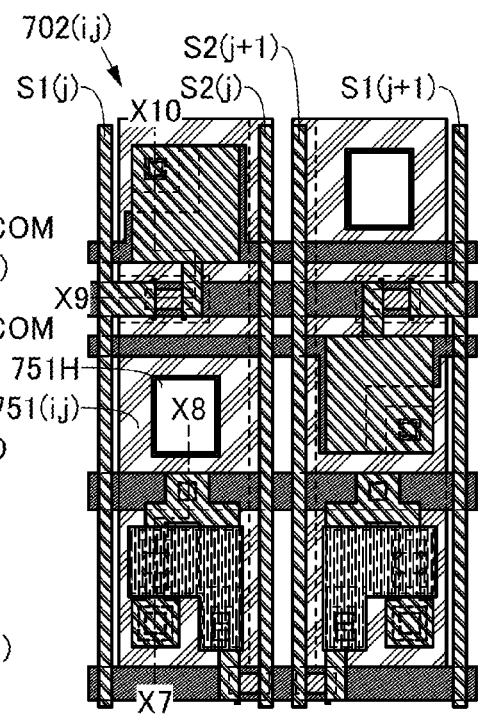

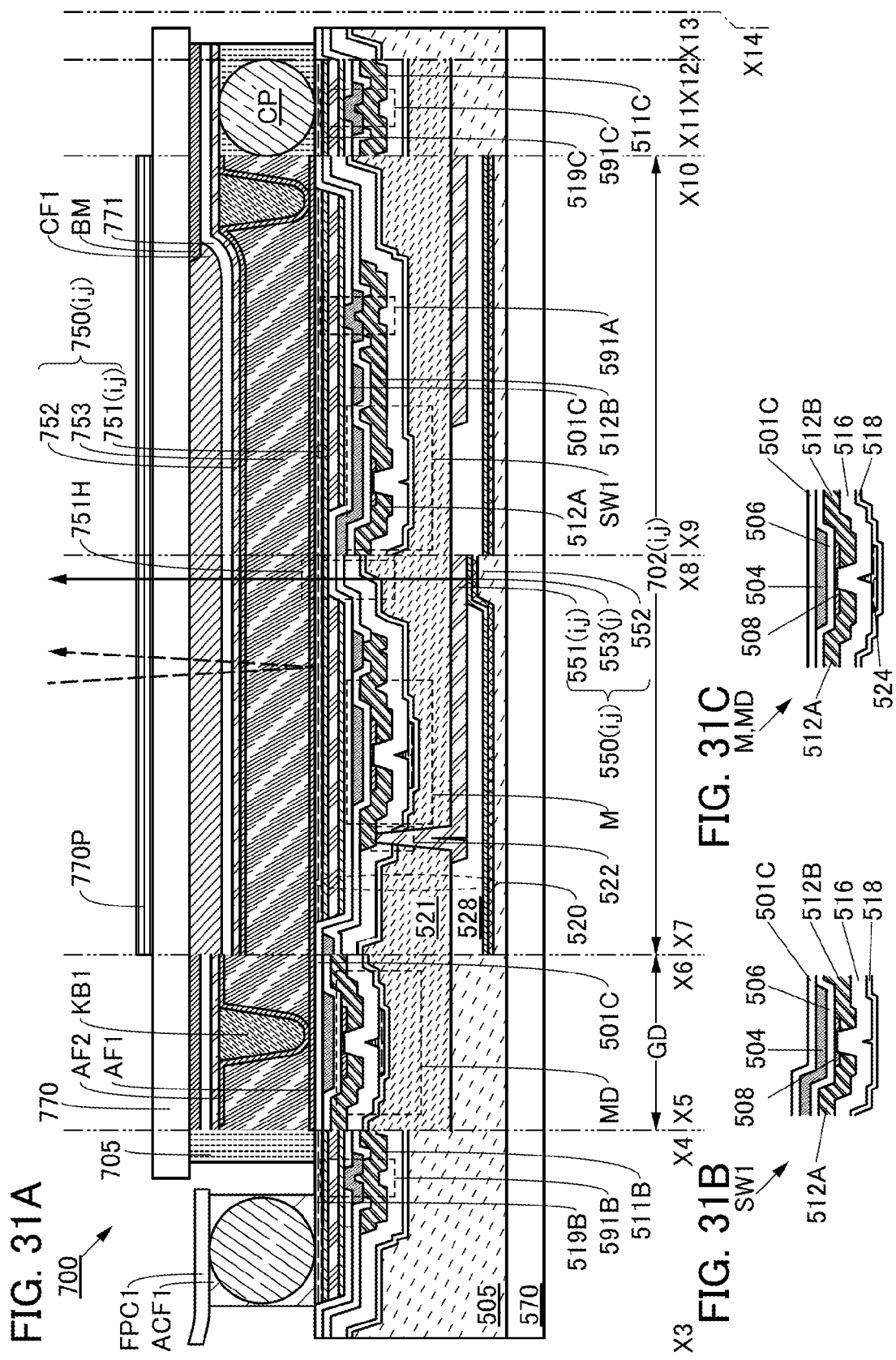

FIG. 33A
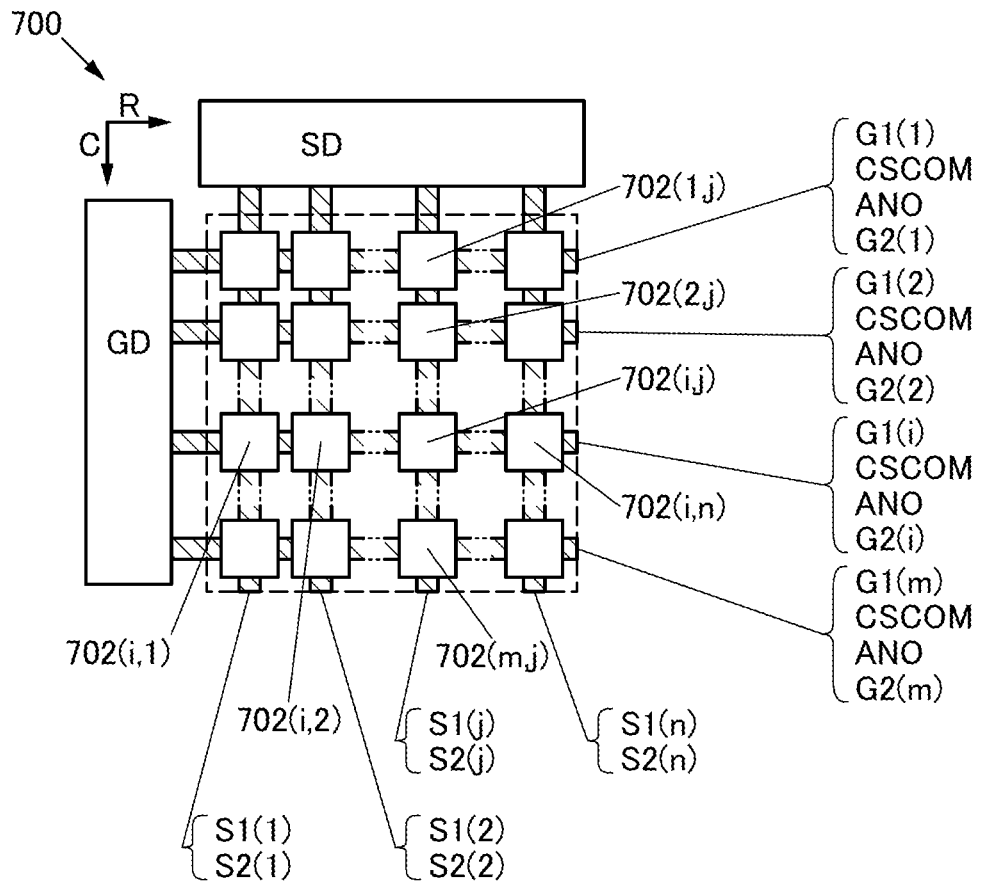
FIG. 33B1
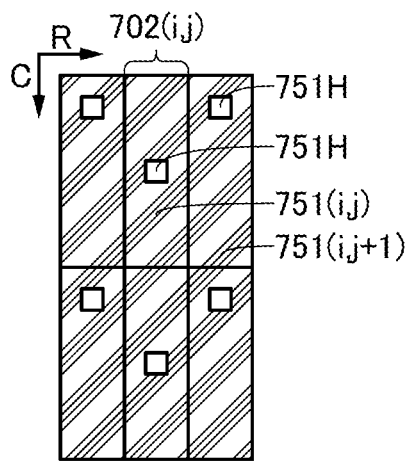
FIG. 33B2
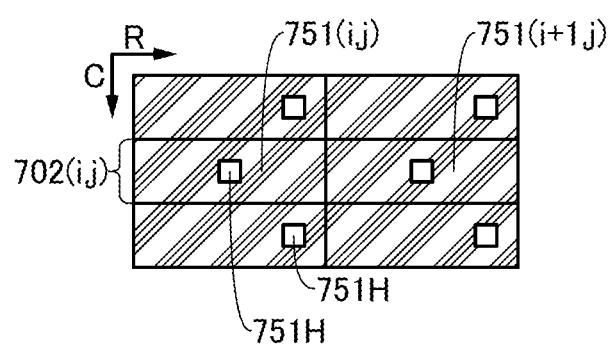

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, or an electronic device.

In addition, one embodiment of the present invention relates to an object, a method, or a manufacturing method. One embodiment of the present invention relates to a process, a machine, manufacture, or a composition of matter. One embodiment of the present invention relates to a display device, a light-emitting device, a power storage device, a memory device, a driving method thereof, or a manufacturing method thereof.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

A driver circuit of a display device is required to have higher performance to meet demand for multiple gray levels and higher definition of a display portion. Accordingly, an integrated circuit (IC, hereinafter also referred to as driver IC) is used as a driver circuit of a display device, particularly as a source driver (e.g., see Patent Document 1).

A small-size display device has been required for portable appliances such as a smartphone and a tablet. Furthermore, higher definition of a display device has been demanded; for example, an 8K ultra high definition (UHD) television with 7680 horizontal pixels by 4320 vertical pixels has been suggested.

REFERENCE

Patent Document

[Patent Document 1] Japanese Published Patent Application No. 2007-286525

SUMMARY OF THE INVENTION

As a display device becomes smaller and has higher definition, a driver IC mounted on the display device is required to be reduced in size and operate at higher speed.

An object of one embodiment of the present invention is to provide a small driver IC. Another object of one embodiment of the present invention is to provide a driver IC with a narrow width. Another object of one embodiment of the present invention is to provide a driver IC capable of high-speed operation. Another object of one embodiment of the present invention is to provide a novel driver IC.

Another object of one embodiment of the present invention is to provide a small semiconductor device. Another object of one embodiment of the present invention is to provide a semiconductor device with a narrow width. Another object of one embodiment of the present invention to provide a semiconductor device capable of high-speed operation. Another object of one embodiment of the present invention is to provide a novel semiconductor device.

Note that the description of a plurality of objects does not mutually preclude the existence. Note that one embodiment of the present invention does not necessarily achieve all the objects listed above. Objects other than those listed above are apparent from the description of the specification, drawings, and claims, and such objects can be an object of one embodiment of the present invention.

One embodiment of the present invention is a semiconductor device including first to fourth wirings and first to sixth transistors. A gate of the first transistor and a gate of the third transistor are electrically connected to the first wiring. A gate of the second transistor and a gate of the fourth transistor are electrically connected to the second wiring. A gate of the fifth transistor is electrically connected to the third wiring. A gate of the sixth transistor is electrically connected to the fourth wiring. One of a source and a drain of the fifth transistor and one of a source and a drain of the sixth transistor are electrically connected to each other. The other of the source and the drain of the fifth transistor is electrically connected to one of a source and a drain of the first transistor and one of a source and a drain of the second transistor. The other of the source and the drain of the sixth transistor is electrically connected to one of a source and drain of the third transistor and one of a source and a drain of the fourth transistor. The first transistor, the third transistor, and the fifth transistor are arranged in line. A channel region of the fifth transistor has a region located between a channel region of the first transistor and a channel region of the third transistor.

In the above structure, it is preferable that the semiconductor device further include a seventh transistor; the one of the source and the drain of the fifth transistor and the one of the source and the drain of the sixth transistor be electrically connected to one of a source and a drain of the seventh transistor; and the first transistor, the third transistor, the fifth transistor, and the seventh transistor be arranged in line.

In the above structure, the first to seventh transistors preferably have the same conductivity type. Alternatively, in the above structure, it is preferable that the first transistor, the second transistor, and the fifth transistor be p-channel transistors and the third transistor, the fourth transistor, and the sixth transistor be n-channel transistors.

In any one of the above structures, it is preferable that the first wiring be supplied with a first signal, the second wiring be supplied with an inverted signal of the first signal, the third wiring be supplied with a second signal, and the fourth wiring be supplied with an inverted signal of the second signal.

In the above structure, the channel width of each of the fifth to seventh transistors is preferably greater than twice and less than five times that of each of the first to fourth transistors. In the above structure, the channel width of the seventh transistor is preferably greater than twice and less than five times that of each of the first to sixth transistors.

Another embodiment of the present invention is a semiconductor device including first to six wirings and first to fifteenth transistors. A gate of the first transistor and a gate of the third transistor are electrically connected to the first wiring. A gate of the second transistor and a gate of the fourth transistor are electrically connected to the second wiring. A gate of the fifth transistor is electrically connected to the third wiring. A gate of the sixth transistor is electrically connected to the fourth wiring. One of a source and a drain of the fifth transistor and one of a source and a drain of the sixth transistor are electrically connected to one of a source and a drain of the seventh transistor. The other of the source and the drain of the fifth transistor is electrically connected to one of a source and a drain of the first transistor and one of a source and a drain of the second transistor. The other of the source and the drain of the sixth transistor is electrically connected to one of a source and drain of the third transistor and one of a source and a drain of the fourth transistor. The first transistor, the third transistor, the fifth transistor, and the seventh transistor are arranged in line. A channel region of the fifth transistor has a region located between a channel region of the first transistor and a channel region of the third transistor. A gate of the eighth transistor, a gate of the tenth transistor, a gate of the twelfth transistor, and a gate of the fourteenth transistor are electrically connected to the fifth wiring. A gate of the ninth transistor, a gate of the eleventh transistor, a gate of the thirteenth transistor, and a gate of the fifteenth transistor are electrically connected to the sixth wiring. One of a source and a drain of the eighth transistor is supplied with a first voltage. One of a source and a drain of the ninth transistor is supplied with a second voltage. One of a source and a drain of the tenth transistor is supplied with a third voltage. One of a source and a drain of the eleventh transistor is supplied with a fourth voltage. One of a source and a drain of the twelfth transistor is supplied with a fifth voltage. One of a source and a drain of the thirteenth transistor is supplied with a sixth voltage. One of a source and a drain of the fourteenth transistor is supplied with a seventh voltage. One of a source and a drain of the fifteenth transistor is supplied with an eighth voltage. The other of the source and the drain of the eighth transistor and the other of the source and the drain of the ninth transistor are electrically connected to the other of the source and the drain of the first transistor. The other of the source and the drain of the tenth transistor and the other of the source and the drain of the eleventh transistor are electrically connected to the other of the source and the drain of the second transistor. The other of the source and the drain of the twelfth transistor and the other of the source and the drain of the thirteenth transistor are electrically connected to the other of the source and the drain of the third transistor. The other of the source and the drain of the fourteenth transistor and the other of the source and the drain of the fifteenth transistor are electrically connected to the other of the source and the drain of the fourth transistor. The fifth wiring is supplied with a third signal. The sixth wiring is supplied with an inverted signal of the third signal. The channel width of each of the fifth to seventh transistors is greater than twice and less than five times the channel width of each of the eighth to fifteenth transistor. The first to fifteenth transistors have the same conductivity type. Gate electrodes of the eighth to fifteenth transistors are continuous.

Another embodiment of the present invention is a semiconductor device including first to third circuits. The first and second circuits each include a plurality of transistors with a first channel width. The third circuit includes a plurality of transistors with a second channel width. The second channel width is larger than the first channel width. The first circuit is configured to select any one of first to 2N-th (N is an integer of 1 or more) which are k-bit potentials. The second circuit is configured to select any one of (2N+1)-th to 4N-th potentials which are k-bit potentials. k satisfies $2N=2^k$. The third circuit is configured to select the potential selected by the first circuit or the potential selected by the second circuit. The first to third circuits are arranged in line.

Another embodiment of the present invention is a semiconductor device including first to fifth circuits. The first to fourth circuits each have a plurality of transistors with a first channel width. The fifth circuit includes a plurality of transistors with a second channel width. The second channel width is larger than the first channel width. The first circuit is configured to select N potentials among first to 2N (N is an integer of 1 or more) potentials which are k-bit potentials. The second circuit is configured to select N potentials among (2N+1)-th to 4N-th potentials which are k-bit potentials. k satisfies $2N=2^k$. The third circuit is configured to select any one of the N potentials selected by the first circuit. The fourth circuit is configured to select any one of the N potentials selected by the second circuit. The fifth circuit is configured to select any one of the potential selected by the third circuit and the potential selected by the fourth circuit. The third to fifth circuits are arranged in line.

In the above structure, the first circuit preferably includes 2N transistors to which the first to 2N-th potentials are supplied and gate electrodes of the 2N transistors are preferably continuous. In the above structure, the first and second circuits are preferably arranged in line and the first and second circuits are preferably arranged in parallel to the second to fifth circuits. In the above structure, the second channel width is greater than twice and less than five times the first channel width.

Another embodiment of the present invention is an electronic component including the semiconductor device according to any of the above embodiments and a bump terminal electrically connected to the semiconductor device.

Another embodiment of the present invention is an electronic device including the above electronic component and a display device.

According to one embodiment of the present invention, a small driver IC can be provided. According to another embodiment of the present invention, a driver IC with a narrow width can be provided. According to another embodiment of the present invention, a driver IC capable of high-speed operation can be provided. According to another embodiment of the present invention, a novel driver IC can be provided.

According to one embodiment of the present invention, a small semiconductor device can be provided. According to one embodiment of the present invention, a semiconductor device with a narrow width can be provided. According to one embodiment of the present invention, a semiconductor device capable of high-speed operation can be provided. According to one embodiment of the present invention, a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 30A, 30B1, and 30B2 illustrate a structure of a display panel of an embodiment.

FIGS. 31A to 31C illustrate a structure of a display panel of an embodiment.

FIGS. 33A, 33B1, and 33B2 illustrate a structure of a display panel of an embodiment.

DETAILED DESCRIPTION OF THE INVENTION

Figure 1:
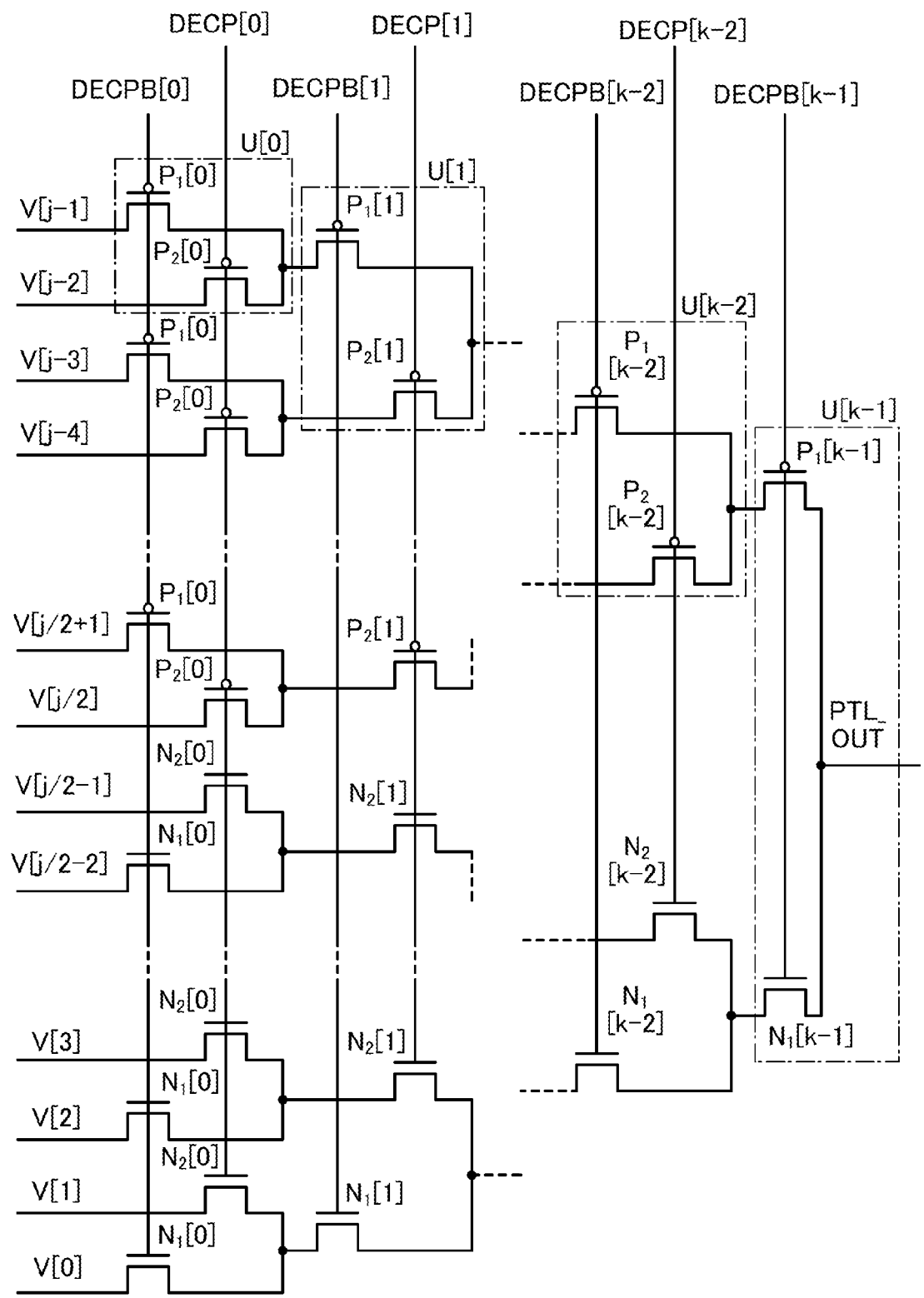
FIG. 1 is a circuit diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or a region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification, the structures, the methods, and the like described in an embodiment can be combined as appropriate with any of the structures, the methods, and the like described in the other embodiments.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Note that the terms "film" and "layer" can be interchanged with each other depending on circumstances or situations. For example, in some cases, the term "conductive film" can be used instead of the term "conductive layer," and the term "insulating layer" can be used instead of the term "insulating film."

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through Z1 (or not through Z1) and a drain (or a second terminal or the like) of the transistor is electrically connected to Y through Z2 (or not through Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Another example of the expression is "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path." It is also possible to use the expression "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a pass transistor logic (hereinafter referred to as PTL) of one embodiment of the present invention will be described.

<<PTL Configuration Example 1>>

A PTL is a circuit having a function of converting an input digital signal into an analog signal. A data signal input to the PTL is a digital signal, and the digital data signal is converted into an analog signal by the PTL. The PTL may be referred to as a digital-to-analog (D/A) converter circuit or simply as a circuit. The PTL can be applied to a driver IC. FIG. 1 illustrates a circuit configuration of a PTL 10 as an example.

The PTL 10 includes transistors $P_1[0]$ to $P_1[k-1]$, transistors $P_2[0]$ to $P_2[k-2]$, transistors $N_1[0]$ to $N_1[k-1]$, and transistors $N_2[0]$ to $N_2[k-2]$. Note that k is a natural number of 2 or more.

The transistors $P_1[0]$ to $P_1[k-1]$ and the transistors $P_2[0]$ to $P_2[k-2]$ are preferably p-channel transistors. The transistors $N_1[0]$ to $N_1[k-1]$ and the transistors $N_2[0]$ to $N_2[k-2]$ are preferably n-channel transistors.

Signals DECPB[0] to DECPB[k-1] and signals DECP[0] to DECP[k-2] are input to the PTL 10. These signals are the aforementioned digital signals and are supplied from a level shifter described later.

The signal DECP[0] is an inverted signal of the signal DECPB[0]. Similarly, the signal DECP[k-2] is an inverted signal of the signal DECPB[k-2].

Note that in this specification, the signal DECPB[0] and the signal DECP[0] may be referred to as first-bit signals; the signal DECPB[c-2] and the signal DECP[c-2], (c-1)th-bit signals (c is a natural number of greater than or equal to 0 and less than or equal to k); and the signal DECPB[k-1], a k-th-bit signal.

The signal DECPB[0] is supplied to gates of the transistor $P_1[0]$ and the transistor $N_1[0]$.

The signal DECP[0] is supplied to gates of the transistor $P_2[0]$ and the transistor $N_2[0]$.

The signal DECPB[k-2] is supplied to gates of the transistor $P_1[k-2]$ and the transistor $N_1[k-2]$.

The signal DECP[k-2] is supplied to gates of the transistor $P_2[k-2]$ and the transistor $N_2[k-2]$.

The signal DECPB[k-1] is supplied to gates of the transistor $P_1[k-1]$ and the transistor $N_1[k-1]$.

Voltages V[0] to V[j-1] (j is an even number of 2 or more) are supplied to the PTL 10 through the transistors $P_1[0]$, $P_2[0]$, $N_1[0]$, and $N_2[0]$. These voltages are generated by a voltage generator circuit V-gene illustrated in FIG. 2.

Figure 2:
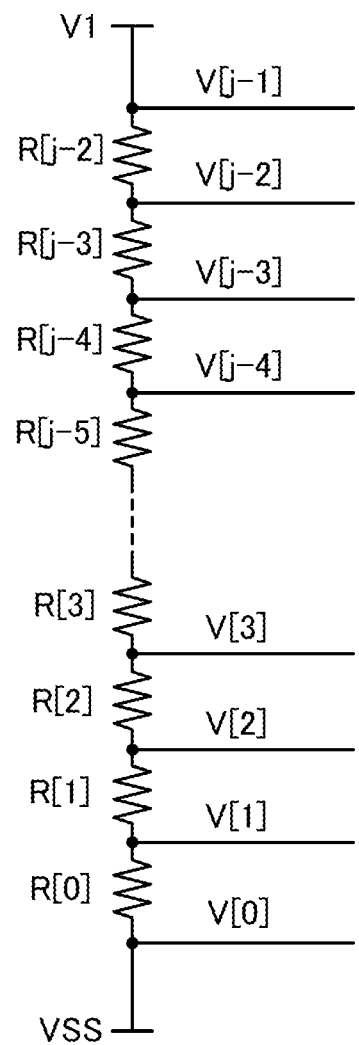
FIG. 2 is a circuit diagram illustrating one embodiment of the present invention.

The voltage generator circuit V-gene illustrated in FIG. 2 includes resistors R[0] to R[j-2] connected in series between wirings that apply a voltage V1/VSS. The voltages V[0] to V[j-1] are obtained by dividing the voltage V1/VSS by the resistors R[0] to R[j-2]. Note that the voltage V1/VSS refers to a voltage with an amplitude ranging from a high power supply potential V1 to a low power supply potential VSS. The low power supply potential VSS may be a ground potential GND.

As shown in FIG. 2, a smaller number in the bracket of the voltages V[0] to V[j-1] means a lower voltage, and a larger number in the bracket means a higher voltage.

The PTL 10 in FIG. 1 has a function of selecting one voltage from the voltages V[0] to V[j-1] in response to the signals DECPB[0] to DECPB[k-1] and the signals DECP[0] to DECP[k-2] input thereto and outputting the selected voltage as an analog signal from an output terminal PTL_OUT.

Figure 3:
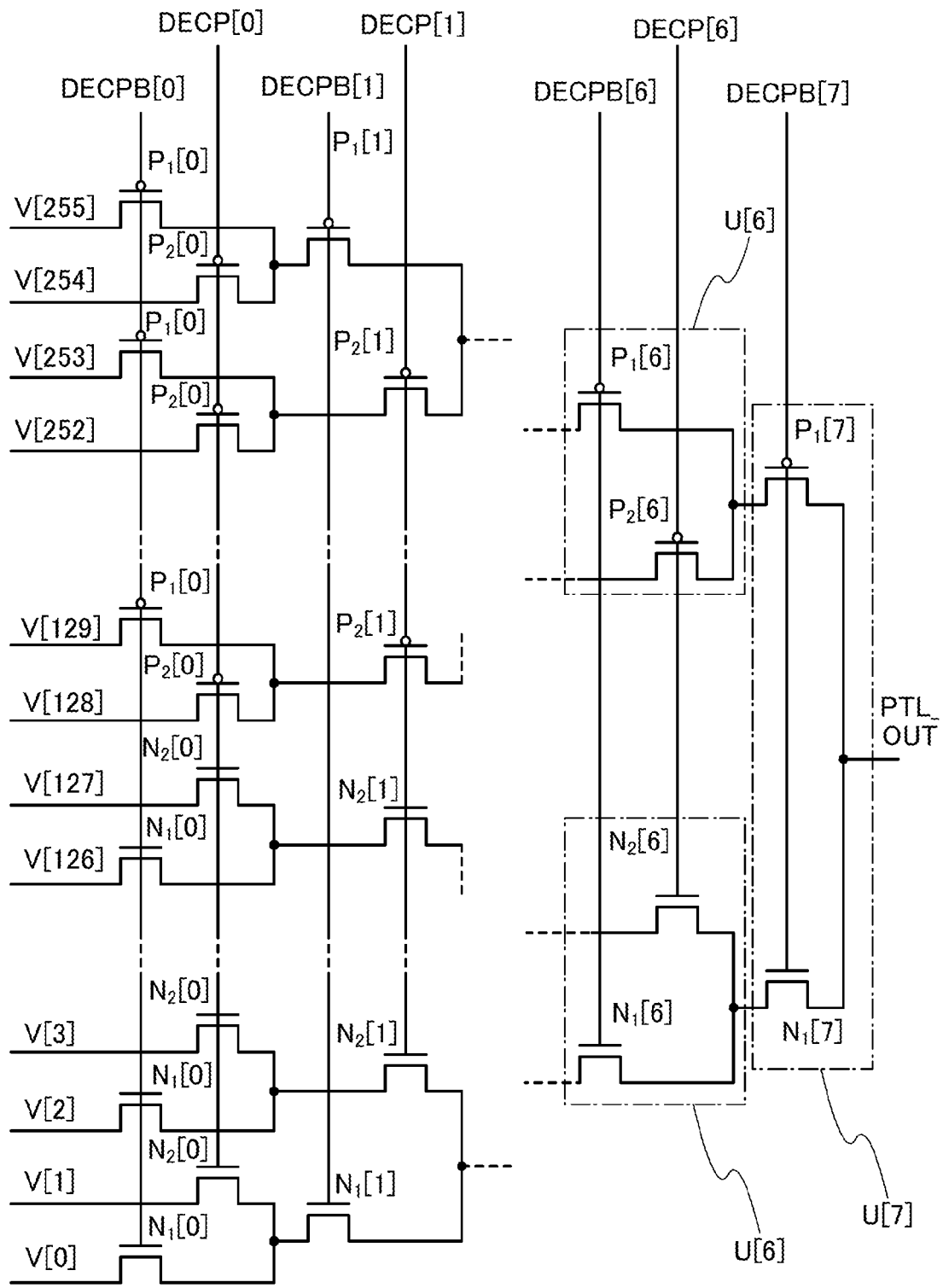
FIG. 3 is a circuit diagram illustrating one embodiment of the present invention.

FIG. 3 illustrates an example where 8-bit data signals (k=8) are input to the PTL 10 and analog signals corresponding to 256 gray levels (j=256) are output from the PTL 10. In this case, signals DECPB[0] to DECPB[7] and signals DECP[0] to DECP[6] are supplied to the PTL 10.

In FIG. 3, for example, when a low-level (hereinafter L-level) potential is supplied as the signals DECPB[0] to DECPB[7] and a high-level (hereinafter H-level) potential is supplied as the signals DECP[0] to DECP[6], a voltage V[255] is output to the output terminal PTL_OUT.

In FIG. 3, for example, when an H-level potential is supplied as the signals DECPB[0] to DECPB[7] and an L-level potential is supplied as the signals DECP[0] to DECP[6], the voltage V[0] is output to the output terminal PTL_OUT.

In the circuit diagram of FIG. 1, the lower half of the circuit supplied with the low voltages V[0] to V[j/2-1] is preferably composed of n-channel transistors (the transistors $N_1[0]$ to $N_1[k-1]$ and the transistors $N_2[0]$ to $N_2[k-2]$). The upper half of the circuit supplied with the high voltages V[j/2] to V[j-1] is preferably composed of p-channel transistors (the transistors $P_1[0]$ to $P_1[k-1]$ and the transistors $P_2[0]$ to $P_2[k-1]$). The reasons are explained below.

First, features of a p-channel transistor are considered. A p-channel transistor is turned on when an L-level potential is supplied to its gate. At this time, when a potential (one of the voltages V[0] to V[j-1]) supplied to the source of the transistor is low, a potential difference (Vgs) between the gate and the source becomes small. As a result, the resistance of the transistor in the on state (hereinafter referred to as on resistance) becomes large and circuit operation becomes slow. For this reason, the circuit on the high voltage side is preferably formed of p-channel transistors as illustrated in FIG. 1.

Next, features of an n-channel transistor are considered. When an H-level potential is supplied to the gate of an n-channel transistor, the transistor is turned on, and the source potential becomes close to a potential (one of the voltages V[0] to V[j-1]) supplied to its drain. At this time, when the potential supplied to the drain is high, Vgs becomes smaller than the threshold voltage (Vth) of the transistor before the potential of the drain becomes equal to that of the source, and the transistor is turned off. Consequently, the transistor outputs a voltage that is lower by Vth. For this reason, the circuit on the low voltage side is preferably formed of n-channel transistors as illustrated in FIG. 1.

<Transistor Arrangement Example 1>

Next, an arrangement example of transistors in the PTL 10 will be specifically described with reference to FIG. 4.

Figure 4:
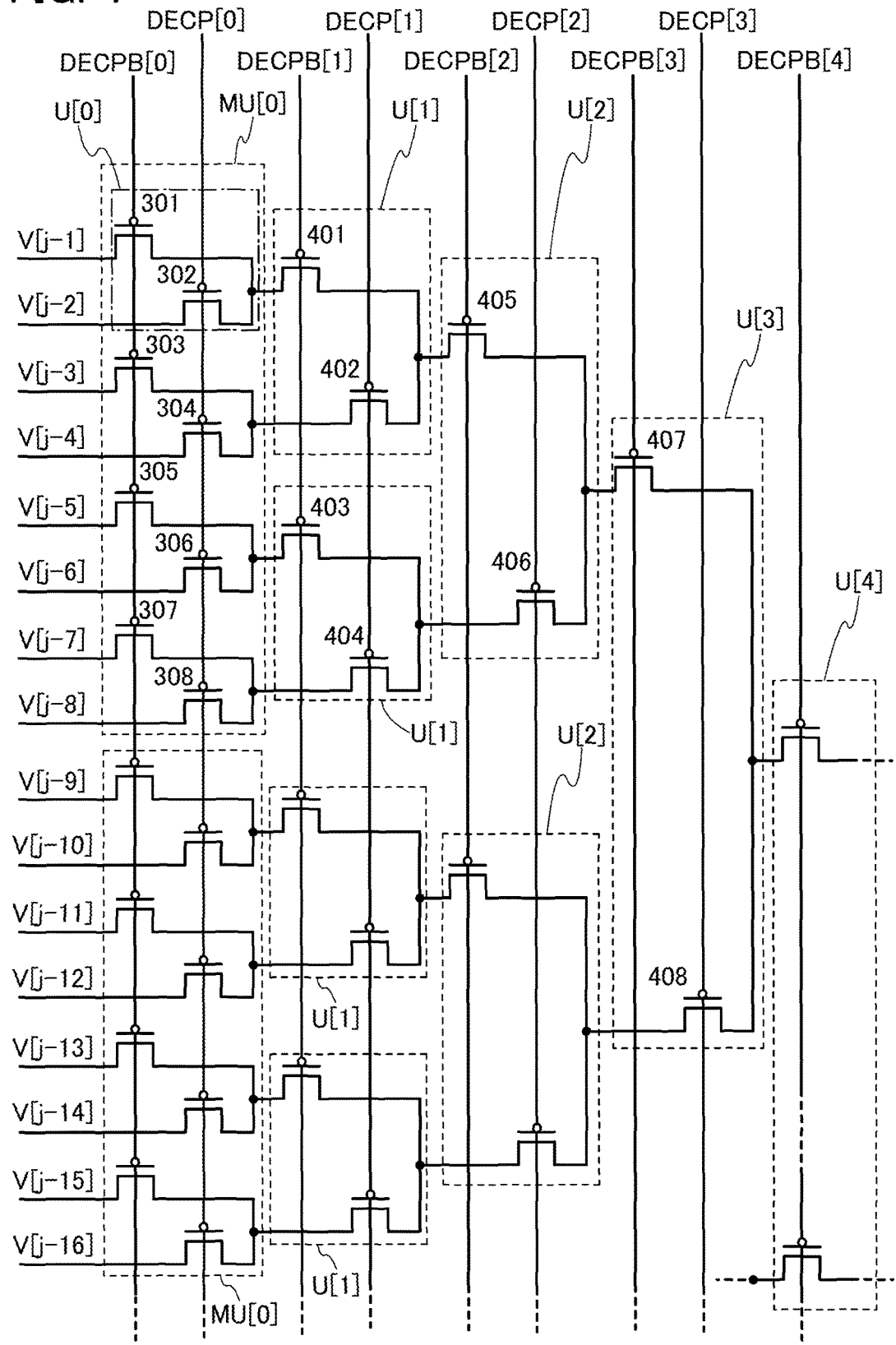
FIG. 4 is a circuit diagram illustrating one embodiment of the present invention.

FIG. 4 illustrates part of the circuit diagram of the PTL 10 in FIG. 1 and assigns reference numerals 301 to 308 and 401 to 408 to transistors.

A unit U[c] refers to a pair of transistors in which one of a source and a drain of one of the pair of transistors is connected to one of a source and a drain of the other of the pair of transistors, a gate of the one of the pair of transistors is supplied with a signal DECPB[c], and a gate of the other of the pair of transistors is supplied with a signal DECP[c]. The unit U[c] is referred to as a pass transistor in some cases.

For example, the transistor $P_1[c]$ and the transistor $P_2[c]$ illustrated in FIG. 1 and FIG. 3 can be referred to as the unit $U[c]$. The transistor $N_1[c]$ and the transistor $N_2[c]$ can also be referred to as the unit $U[c]$.

In FIG. 4, a pair of transistors connected to a first bit signal line, e.g., the transistor 301 and the transistor 302, can be referred to as a unit U[0]. Here, four pairs of units U[0] in FIG. 4 are represented as a unit MU[0]. In FIG. 4, the transistors 301 to 308 are represented as a unit MU[0].

Figure 5:
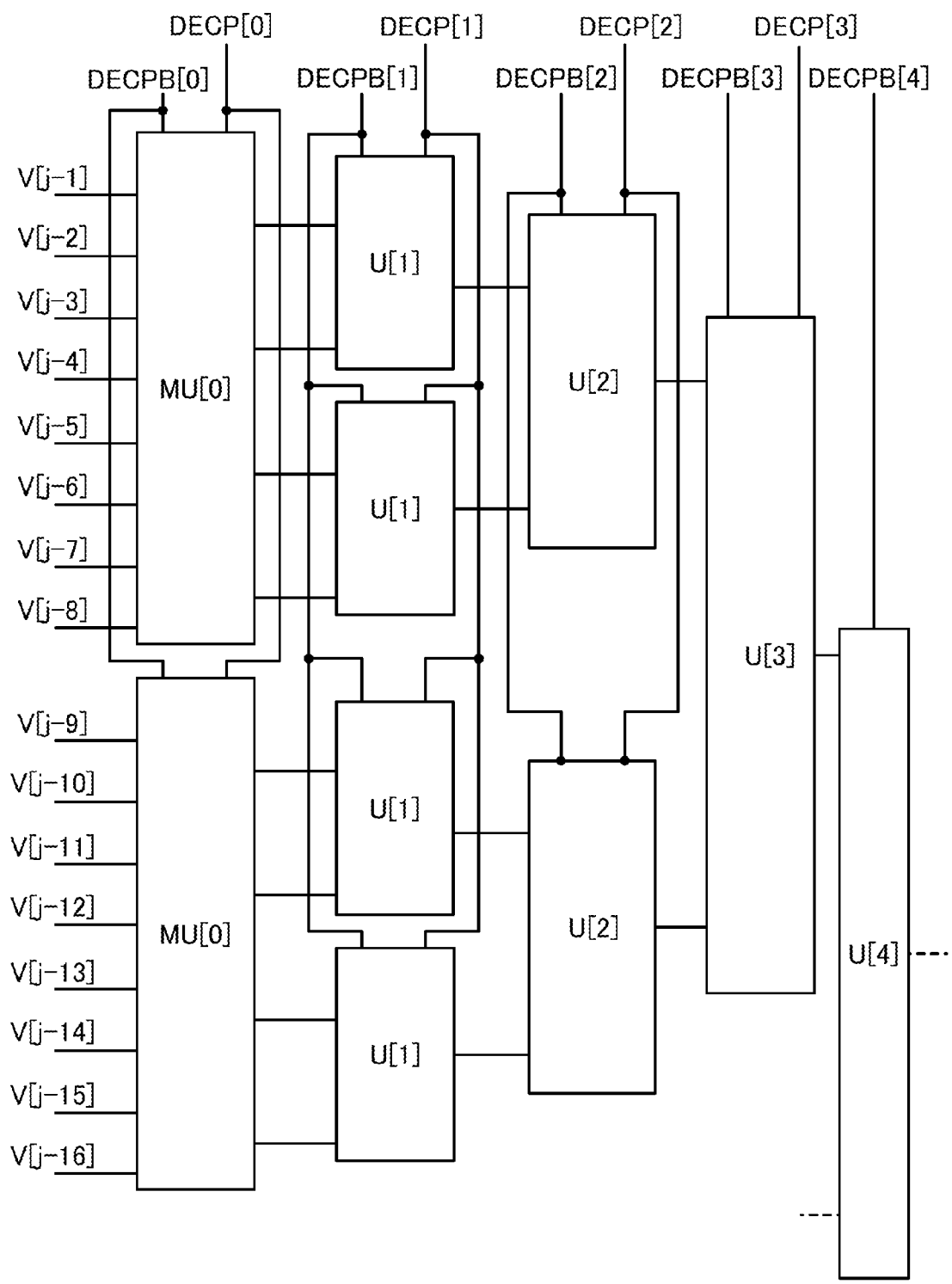
FIG. 5 is a block diagram illustrating one embodiment of the present invention.

FIG. 5 is a block diagram of the circuit illustrated in FIG. 4.

Figure 6:
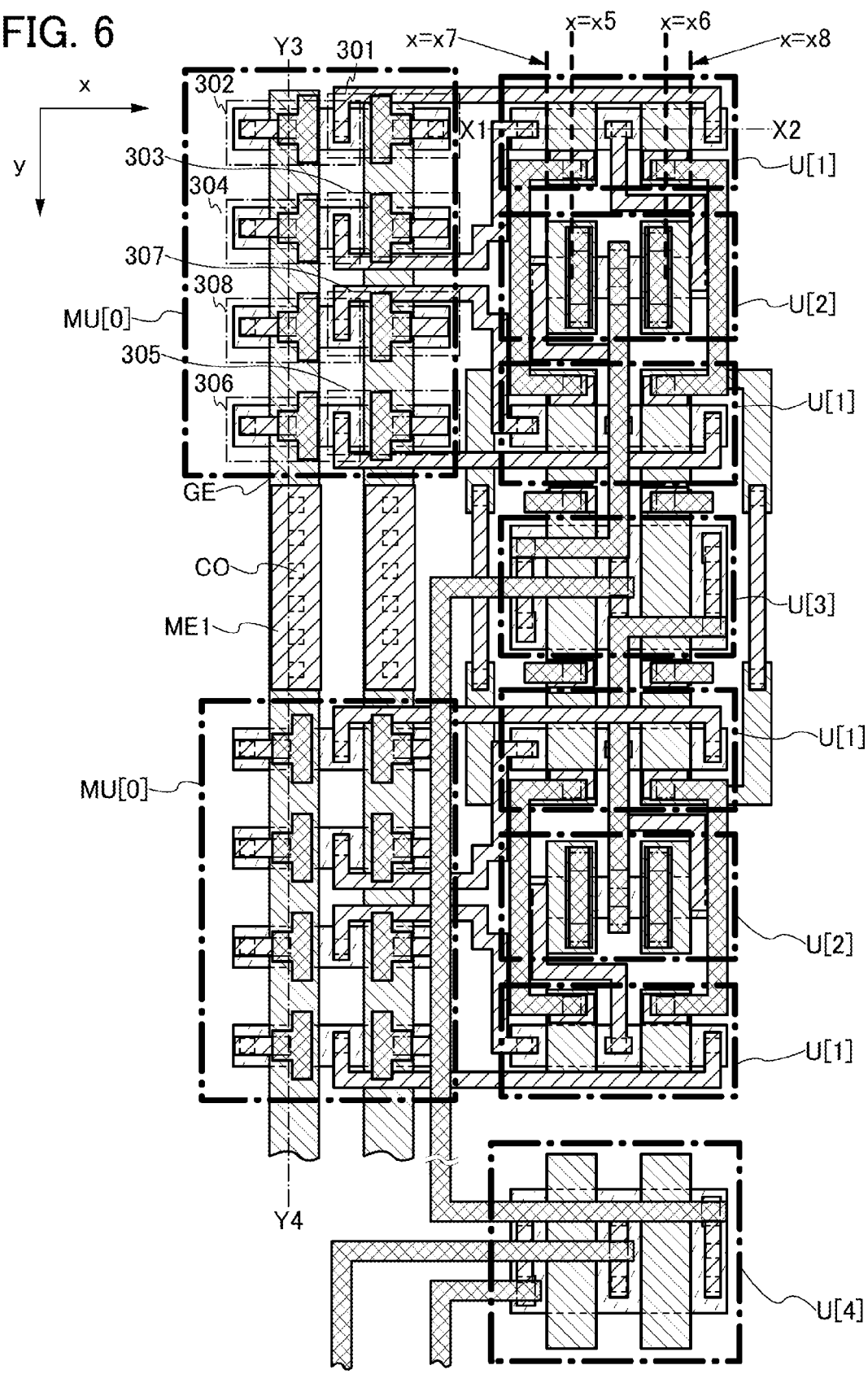
FIG. 6 is a top view illustrating one embodiment of the present invention.

FIG. 6 illustrates an example of a top view of the circuit illustrated in FIG. 4. In the top view of FIG. 6, some components are omitted for easy understanding.

Note that FIG. 4 and FIG. 6 show part of the circuit composed of p-channel transistors on the high voltage side, i.e., the circuit on the side to which the high voltage is input, in the circuit diagram of FIG. 1; however, the following description also applies to the case where the circuit in FIG. 4 and FIG. 6 is the circuit composed of n-channel transistors on the low voltage side.

Figure 7A:
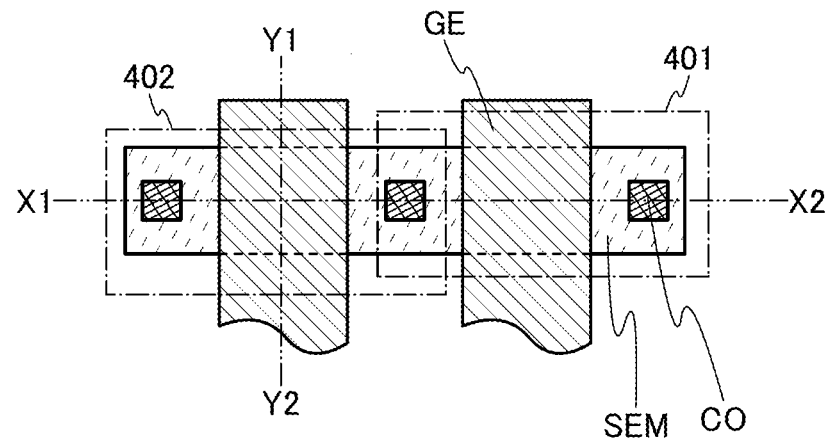
FIGS. 7A and 7B are top views illustrating one embodiment of the present invention.
Figure 7B:
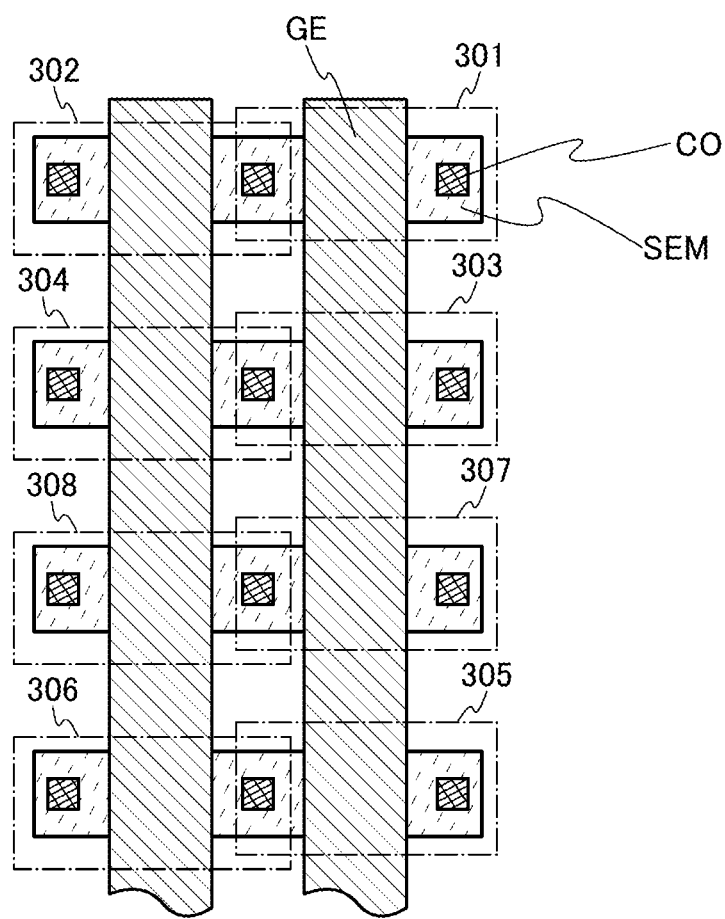

FIG. 7A is a top view of a pair of transistors which are used as each of the units U[0] to U[2] in FIG. 4. FIG. 7A is a top view of the unit U[1] as an example, and a pair of transistors can be arranged in the units U[0] and U[2] in a similar manner. FIG. 7B is a top view of the transistors 301 to 308 which are used as a unit MU[0] in FIG. 4.

Figure 8A:
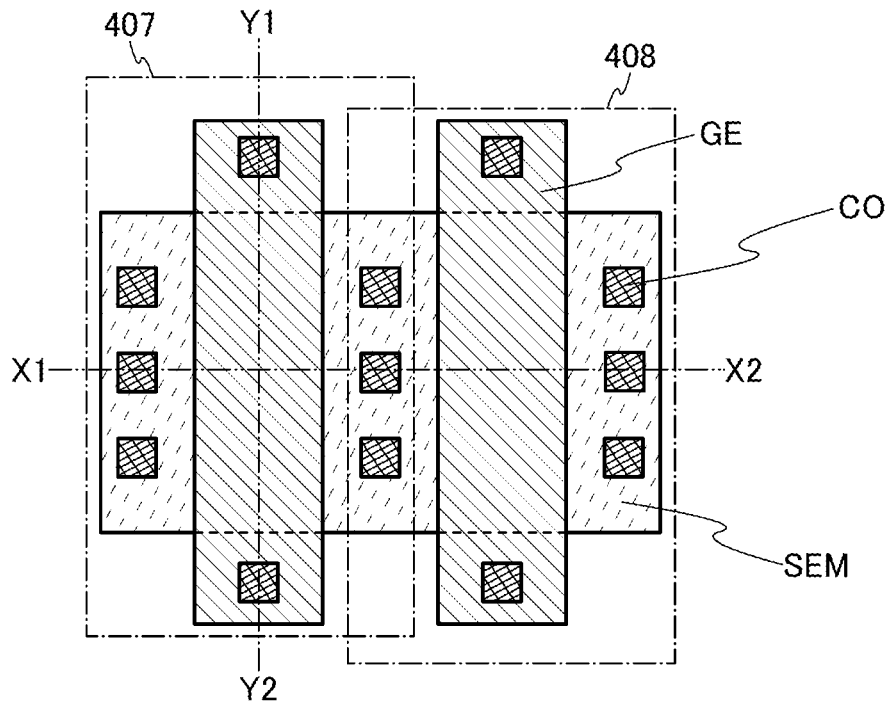
FIGS. 8A and 8B are top views illustrating one embodiment of the present invention.

FIG. 8A is a top view of a pair of transistors which are used as each of the units U[3] to U[4] in FIG. 4. FIG. 8A is a top view of the unit U[3] as an example, and a pair of transistors can be arranged in the unit U[4] in a similar manner.

Figure 8B:
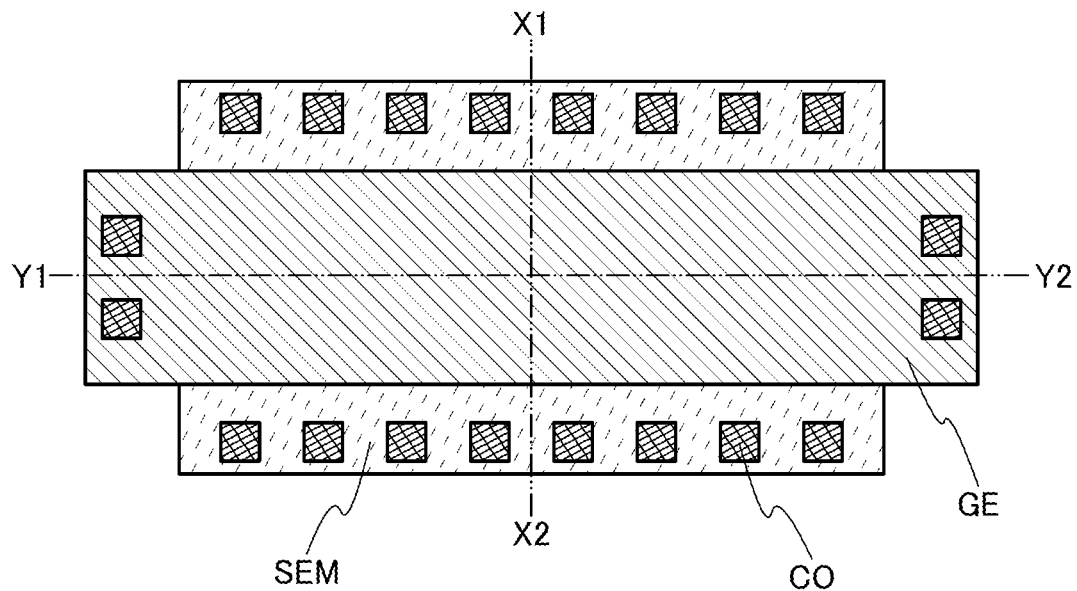

FIG. 8B illustrates a transistor $P_1[7]$ used in a unit U[7].

In the top views of FIGS. 7A and 7B and FIGS. 8A and 8B, the transistors each include the semiconductor SEM, the gate GE, and the contacts CO. In the semiconductor SEM, a region overlapping with the gate electrode GE functions as a channel, and a region not overlapping with the gate electrode GE functions as a source or a drain. The gate electrode GE functions as a gate of the transistor. The resistance of the source and the drain is preferably lowered by impurity addition. In the semiconductor SEM, an impurity different from that for the transistor $P_1[7]$ is preferably added to a source region and a drain region of the transistor $N_1[7]$. For example, an impurity imparting n-type conductivity and an impurity imparting p-type conductivity are preferably added to source and drain regions of the transistor $N_1[7]$ and source and drain regions of the transistor $P_1[7]$, respectively.

In FIG. 7B, one continuous gate electrode GE is provided as gate electrodes of the transistors 301, 303, 305, and 307 to which the signal DEPB[0] is input. Similarly, one continuous gate electrode GE is provided as gate electrodes of the transistors 302, 304, 306, and 308 to which the signal DEP[0] is input. One continuous gate electrode GE does not require a contact for connection to a wiring in an upper layer (e.g., a wiring ME1). Thus, the number of contacts can be reduced and the distance between the transistors can be shortened because a contact (e.g., a contact CO) between the gate electrode GE and a wiring in an upper layer does not need to be provided for each of the gates of the transistors. Furthermore, the number of wirings arranged in upper layers of the transistors 301 to 308 can be reduced, which leads to an increase in the degree of freedom of arrangement of wirings in the upper layers.

In FIG. 7B, the transistors 301, 303, 305, and 307 share the gate electrode GE. Furthermore, the transistors 302, 304, 306, and 308 share the gate electrode GE.

Here, in FIG. 6, the gate electrode GE connected to the two units MU[0] has a region overlapping with the wiring ME1, in which the gate electrode GE is electrically connected to the wiring ME1 through the contact CO. In the case where the gate electrode GE has higher resistance than the wiring ME1, the influence of the resistance of the gate electrode GE on the PTL 10 can be reduced.

In the PTL 10, a wiring and the like are formed above the semiconductor SEM and the gate electrode GE so that connections illustrated in FIG. 4 are completed; however, they are omitted in FIGS. 7A and 7B and FIGS. 8A and 8B for clarification.

Figure 9:
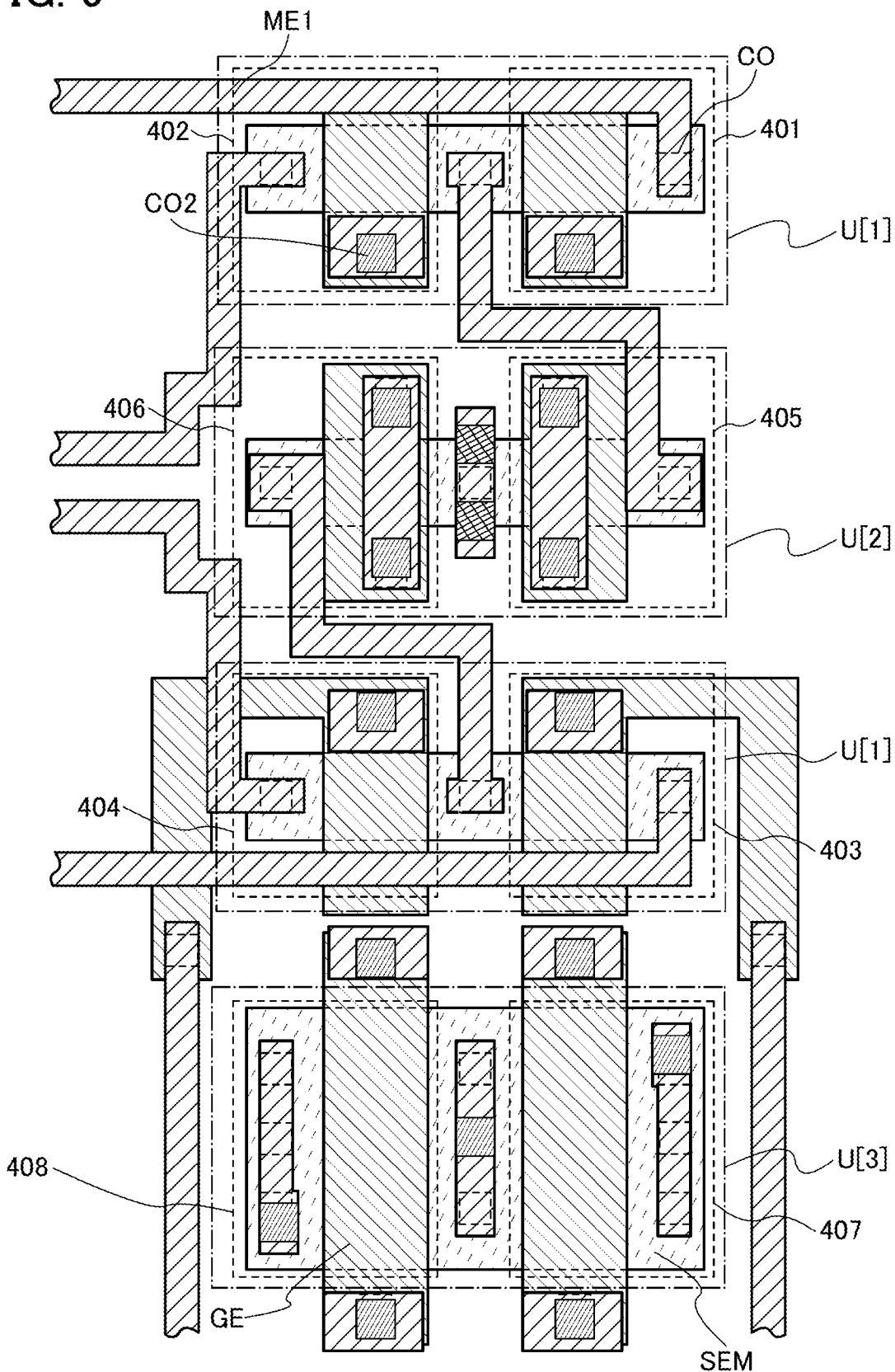
FIG. 9 is a top view illustrating one embodiment of the present invention.
Figure 10:
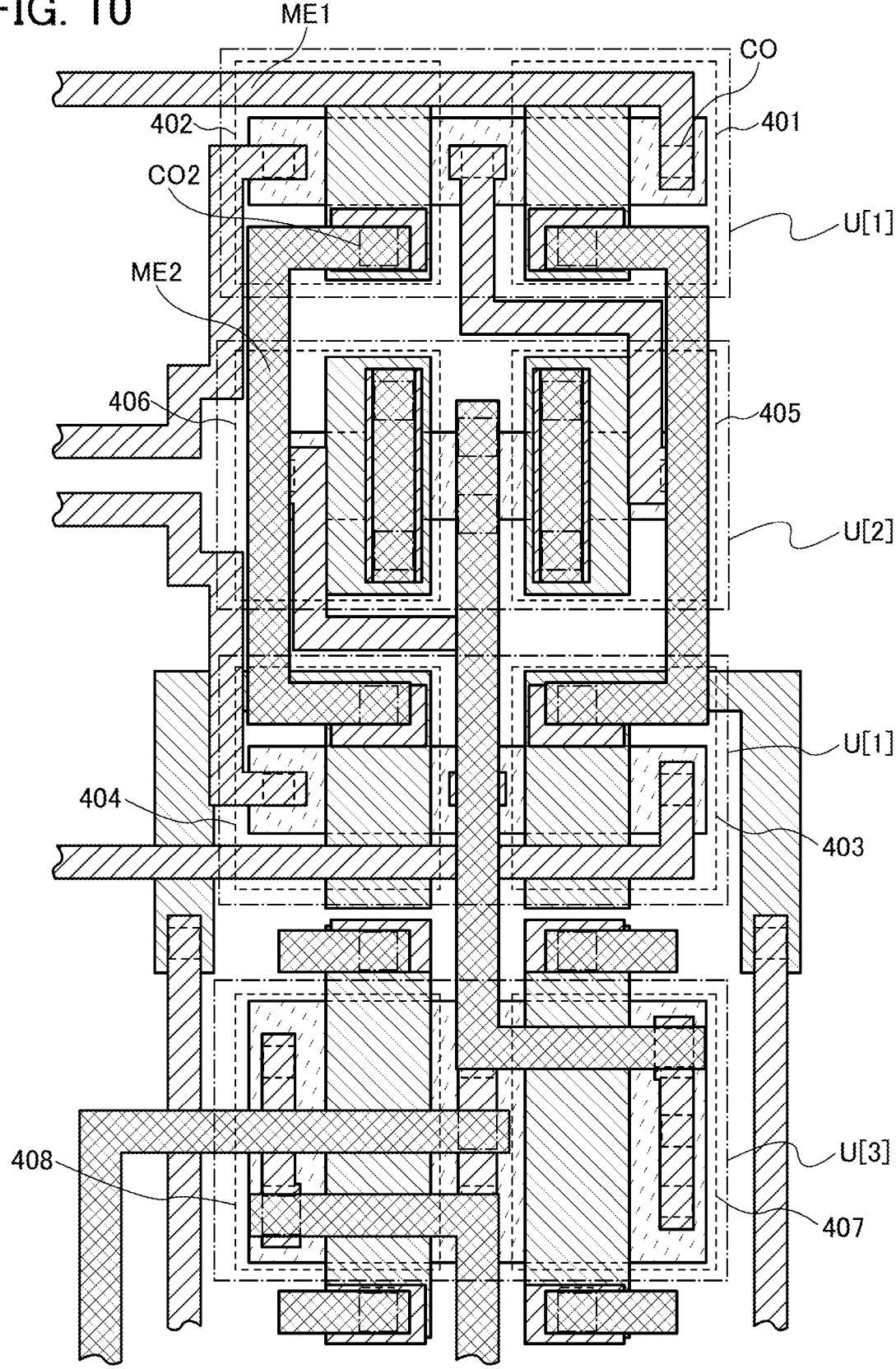
FIG. 10 is a top view illustrating one embodiment of the present invention.

FIG. 9 is an enlarged view of the region including the units U[1] to U[3] illustrated in FIG. 6. A source, a drain, and a gate of the transistor are connected to the wiring ME1 through the contact CO. Moreover, the wiring ME1 is connected to a wiring ME2, which is a wiring in an upper layer, through a contact CO2. Although the contact CO2 and the wiring ME2 are omitted in FIG. 9, FIG. 10 is a diagram in which the contact CO2 and the wiring ME2 are added to the diagram of FIG. 9.

Here, the gate electrodes GE of the transistors 401 and 403 are electrically connected to the wiring in the upper layer through the contact CO and the like and are supplied with the signal DECPB[1]. Furthermore, the gate electrodes GE of the transistors 402 and 404 are electrically connected to the wiring in the upper layer through the contact CO and are supplied with the signal DECP[1].

The gate electrode GE of the transistor 405 is electrically connected to the wiring in the upper layer through the contact CO and the like and is supplied with the signal DECPB[2]. Furthermore, the gate electrode GE of the transistor 406 is electrically connected to the wiring in the upper layer through the contact CO and the like and is supplied with the signal DECP[2].

One of a source and a drain of the transistor 401 and one of a source and a drain of the transistor 402 are electrically connected to one of a source and a drain of the transistor 405 through the wiring ME1 and the like.

The other of the source and the drain of the transistor 401 is electrically connected to one of a source and a drain of the transistor 301 and one of a source and a drain of the transistor 302 through the contact CO, the wiring ME1, and the like.

The other of the source and the drain of the transistor 402 is electrically connected to one of a source and a drain of the transistor 303 and one of a source and a drain of the transistor 304 through the contact CO, the wiring ME1, and the like.

One of a source and a drain of the transistor 403 and one of a source and a drain of the transistor 404 are electrically connected to one of a source and a drain of the transistor 406 through the contact CO, the wiring ME1, and the like.

The other of the source and the drain of the transistor 403 is electrically connected to one of a source and a drain of the transistor 305 and one of a source and a drain of the transistor 306 through the contact CO, the wiring ME1, and the like.

The other of the source and the drain of the transistor 404 is electrically connected to one of a source and a drain of the transistor 307 and one of a source and a drain of the transistor 308 through the contact CO, the wiring ME1, and the like.

The transistors 301 to 308 illustrated in FIG. 6 may be p-channel transistors or n-channel transistors. Here, the example is described in which the transistors 301 to 308 illustrated in FIG. 6 are p-channel transistors as in FIG. 4 and voltages V[j−1] to V[j−8] are supplied to the transistors. In that case, in FIG. 6, one of the source and the drain of the transistor 301 is connected to a wiring in an upper layer through the contact CO and the like and is supplied with the voltage V[j−1]. Similarly, one of the source and the drain of the transistor 302 is supplied with the voltage V[j−2]; one of the source and the drain of the transistor 303 is supplied with the voltage V[j−3]; one of the source and the drain of the transistor 304 is supplied with the voltage V[j−4]; one of the source and the drain of the transistor 305 is supplied with the voltage V[j−5]; one of the source and the drain of the transistor 306 is supplied with the voltage V[j−6]; one of the source and the drain of the transistor 307 is supplied with the voltage V[j−7]; and one of the source and the drain of the transistor 308 is supplied with the voltage V[j−8].

Figure 18:
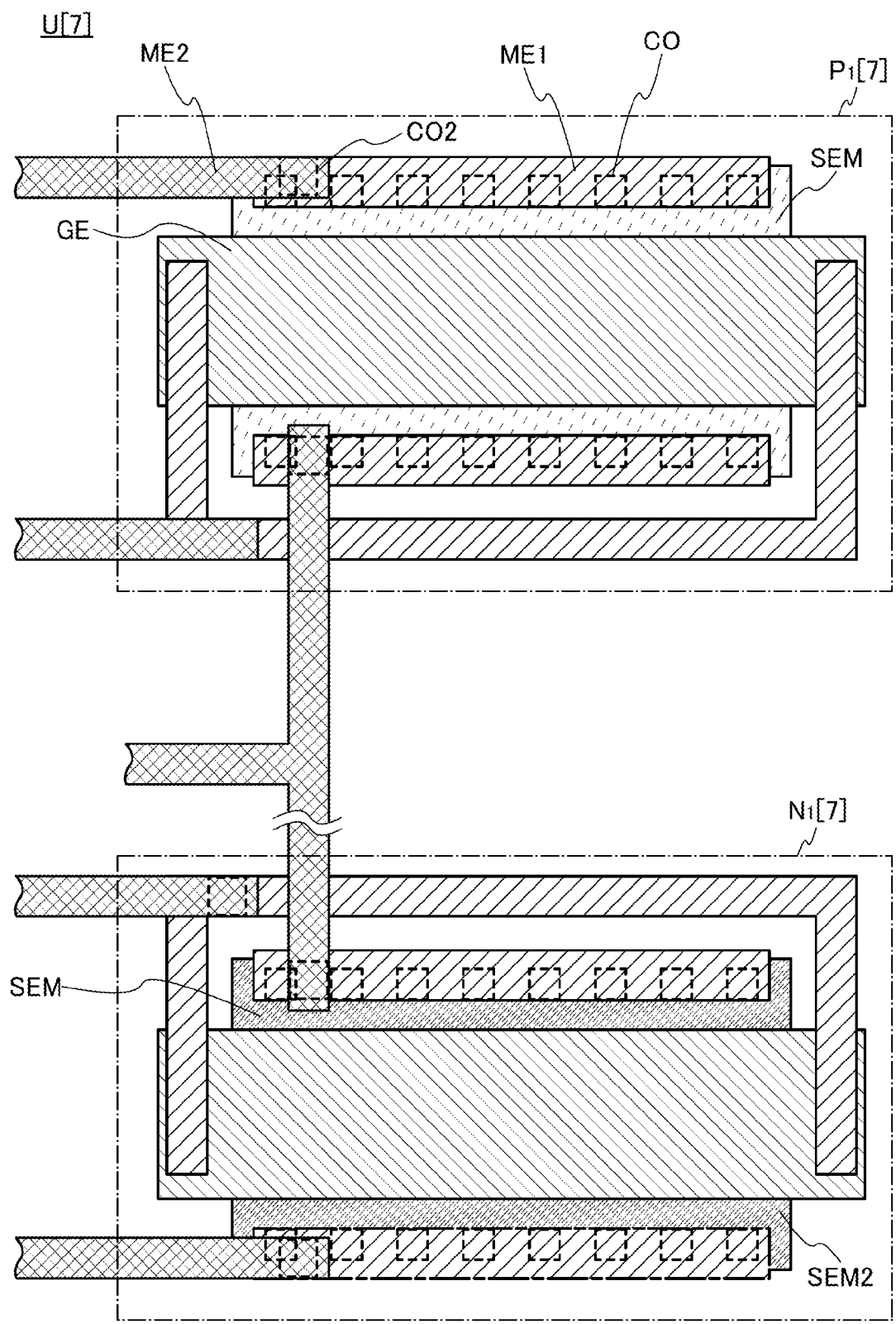
FIG. 18 is a top view illustrating one embodiment of the present invention.

FIG. 18 is a top view of the unit U[7]. Here, in the PTL 10 illustrated in FIG. 3 and the like, the unit U[7] includes the p-channel transistor $P_1[7]$ and the n-channel transistor $N_1[7]$. One of a source and a drain of the transistor $P_1[7]$ and one of a source and a drain of the transistor $N_1[7]$ are supplied with an output signal PTL_OUT. The other of the source and the drain of the transistor $P_1[7]$ is connected to one of a source and a drain of a transistor $P_1[6]$ and one of a source and a drain of a transistor $P_2[6]$ through the wiring ME2 and the like. The other of the source and the drain of the transistor $N_1[7]$ is connected to one of a source and a drain of the transistor $N_1[6]$ and one of a source and a drain of the transistor $N_2[6]$ through the wiring ME2 and the like.

As illustrated in the top view of FIG. 6, the unit U[2] is located between the two units U[1], and the unit U[2] and the two units U[1] are arranged in line. Furthermore, the unit U[3] is located between the two units U[2], and the unit U[3] and the two units U[2] are arranged in line. Such arrangement of the units can reduce the width of the PTL 10. Here, reducing the width means, for example, reducing the width in the x-coordinate direction. For example, in the case where the PTL 10 is used as a circuit connected to a device including a pixel matrix, e.g., a driver IC for a display or the like, a reduction in pixel pitch due to higher definition requires a reduced circuit width.

Here, for example, channel regions of the transistors 401, 405, and 403 are arranged in line. For example, the channel regions of the transistors 401, 405, and 403 include regions with the same horizontal coordinate.

For example, the transistors 401, 405, and 403 are arranged along any one of wirings supplied with signals DEPB[0] to DEPB[2] and signals DEP[0] to DEP[2].

The horizontal coordinate of the center of the channel region of the transistor 405 is set to x5, and the horizontal coordinate of the center of the channel region of the transistor 406 is referred to as x6. In FIG. 6, the x-coordinate direction and the y-coordinate direction are shown by arrows. For example, at least one of the channel regions of the transistors 401 and 402 has a region where the horizontal coordinate is between x5 and x6. Furthermore, for example, at least one of the channel regions of the transistors 403 and 404 has a region where the horizontal coordinate is between x5 and x6.

Alternatively, the smallest x coordinate of the channel regions of the transistors 405 and 406 is represented by x7 and the largest x coordinate thereof is represented by x8. For example, at least one of the channel regions of the transistors 401 and 402 has a region where the horizontal coordinate is between x7 and x8. Furthermore, for example, at least one of the channel regions of the transistors 403 and 404 has a region where the horizontal coordinate is between x7 and x8.

In the case where the unit U[c] is located between the two units U[c−1], the smallest x coordinate of the channel regions of the two transistors in the unit U[c] is represented by $x_1[c]$ and the largest x coordinate thereof is represented by $x_2[c]$. At least one of the channel regions of the two transistors of each of the two units U[c−1] includes, for example, a region where the horizontal coordinate is between $x_1[c]$ and $x_2[c]$.

Figure 19:
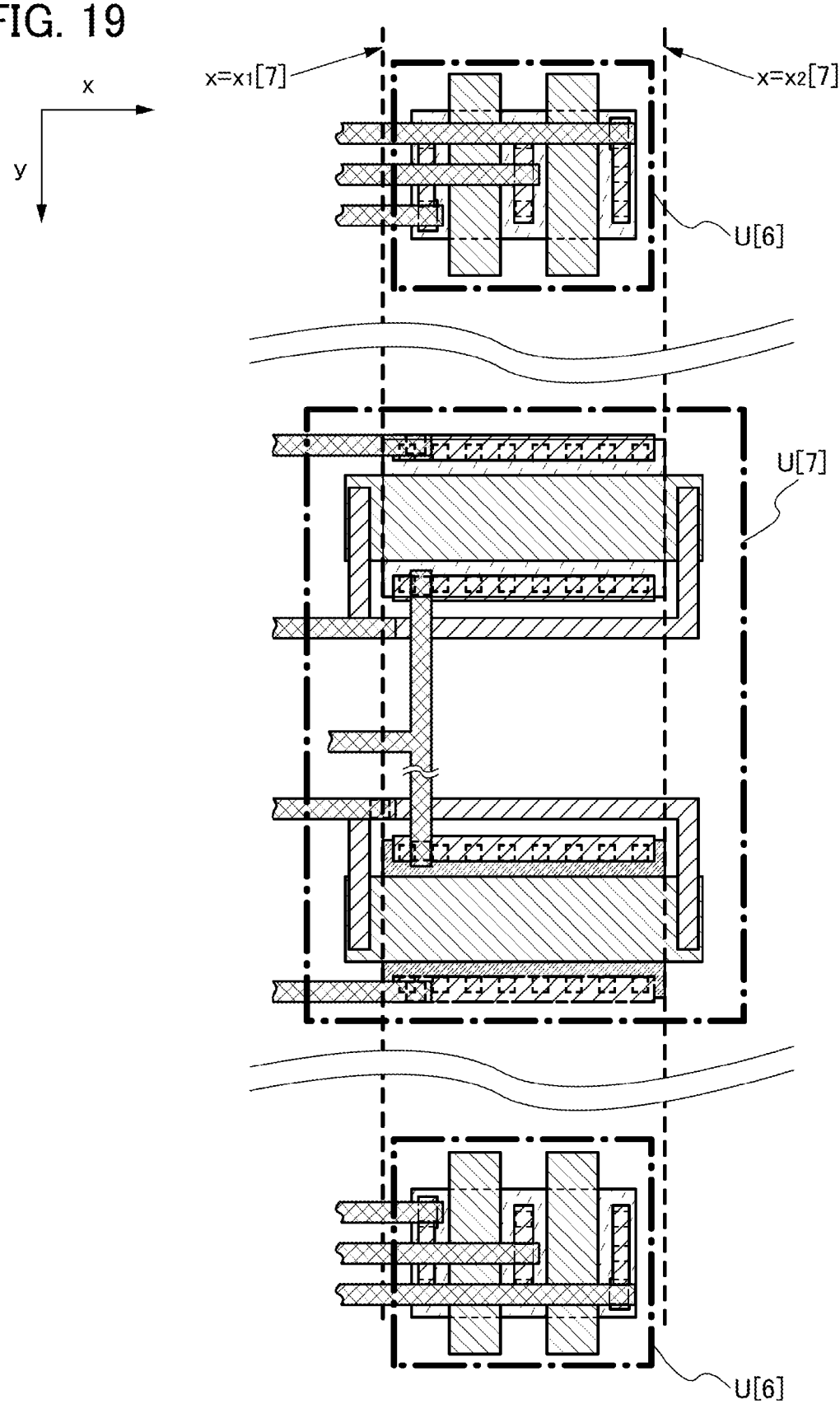
FIG. 19 is a top view illustrating one embodiment of the present invention

FIG. 19 illustrates a region where the horizontal coordinate is between $x_1[7]$ and $x_2[7]$ in the case where the unit U[7] is located between the two units U[6]. In FIG. 19, the x-coordinate direction and the y-coordinate direction are shown by arrows.

Here, the horizontal direction means, for example, a direction substantially parallel to the channel length direction of the transistors in the unit U[1] (see the dashed-dotted line X1-X2 in FIG. 6), a direction substantially vertical to wirings supplied with the signals DEPB[0] to DEPB[2], the signals DEP[0] to DEP[2], or the like, or a direction substantially vertical to an extending gate electrode of the unit MU[0] in FIG. 6 (a direction vertical to the dashed-dotted line Y3-Y4 in FIG. 6).

Figure 11A:
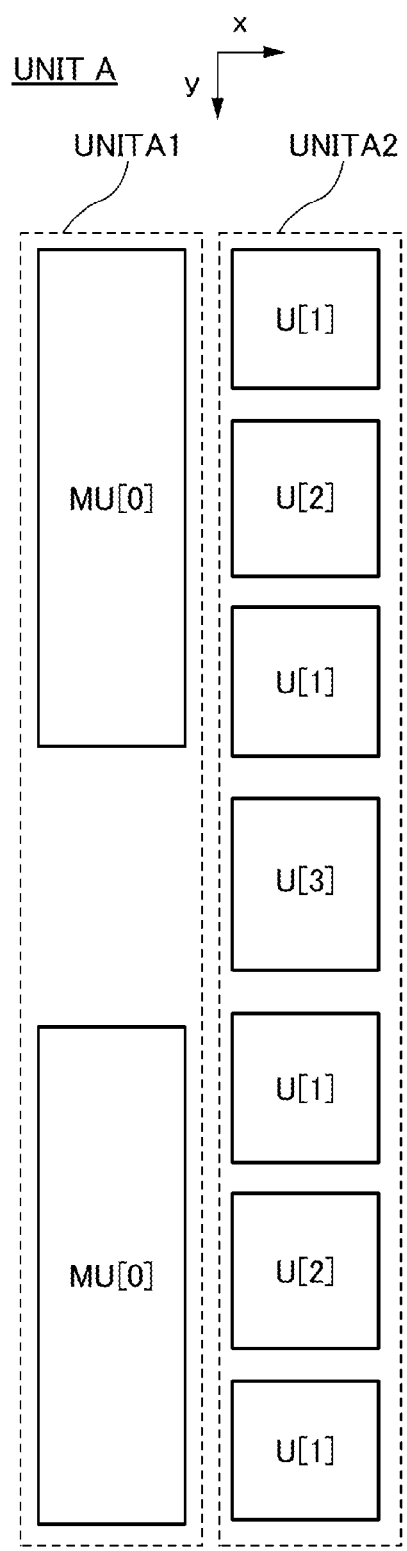
FIGS. 11A to 11C are block diagrams each illustrating one embodiment of the present invention.
Figure 11B:
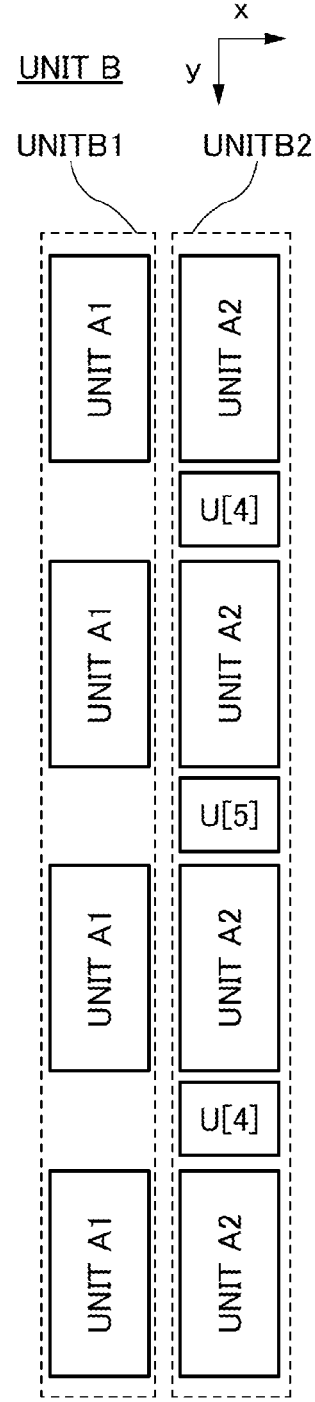
Figure 11C:
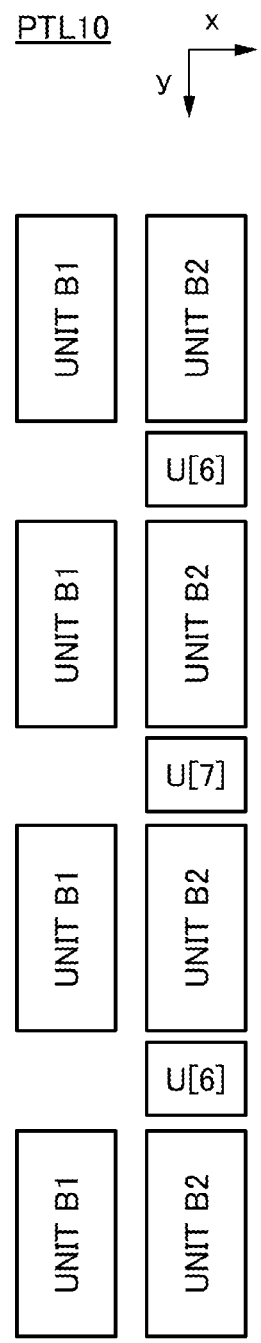

Next, arrangement of units is described with reference to FIGS. 11A to 11C. In FIGS. 11A to 11C, the x-coordinate direction and the y-coordinate direction are shown by arrows. FIG. 11A is a block diagram illustrating the top view of FIG. 6. A group where four units U[1], two units U[2], and a unit U[3] are arranged in line in the order of the unit U[1], the unit U[2], the unit U[1], the unit U[3], the unit U[1], the unit U[2], and the unit U[1] from the top is referred to as a UNIT A2. Furthermore, two units MU[0] arranged to be adjacent to each other in the y-coordinate direction is referred to as a UNIT A1. The UNIT A2 is arranged next to the UNIT A1. Here, arrangement in line means arrangement along the y-coordinate direction, for example.

As illustrated in FIG. 11B, the unit U[4] is located between the two UNITs A2. Since the UNIT A2 includes one unit U[3], the unit U[4] is located between the two units U[3]. Furthermore, the unit U[5] is located between the two units U[4]. A group where the four UNITs A2, the two units U[4], and the unit U[5] are arranged in line in the order of the UNIT A2, the unit U[4], the UNIT A2, the unit U[5], the UNIT A2, the unit U[4], and the UNIT A2 from the top is referred to as a UNIT B2. A group where the four UNITs A1 are arranged in line is referred to as a UNIT B1. Here, arrangement in line means arrangement along the y-coordinate direction, for example.

Furthermore, as illustrated in FIG. 11C, the unit U[6] is located between the two UNITs B2. Since the UNIT B2 includes one unit U[5], the unit U[6] is located between the two units U[5]. Furthermore, the unit U[7] is located between the two units U[6]. Thus, in the case where 8-bit data signals (k=8) are input to the PTL 10, the PTL 10 has the following layout as illustrated in FIG. 11C, for example: a group where the four UNITs B2, the two units U[6], and the unit U[7] are arranged in line in the order of the UNIT B2, the unit U[6], the UNIT B2, the unit U[7], the UNIT B2, the unit U[6], and the UNIT B2 from the top and a group where the four UNITs B1 are arranged in line are adjacent to each other. Here, arrangement in line means arrangement along the y-coordinate direction, for example.

Figure 12A:
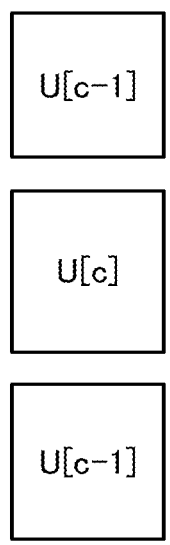
FIGS. 12A and 12B are a block diagram and a circuit diagram illustrating one embodiment of the present invention.

Next, the case where the PTL 10 to which k-bit data signals are supplied includes, for example, a unit U[c] to which [c+1]-bit data signals are supplied and two units U[c−1] to which c-bit data signals are supplied is described. FIG. 12A is a top view illustrating arrangement of the unit U[c] and the two units U[c−1]. As illustrated in the top view of FIG. 12A, the unit U[c] is located between the two units U[c−1]. Here, c is a natural number of greater than or equal to 3 and less than or equal to (k−1). The following shows details.

Figure 12B:
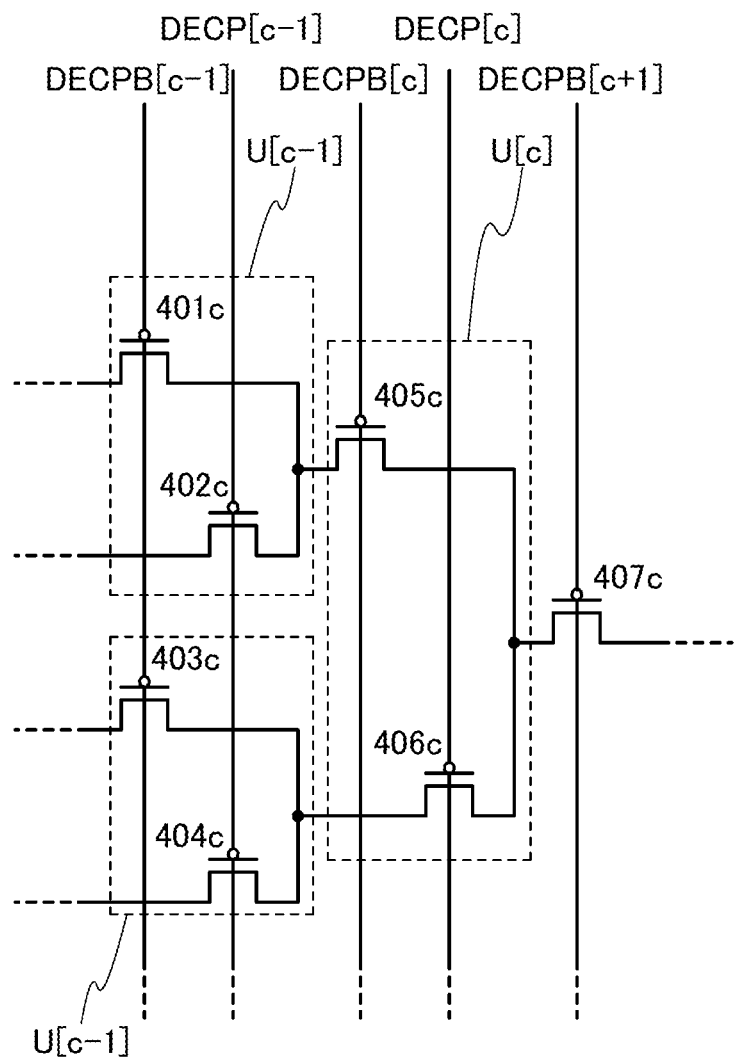
Figure 13:
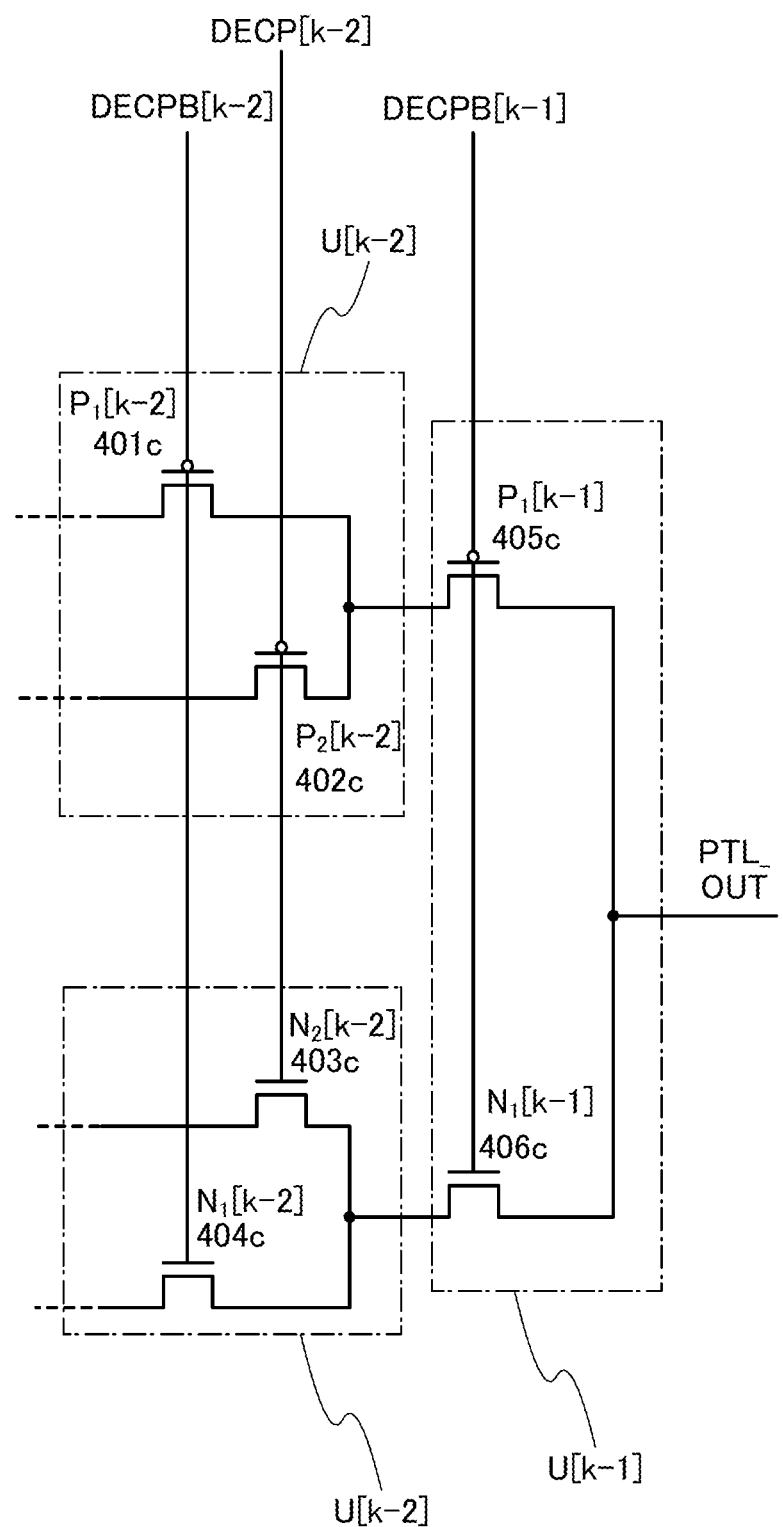
FIG. 13 is a circuit diagram illustrating one embodiment of the present invention.

FIG. 12B and FIG. 13 are circuit diagrams of part of the PTL circuit illustrated in FIG. 1. FIG. 12B illustrates some of transistors connected to signal lines of c-bit, [c+1]-bit, and [c+2]-bit. The number c is a natural number of greater than or equal to 3 and less than or equal to (k−2). Furthermore, FIG. 13 illustrates some of transistors connected to signal lines of [k−1]-bit and k-bit.

FIG. 13 is a circuit diagram in which c=k−1 is satisfied in FIG. 12B. Note that FIG. 13 is different from FIG. 12B in the following two points: the unit U[c] in FIG. 12B is connected to a transistor 407c, whereas the unit U[c] in FIG. 13 is supplied with the output signal PTL_OUT; and FIG. 12B shows the example where transistors 401c to 407c are p-channel transistors, whereas FIG. 13 shows the example where the transistors 403c, 404c, and 406c are n-channel transistors.

The unit U[c] includes the transistors 405c and 406c, one of the two units [c−1] includes the transistors 401c and 402c, and the other thereof includes the transistors 403c and 404c.

Gates of the transistors 401c and 404c are supplied with a signal DECPB[c−1], and gates of the transistors 402c and 403c are supplied with a signal DECP[c−1]. A gate of the transistor 405c is supplied with the signal DECPB[c], and a gate of the transistor 406c is supplied with the signal DECP[c]. Note that in the case where the transistors 405c and 406c are supplied with the k-bit signals as illustrated in FIG. 13, gates thereof are supplied with the same signal DECP[k−1].

One of a source and a drain of the transistor 405c and one of a source and a drain of the transistor 406c are connected to one of a source and a drain of the transistor 407c in FIG. 12B but is supplied with the output signal PTL_OUT in FIG. 13.

The other of the source and the drain of the transistor 405c is connected to one of a source and a drain of the transistor 401c and one of a source and a drain of the transistor 402c. The other of the source and the drain of the transistor 406c is connected to one of a source and a drain of the transistor 403c and one of a source and a drain of the transistor 404c.

In each of FIG. 7B, FIG. 8A, and FIG. 8B, the direction of the dashed-dotted line Y1-Y2 is referred to as the channel width direction of the transistor, and the direction of the dashed-dotted line X1-X2 is referred to as the channel length direction of the transistor.

Here, the channel widths of the transistors in the units U[0] to U[2] are denoted by $W_0$ to $W_2$; those of the transistors in the units U[3] to U[6] are denoted by $W_3$ to $W_6$; and those of the transistors in the unit U[7] are denoted by $W_7$. In FIG. 6, $W_0=W_1=W_2$ and $W_3=W_4$ are satisfied. Although not illustrated in FIG. 6, transistors in the units U[5] and U[6] can be transistors with the same channel width as those of the transistors in the unit U[3]. In that case, $W_3=W_4=W_5=W_6$ is satisfied.

The channel width $W_0$ is preferably smaller than the channel width $W_3$. Furthermore, the channel width $W_7$ is preferably larger than the channel width $W_2$.

Furthermore, the channel width of the transistor in the unit U[k−2] is denoted by $W_{k-2}$ and that of the transistor in the unit U[k−1] is denoted by $W_{k-1}$. The channel width $W_0$ is preferably smaller than the channel width $W_{k-1}$. The channel width $W_{k-1}$ is preferably smaller than the channel width $W_k$.

Note that a channel width refers to, for example, the length of a portion where the source and the drain face each other in a region where the semiconductor SEM (or a portion where a current flows in the semiconductor SEM when the transistor is on) and the gate electrode GE overlap with each other, or in a region where a channel is formed. In one transistor, channel widths in all regions are not necessarily the same. That is, the channel width of one transistor is not limited to one value in some cases. Therefore, in this specification, a channel width is any one of widths, the maximum width, the minimum width, or the average width of a region where a channel is formed.

A channel length refers to, for example, a distance between the source and the drain in a region where the semiconductor SEM (or a portion where a current flows in the semiconductor SEM when the transistor is on) and the gate electrode GE overlap with each other or a region where a channel is formed in the top view of the transistor. In one transistor, channel lengths in all regions are not necessarily the same. That is, the channel length of one transistor is not limited to one value in some cases. Therefore, in this specification, the channel length is any one of lengths, the maximum length, the minimum length, or the average length of a region where a channel is formed.

It is preferred that transistors of the same conductivity type (n-type or p-type) be provided adjacent to each other as illustrated in FIG. 7B, in which case a source and a drain can be shared between the adjacent transistors in some cases, leading to a reduction in area of the transistors.

For example, when the PTL 10 is applied to a driver IC, higher definition of a display device results in a narrower space between the wirings supplied with the signals DECPB[0] to DECPB[k−1], and accordingly a space between the wirings supplied with the voltages V[0] to V[j−1] is also narrowed. As a result, downsizing of transistors is required. In this case, arranging transistors as illustrated in FIG. 7B makes it possible to satisfy the requirement and address the trend toward higher definition of a display device.

A large channel width of the transistors 15 to 18 results in smaller on resistance of these transistors, leading to higher operation speed of the circuit.

In the case of the circuit in FIG. 1, the on resistance $R_{total}$ of the entire PTL 10 can be expressed by Formula 1.

[Formula 1]

$$R_{total} \propto \frac{1}{W_0} + \sum_{n=1}^{k-1} \frac{1}{W_n} \qquad (1)$$

The consumed power $P_{total}$ of the entire PTL 10 at this time can be expressed by Formula 2.

[Formula 2]

$$P_{total} \propto 2^k \times W_0 + \sum_{n=1}^{k-1} (2^{k-n} \times W_n) \qquad (2)$$

It is clear from Formula 1 that the on resistance $R_{total}$ decreases as the channel width of the transistors included in the PTL 10 is larger. A small on resistance $R_{total}$ is preferable because the operation speed of the circuit can be increased.

In contrast, it is seen from Formula 2 that the consumed power $P_{total}$ increases as the channel width of the transistors included in the PTL 10 is larger. It is thus necessary to set the channel width of the transistors such that both the on resistance $R_{total}$ and the consumed power $P_{total}$ are small.

The channel widths $W_1$ to $W_{k-1}$ are greater than one time and less than ten times, preferably greater than twice and less than eight times, further preferably greater than three times and less than five times the channel width $W_0$, for example.

Next, an example of the shape of the transistor included in the PTL 10 will be described with reference to FIGS. 14A and 14B.

Figure 14A:
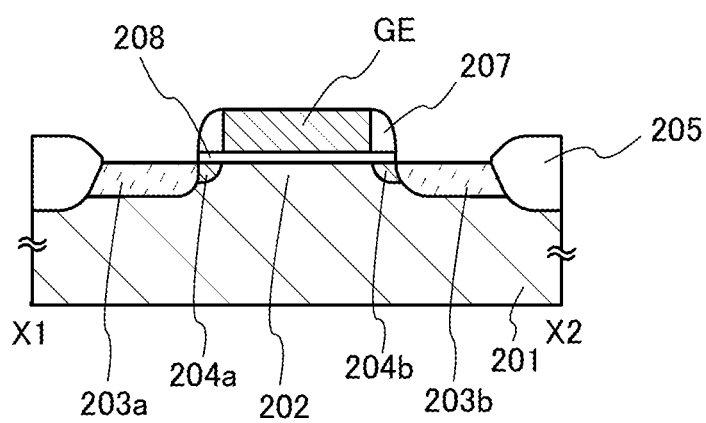
FIGS. 14A and 14B are cross-sectional views illustrating one embodiment of the present invention.

FIG. 14A is a cross-sectional view of the transistor 401 in the direction of the dashed-dotted line X1-X2 in FIG. 8A. FIG. 14B is a cross-sectional view of the transistor 401 in the direction of the dashed-dotted line Y1-Y2 in FIG. 8A. Although the transistor 401 is shown as a p-channel transistor in FIG. 4 and the like, the transistor 401 in FIGS. 14A and 14B can have the same structure even in the case where it is an n-channel transistor.

The transistor 401 includes a substrate 201, a channel 202, an impurity region 203a, an impurity region 203b, an impurity region 204a, an impurity region 204b, an element isolation layer 205, a sidewall insulating layer 207, an insulating film 208, and the gate electrode GE.

As the substrate 201, a single crystal semiconductor substrate or a polycrystalline semiconductor substrate of silicon or silicon carbide, a compound semiconductor substrate of silicon germanium, a silicon-on-insulator (SOI) substrate, or the like can be used. When a p-type single crystal silicon substrate is used as the substrate 201, an impurity element imparting n-type conductivity may be added to part of the substrate 201 to form an n-well, and a p-type transistor can be formed in a region where the n-well is formed. As the impurity element imparting n-type conductivity, phosphorus (P), arsenic (As), or the like can be used. As an impurity element imparting p-type conductivity, boron (B) or the like may be used.

Alternatively, the substrate 201 may be an insulating substrate over which a semiconductor film is provided. Examples of the insulating substrate are a glass substrate, a quartz substrate, a plastic substrate, a flexible substrate, an attachment film, paper including a fibrous material, and a base film. Examples of a glass substrate include a barium borosilicate glass substrate, an aluminoborosilicate glass substrate, and a soda lime glass substrate. Examples of a flexible substrate include flexible synthetic resin substrates of plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, and polyvinyl chloride. Examples of a base film are base films formed using polyester, polyamide, polyimide, aramid, epoxy, an inorganic vapor deposition film, and paper.

Alternatively, the substrate 201 may be a metal substrate over which a semiconductor film is provided. Examples of the metal substrate are a stainless steel substrate, a substrate including stainless steel foil, a tungsten substrate, and a substrate including tungsten foil.

Note that a semiconductor element may be formed using one substrate and then transferred to another substrate. Examples of a substrate to which a semiconductor element is transferred are, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or with low power consumption can be formed, a device with high durability or high heat resistance can be provided, or reduction in weight or thickness can be achieved.

The transistor 401 is isolated from other transistors formed on the substrate 201 by the element isolation layer 205. The element isolation layer 205 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

The element isolation layer 205 may be formed with local oxidation of silicon (LOCOS) or shallow trench isolation (STI).

The impurity regions 203a and 203b are regions whose resistance is lowered by impurity addition and have functions of a source and a drain.

The impurity regions 204a and 204b functioning as a lightly doped drain (LDD) region or an extension region may be provided below the sidewall insulating layer 207. In particular, when the transistor 401 is an n-channel transistor, the LDD region or the extension region is preferably provided in order to suppress the deterioration due to hot carriers.

As the transistor 401, a transistor containing silicide (salicide) or a transistor that does not include the sidewall insulating layer 207 may be used. With a structure using silicide (salicide), the resistance of the source and the drain can be further lowered and the operation speed of a semiconductor device can be increased. Furthermore, the transistor containing silicide (salicide) can operate at low voltage; thus, power consumption of the semiconductor device can be reduced.

The insulating film 208 functions as a gate insulating film. The insulating film 208 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 208 may be a stacked layer including any of the above materials. The insulating film 208 may contain lanthanum (La), nitrogen, zirconium (Zr), or the like as an impurity.

In particular, the insulating film 208 preferably contains oxygen, nitrogen, silicon, hafnium, or the like. Specifically, the insulating film 208 preferably includes hafnium oxide, and silicon oxide or silicon oxynitride.

The gate electrode GE is formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component (e.g., tantalum nitride). Alternatively, the gate GE may be formed using a semiconductor material typified by polycrystalline silicon doped with an impurity element such as phosphorus or boron.

Figure 20:
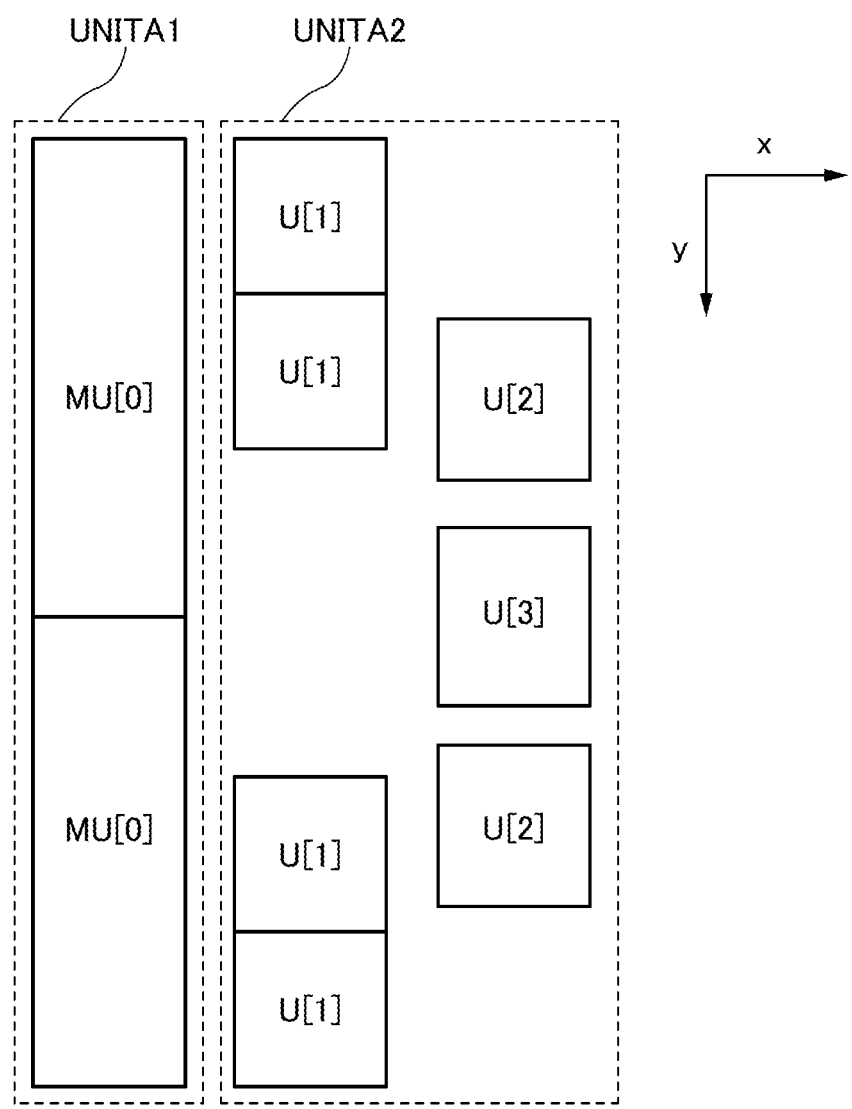
FIG. 20 is a block diagram illustrating one embodiment of the present invention.

FIG. 20 illustrates another example of the UNIT A that is different from that unit A illustrated in FIG. 11A. In FIG. 20, the two units MU[0] are arranged in the vertical direction, and furthermore, the four units U[1] are arranged in the vertical direction in positions where the x coordinate is positive (on the right side in the horizontal direction in FIGS. 11A to 11C), and the unit U[2], the unit U[3], and the unit U[2] are arranged in positions where the x coordinate is positive in this order from the top. In FIG. 20, as compared with FIGS. 11A to 11C, the length of the UNIT A in the vertical direction can be shortened. The length in the horizontal direction is longer than that in FIG. 11A in some cases. Here, for example, the length in the horizontal direction can be shortened by reducing the channel lengths of the transistors.

Figure 21A:
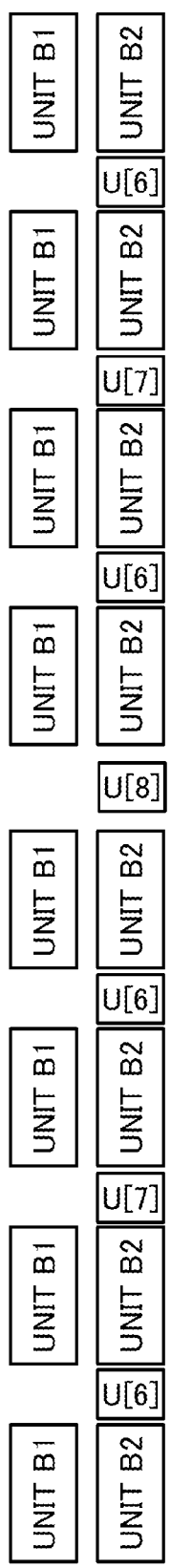
FIGS. 21A to 21C are block diagrams each illustrating one embodiment of the present invention.

FIG. 21A illustrates an example of a layout of the PTL 10 that is a 9-bit PTL. FIG. 21A illustrates an example where two 8-bit layouts illustrated in FIG. 11C are arranged above and below the unit U[8].

Figure 21B:
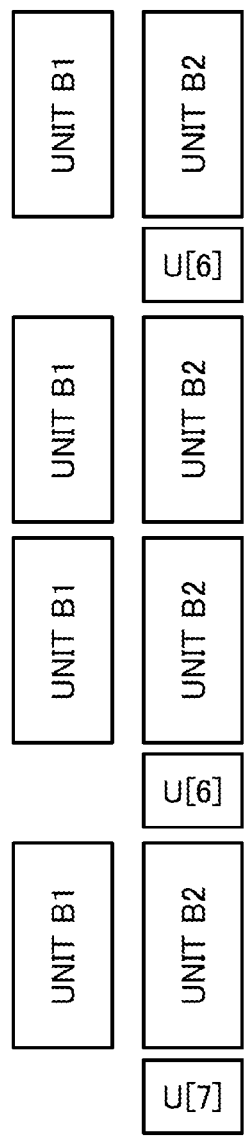
Figure 21C:
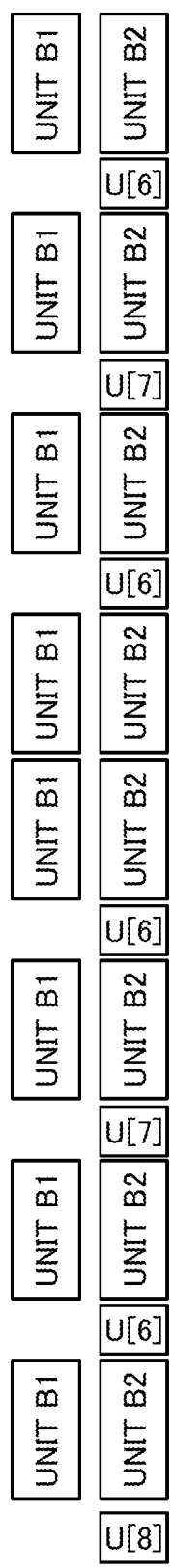

Although the unit of the most significant bit is arranged in the vicinity of the center in the vertical direction in FIG. 11C and FIG. 21A, the most significant bit may be arranged at the top or the bottom in the vertical direction. For example, FIG. 21B illustrates the case where the unit of the most significant bit is arranged at the bottom in an 8-bit PTL circuit, and FIG. 21C illustrates the case where the unit of the most significant bit is arranged at the bottom in a 9-bit PTL circuit.

Figure 14B:
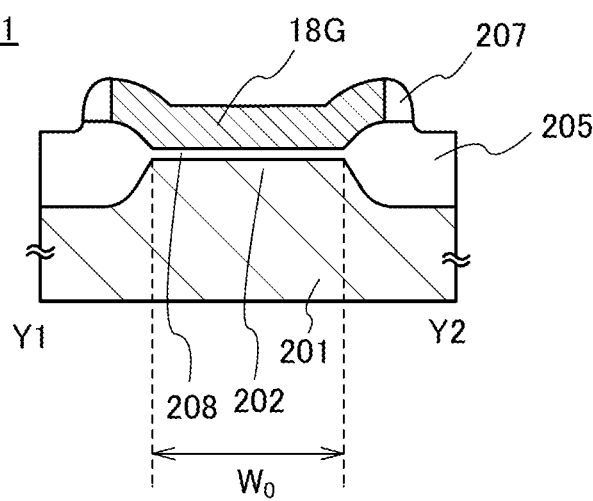

FIGS. 14A and 14B show the case using a planar transistor. The case using a FIN transistor will be described below.

Figure 15A:
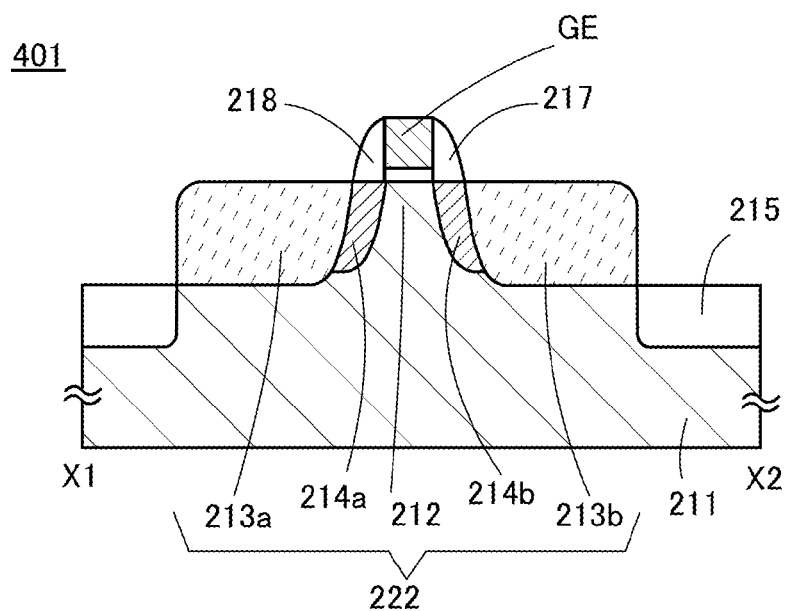
FIGS. 15A and 15B are cross-sectional views illustrating one embodiment of the present invention.
Figure 15B:
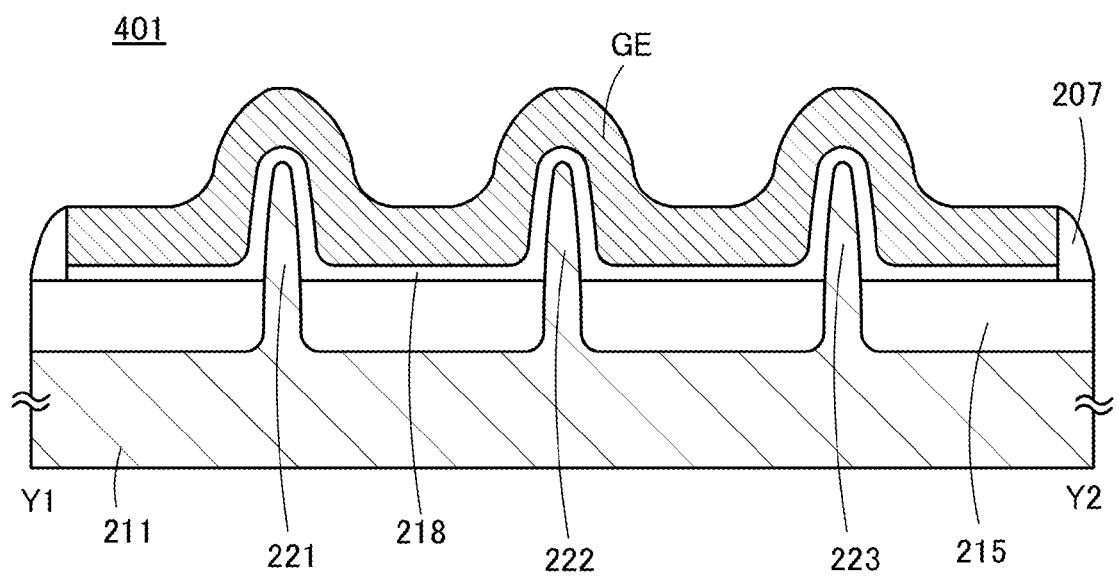

FIG. 15A is a cross-sectional view of the transistor 401 in the direction of the dashed-dotted line X1-X2 in FIG. 8A. FIG. 15B is a cross-sectional view of the transistor 401 in the direction of the dashed-dotted line Y1-Y2 in FIG. 8A. Although the transistor 401 is shown as a p-channel transistor in FIG. 3 and the like, the transistor 401 in FIGS. 15A and 15B is not limited to a p-channel transistor and may be regarded as an n-channel transistor.

The transistor 401 includes a substrate 211, a channel 212, an impurity region 213a, an impurity region 213b, an impurity region 214a, an impurity region 214b, an element isolation layer 215, a sidewall insulating layer 217, an insulating film 218, and the gate electrode GE.

The transistor 401 also includes semiconductors 221, 222, and 223 having a protrusion (see FIG. 15B). The insulating film 218 and the gate electrode GE are provided along side surfaces and top surfaces of the semiconductors 221 to 223. Such a transistor is referred to as a FIN transistor. Note that an insulating film serving as a mask for forming the protruding portion may be provided in contact with the upper part of the protruding portion. Although the case where the protruding portion is formed by processing part of the substrate 211 is described here, a semiconductor layer having a protrusion may be formed by processing an SOI substrate.

The description of the substrate 201 in FIGS. 14A and 14B is referred to for the details of the substrate 211.

The description of the impurity regions 203a and 203b in FIGS. 14A and 14B is referred to for the details of the impurity regions 213a and 213b.

The description of the impurity regions 204a and 204b in FIGS. 14A and 14B is referred to for the details of the impurity regions 214a and 214b.

The description of the element isolation layer 205 in FIGS. 14A and 14B is referred to for the details of the element isolation layer 215.

The description of the insulating film 208 in FIGS. 14A and 14B is referred to for the details of the insulating film 218.

The description of the sidewall insulating layer 207 in FIGS. 14A and 14B is referred to for the details of the sidewall insulating layer 217.

In the FIN transistor illustrated in FIGS. 15A and 15B, the side surfaces of the semiconductors 221 to 223 are surrounded by the gate electrode GE. This structure enables a gate electric field to be applied to the semiconductors 221 to 223 effectively and prevents short-channel effects such as drain induced barrier lowering (DIBL). Furthermore, a channel is formed also on the side surfaces of the semiconductors 221 to 223, so that a current of the transistor in the on state (on-state current) can be increased. The FIN structure is suitable for a downsized transistor.

Here, as the FIN transistor, the transistor illustrated in FIGS. 15A and 15B is used for the units U[0] to U[2], for example. The transistor illustrated in FIG. 20 is used for the units U[3] to U[6], for example. The transistor illustrated in FIG. 20 is used for the unit U[7], for example.

Figure 16A:
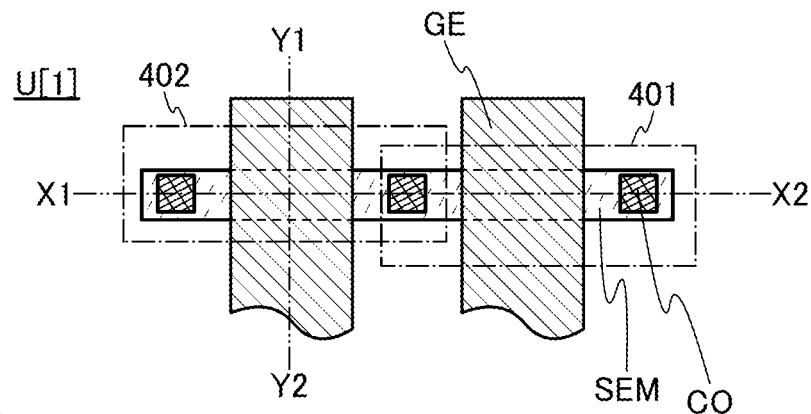
FIGS. 16A to 16C are cross-sectional views illustrating one embodiment of the present invention.
Figure 16B:
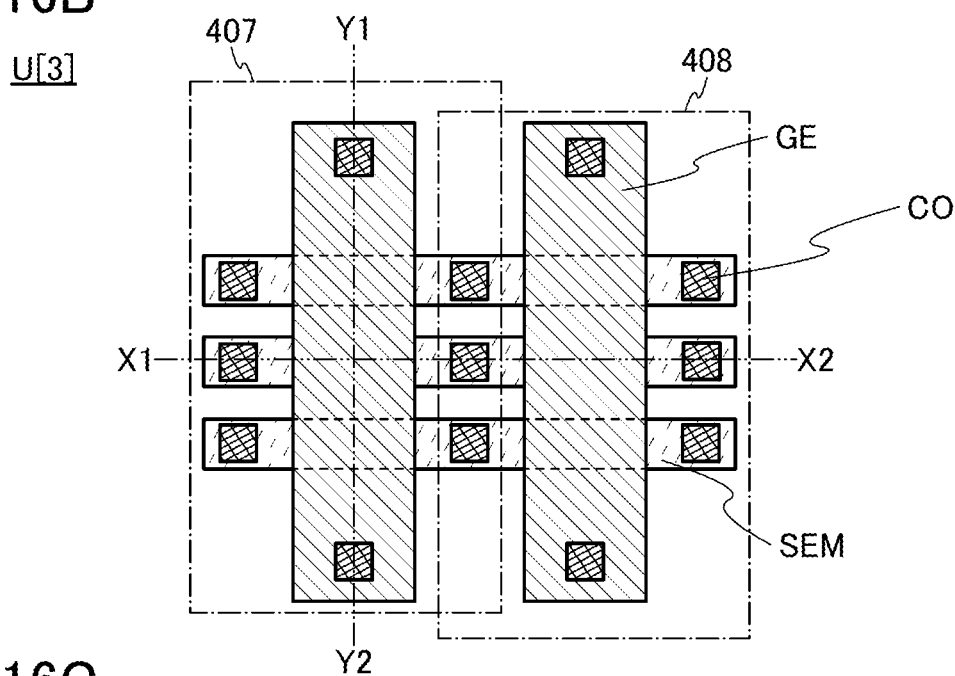
Figure 16C:
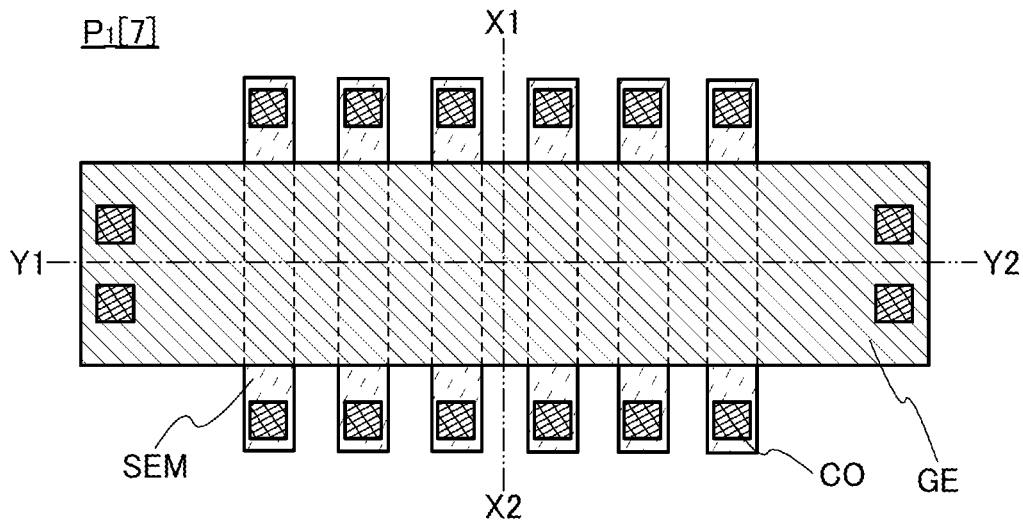

The transistors illustrated in FIGS. 16A to 16C each include at least one semiconductor SEM having a protrusion. The widths of the protrusions are preferably substantially the same. To increase the channel width of the transistor, the number of protrusions is increased, for example.

In the top view of FIG. 16A, the transistors include one semiconductor SEM having a protrusion. In the top view of FIG. 16B, the transistors have three semiconductors SEM each having a protrusion. In the top view of FIG. 16C, the transistors include six semiconductors SEM having a protrusion.

The transistors illustrated in FIGS. 16A to 16C are examples. In the units U[0] to U[2], the number of regions of the semiconductor SEM that have a protrusion (hereinafter referred to as protruding portions) of one unit or one transistor is denoted by $NM_0$; in the units U[3] to U[6], the number of protruding portions of the semiconductor SEM of one unit or one transistor is denoted by $NM_2$; and in the unit U[7], the number of protruding portions of the semiconductor SEM of one unit or one transistor is denoted by $NM_7$. As illustrated in FIG. 20, $NM_0$ is preferably smaller than $NM_2$, and $NM_2$ is preferably smaller than $NM_7$.

Furthermore, in FIG. 1, the number of protruding portions of semiconductors SEM in the transistors $P_1[0]$, $P_2[0]$, $N_1[0]$, and $N_2[0]$ is denoted by $NM_0$; that in the transistors $P_1[1]$, $P_2[1]$, $N_1[0]$, and $N_2[1]$, $NM_1$; that in the transistors $P_1[k-2]$, $P_2[k-2]$, $N_1[k-2]$, and $N_2[k-2]$, $NM_{k-2}$; and that in the transistors $P_1[k-1]$ and $N_1[k-1]$, $NM_{k-1}$. As illustrated in FIG. 1, the number $NM_0$ is preferably smaller than the numbers $NM_{k-1}$.

<<PTL Configuration Example 2>>

Figure 17:
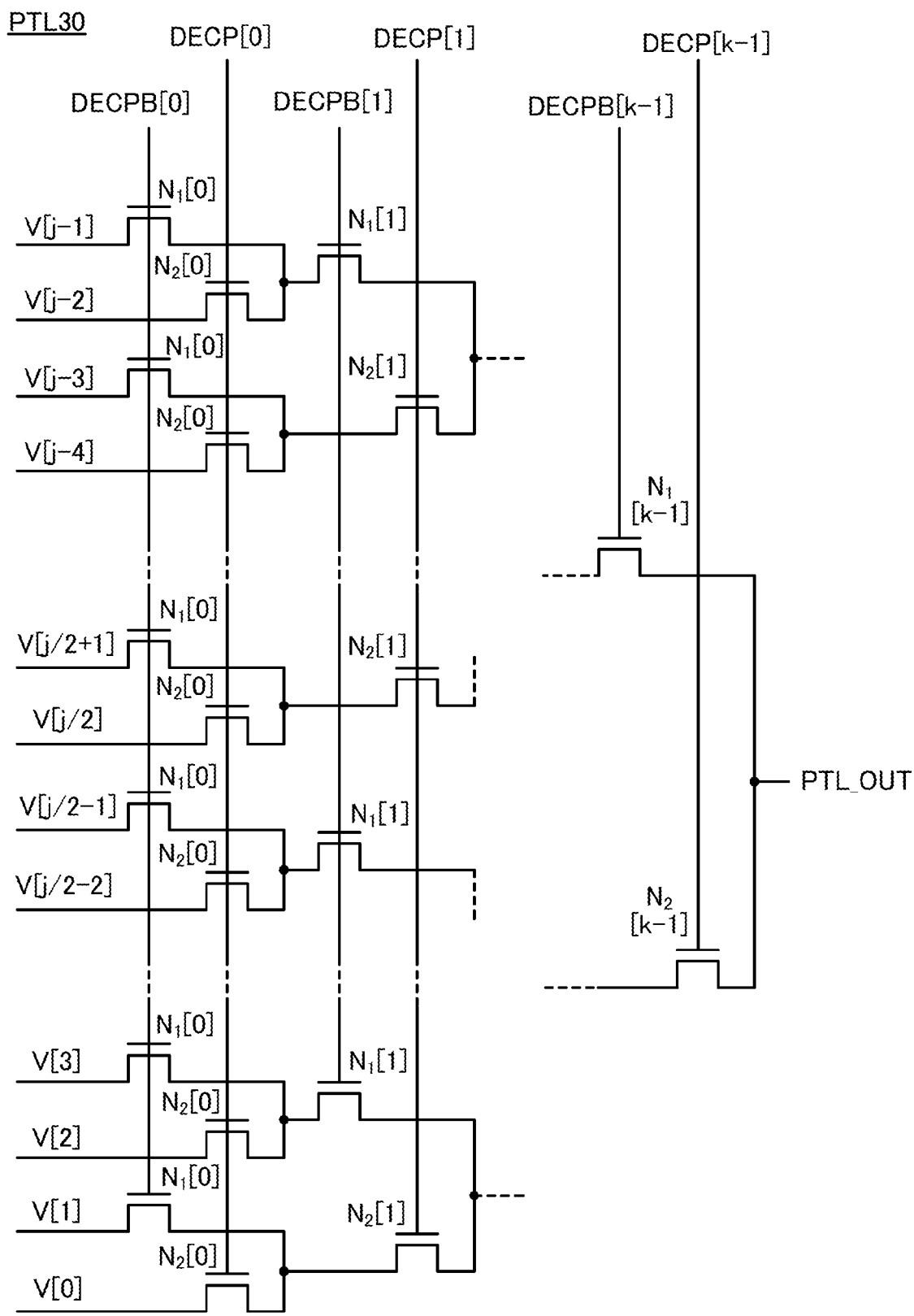
FIG. 17 is a circuit diagram illustrating one embodiment of the present invention.

FIG. 17 illustrates a circuit configuration of a PTL 30 that is different from the PTL 10.

The PTL 30 in FIG. 17 is the PTL 10 of FIG. 1 in which all the p-channel transistors are replaced with n-channel transistors.

The n-channel transistors are preferably transistors containing an oxide semiconductor in their channels (oxide semiconductor transistors). An oxide semiconductor transistor exhibits extremely low leakage current in the off state (off-state current) and can form a circuit with low power consumption.

The oxide semiconductor is an oxide semiconductor containing indium (In), for example. The oxide semiconductor has high carrier mobility (electron mobility) by containing indium, for example. Moreover, the oxide semiconductor preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having a high bonding energy with oxygen, for example. For instance, the element M is an element whose bonding energy with oxygen is higher than that of indium or an element that can increase the energy gap of the oxide semiconductor. Furthermore, the oxide semiconductor preferably contains zinc (Zn). The oxide semiconductor containing zinc is easily crystallized in some cases.

Note that the oxide semiconductor is not limited to an oxide semiconductor containing indium. The oxide semiconductor may be, for example, an oxide semiconductor that contains zinc, gallium, or tin and no indium (e.g., zinc tin oxide or gallium tin oxide).

Any of the arrangement and structure examples of the transistors illustrated in FIG. 6, FIGS. 7A and 7B, FIGS. 8A and 8B, FIG. 9, FIG. 10, and FIG. 18 can be applied to the PTL 30 in FIG. 17.

Embodiment 2

Figure 22:
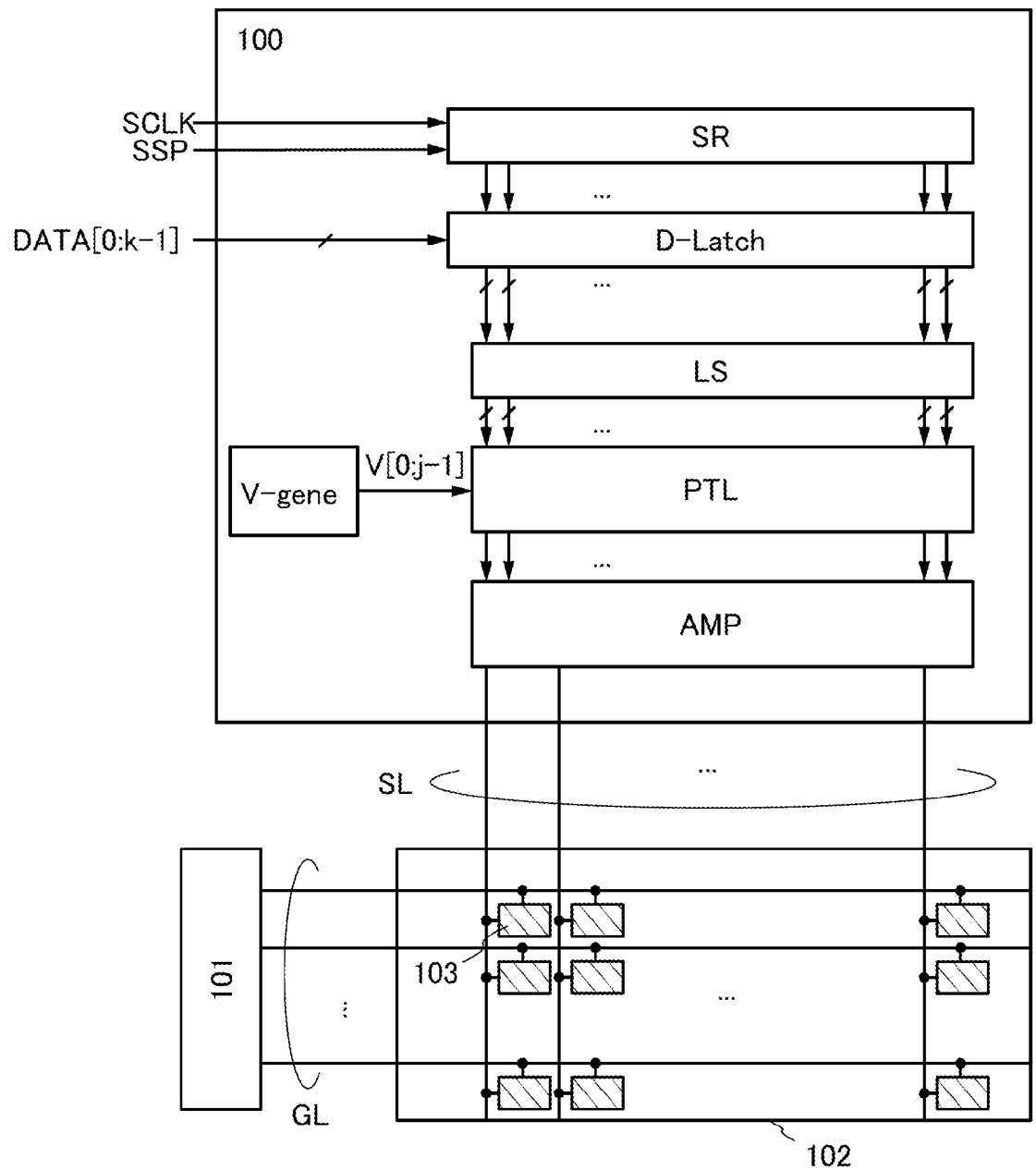
FIG. 22 is a circuit diagram illustrating a configuration example of a display device.

This embodiment will explain a circuit block diagram of a display device including a level shifter LS, a pass transistor logic PTL, and an amplifier AMP. FIG. 22 is a circuit block diagram illustrating a source driver, a gate driver, and a display portion.

The display device in the circuit block diagram of FIG. 22 includes a source driver 100, a gate driver 101, and a display portion 102. In the display portion 102 of FIG. 22, pixels 103 are arranged in a matrix.

The source driver 100 includes a shift register SR, a data latch D-Latch, the level shifter LS, the pass transistor logic PTL, the voltage generator circuit V-gene, and the amplifier AMP. The source driver 100 has a function of outputting analog image data to a plurality of source lines SL. The source driver 100 may consist of a driver IC.

A source clock SCLK and a source start pulse SSP, for example, are input to the shift register SR. The shift register SR generates a sampling pulse and outputs it to the data latch D-Latch.

In addition to the sampling pulse, data signals DATA[0] to DATA[k−1] that are digital image data are input to the data latch D-Latch. The data signals DATA[0] to DATA[k−1] are latched into the data latch D-Latch in response to the sampling pulse. The data latch D-Latch outputs the latched data signals DATA[0] to DATA[k−1] to the level shifter LS.

The level shifter LS boosts the input data signals DATA[0] to DATA[k−1] to the signals DECPB[0] to DECPB[k−1] shown in Embodiment 1 and outputs the signals DECPB[0] to DECPB[k−1].

The pass transistor logic PTL is as described in Embodiment 1. Specifically, the pass transistor logic PTL controls the on/off state of the transistors in accordance with the signals DECPB[0] to DECPB[k−1] obtained by boosting and outputs an output signal PTL_OUT that is an analog signal corresponding to the voltages V[0] to V[j−1] generated in the voltage generator circuit V-gene. The PTL 10 or the PTL 30 shown in Embodiment 1 may be used for the pass transistor logic PTL.

The amplifier AMP increases the current of the output signal PTL_OUT input thereto and outputs the resulting signal as a data signal Vdata.

The data signals Vdata obtained in the amplifier AMP are analog signals output to the source lines SL.

The gate driver 101 includes a shift register and a buffer, for example. The gate driver 101 receives a gate start pulse, a gate clock signal, and the like and outputs a pulse signal. A circuit included in the gate driver 101 may be an IC as in the source driver 100 or may be formed using a transistor similar to that in the pixel 103 of the display portion 102.

The gate driver 101 outputs scan signals to a plurality of gate lines GL. Note that a plurality of gate drivers 101 may be provided to separately control the gate lines GL.

In the display portion 102, the gate lines GL and the source lines SL are provided to intersect at substantially right angles. The pixel 103 is provided at the intersection of the gate line GL and the source line SL. For color display, the pixels 103 corresponding to the respective colors of red, green, and blue (RGB) are arranged in sequence in the display portion 102. Note that the pixels of RGB can be arranged in a stripe pattern, a mosaic pattern, a delta pattern, or the like as appropriate. Without limitation to RGB, white, yellow, or the like may be added to RGB for color display.

Figure 23A:
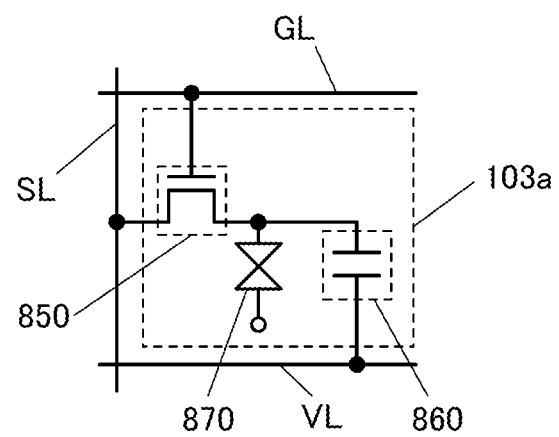
FIGS. 23A and 23B are circuit diagrams each illustrating a configuration example of a pixel.

The pixel 103 in FIG. 22 can have a configuration illustrated in FIG. 23A, for example.

A pixel circuit 103a illustrated in FIG. 23A includes a liquid crystal element 870, a transistor 850, and a capacitor 860.

The potential of one of a pair of electrodes of the liquid crystal element 870 is set as appropriate according to the specifications of the pixel circuit 103a. The alignment state of the liquid crystal element 870 depends on written data. A common potential may be supplied to one of the pair of electrodes of the liquid crystal element 870 included in a plurality of pixel circuits 103a. Alternatively, a potential supplied to one of the pair of electrodes of the liquid crystal element 870 in the pixel circuit 103a may be different between rows.

Examples of a driving method of the display device including the liquid crystal element 870 are a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

In the pixel circuit 103a, one of a source electrode and a drain electrode of the transistor 850 is electrically connected to the source line SL, and the other is electrically connected to the other of the pair of electrodes of the liquid crystal element 870. A gate electrode of the transistor 850 is electrically connected to the gate line GL. The transistor 850 has a function of controlling writing of image data.

One of a pair of electrodes of the capacitor 860 is electrically connected to a wiring supplied with a potential (hereinafter referred to as potential supply line VL), and the other is electrically connected to the other of the pair of electrodes of the liquid crystal element 870. The potential of the potential supply line VL is set as appropriate according to the specifications of the pixel circuit 103a. The capacitor 860 functions as a storage capacitor for storing written data.

For example, in the display device including the pixel circuit 103*a* in FIG. 23A, the pixel circuits 103*a* are sequentially selected row by row by the gate driver 101 illustrated in FIG. 22, whereby the transistor 850 is turned on and image data is written.

When the transistor 850 is turned off, the pixel circuit 103*a* to which the data has been written is brought into a holding state. This operation is sequentially performed row by row; thus, an image can be displayed.

Figure 23B:
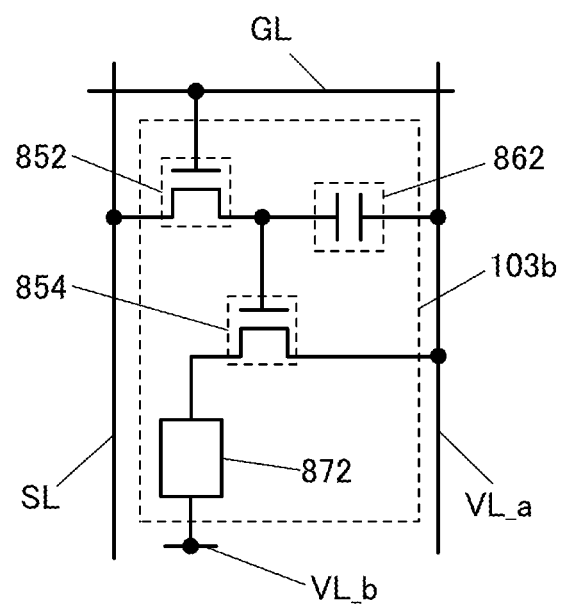

The pixel 103 in FIG. 22 can have a configuration illustrated in FIG. 23B, for example.

A pixel circuit 103*b* illustrated in FIG. 23B includes transistors 852 and 854, a capacitor 862, and a light-emitting element 872.

In the pixel circuit 103*b*, one of a source electrode and a drain electrode of the transistor 852 is electrically connected to the source line SL. A gate electrode of the transistor 852 is electrically connected to the gate line GL.

The transistor 852 has a function of controlling writing of image data.

One of a pair of electrodes of the capacitor 862 is electrically connected to a wiring supplied with a potential (hereinafter referred to as potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. A gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, an organic electroluminescent element (also referred to as organic EL element) can be used, for example. Note that the light-emitting element 872 is not limited to an organic EL element; an inorganic EL element containing an inorganic material may be used.

A high power supply potential VDD is supplied to one of the potential supply line VL_a and the potential supply line VL_b, and a low power supply potential VSS is supplied to the other.

For example, in the display device including the pixel circuit 103*b* in FIG. 23B, the pixel circuits 103*b* are sequentially selected row by row by the gate driver 101 illustrated in FIG. 22, whereby the transistor 852 is turned on and image data is written.

When the transistor 852 is turned off, the pixel circuit 103*b* to which the data has been written is brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image can be displayed.

Here, for example, a transistor that uses an oxide semiconductor for a semiconductor film can be used as the transistors 850, 852, 854, and the like.

Thus, a pixel circuit can hold an image signal for a longer time than a pixel circuit including a transistor that uses amorphous silicon for a semiconductor film. A transistor that uses an oxide semiconductor for a semiconductor film has higher mobility than a transistor that uses amorphous silicon for a semiconductor film. Thus, it is possible to miniaturize the transistor, for example.

The pixel circuit 103*b* may be connected to an external compensation circuit in order to compensate for variation in the threshold voltage of the transistor connected to the light-emitting element. An example of this case is illustrated in FIGS. 24 and 25.

Figure 24:
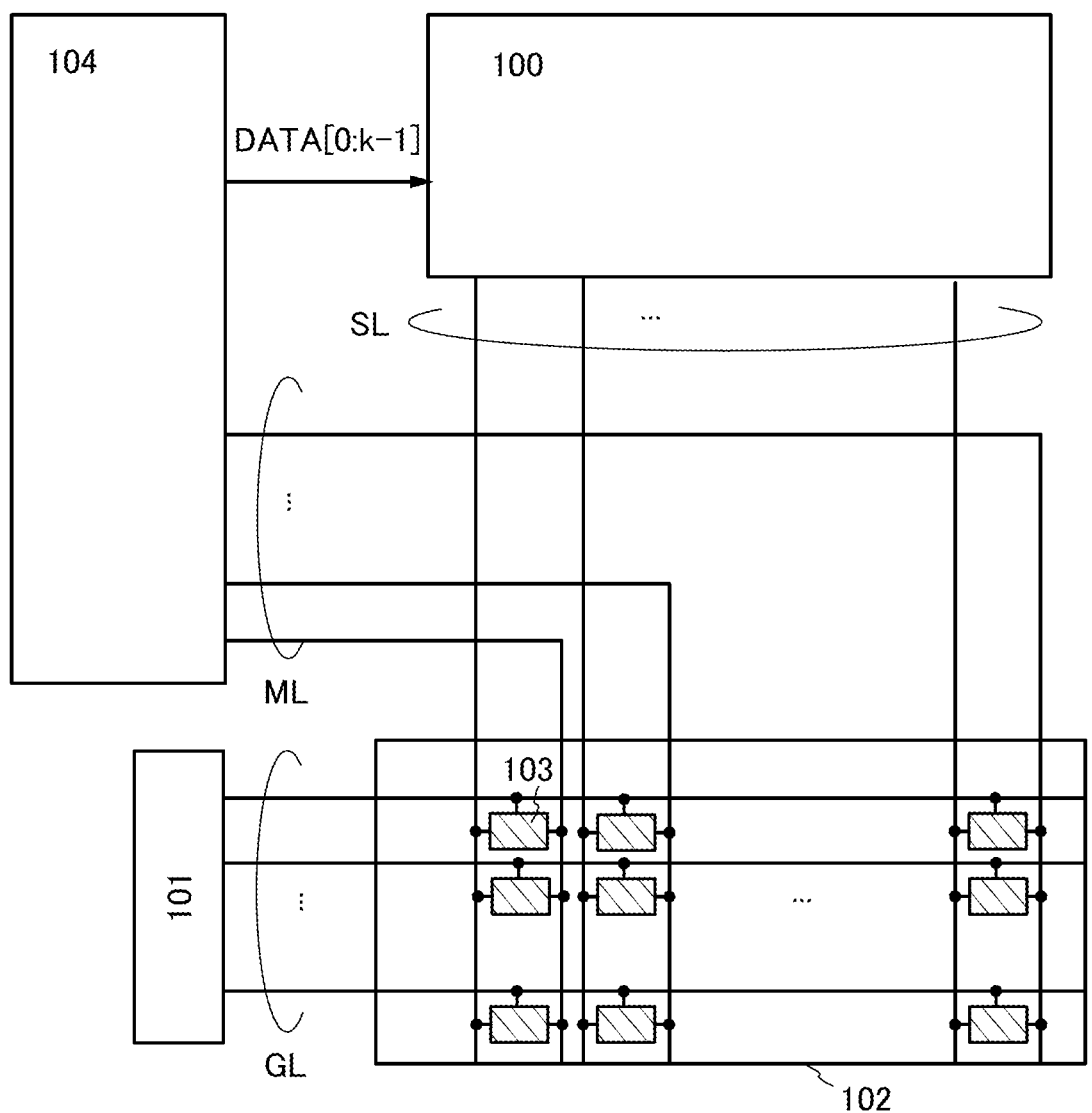
FIG. 24 is a circuit block diagram illustrating a configuration example of a display device.
Figure 25:
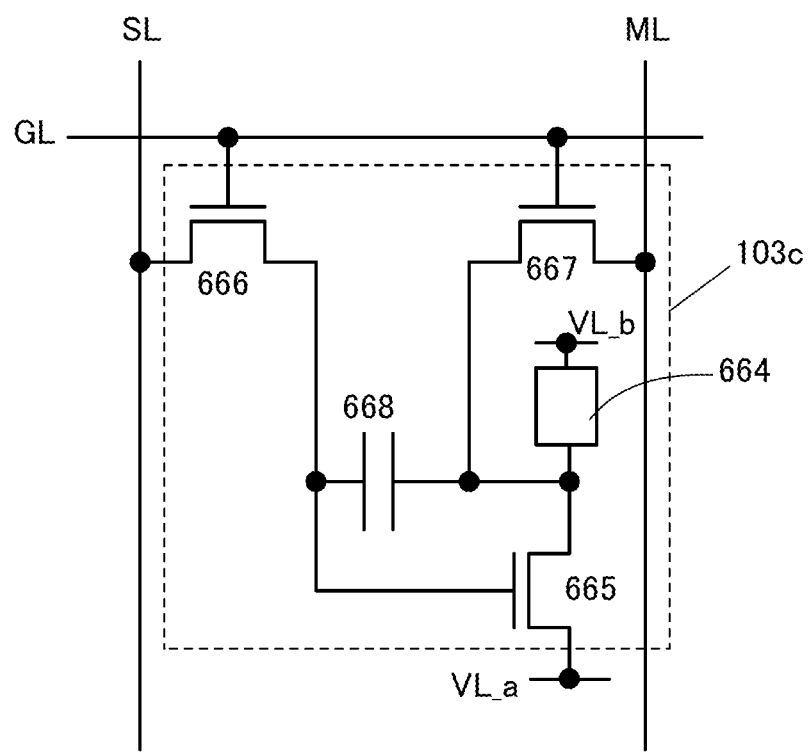
FIG. 25 is a circuit diagram illustrating a configuration example of a pixel.

In FIG. 24, a compensation circuit 104 and a plurality of wirings ML are added to the circuit block diagram of the display device in FIG. 22.

Current flowing through the light-emitting elements in the pixels 103 is supplied to the compensation circuit 104 through the wirings ML.

The compensation circuit 104 includes circuits such as a current detection circuit, a memory, an image processing circuit, and a CPU, for example.

The compensation circuit 104 has a function of monitoring a current of the light-emitting element supplied from the pixel 103 and compensating for the data signals DATA[0] to DATA[k−1] input to the source driver 100.

Note that the compensation circuit 104 and the source driver 100 may be included in one driver IC.

The pixel 103 in FIG. 24 can have a configuration illustrated in FIG. 25, for example.

A pixel circuit 103*c* illustrated in FIG. 25 includes transistors 665 to 667, a capacitor 668, and a light-emitting element 664.

In the pixel circuit 103*c*, the transistor 666 has a function of controlling electrical continuity between the source line SL and a gate of the transistor 665. One of a source and a drain of the transistor 665 is electrically connected to one of an anode and a cathode of the light-emitting element 664, and the other is electrically connected to the potential supply line VL_a. The transistor 667 has a function of controlling electrical continuity between the wiring ML and the one of the source and the drain of the transistor 665. One of a pair of electrodes of the capacitor 668 is electrically connected to the gate of the transistor 665, and the other is electrically connected to the one of the anode and the cathode of the light-emitting element 664. The other of the anode and the cathode of the light-emitting element 664 is electrically connected to the potential supply line VL_b.

The transistors 666 and 667 are switched in accordance with the potential of the gate line GL.

The description of the light-emitting element 872 in FIG. 23B is referred to for the details of the light-emitting element 664.

A current flowing through the light-emitting element 664 is supplied to the compensation circuit 104 through the transistor 667 and the wiring ML. The compensation circuit 104 monitors the current value and compensates for the data signals DATA[0] to DATA[k−1] supplied to the source driver 100.

For example, in this specification and the like, a display element, a display device including a display element, a light-emitting element, and a light-emitting device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, a display medium whose contrast, luminance, reflectivity, transmittance, or the like is changed by an electrical or magnetic effect may be included. Examples of display devices having EL elements include an EL display. Examples of display devices including electron emitters are a field emission display (FED) and an SED-type flat panel display (SED: surface-conduction electron-emitter display). Examples of display devices including liquid crystal elements are a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements are electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. In the case of using an LED, graphene or graphite may be provided under an electrode or a nitride semiconductor of the LED. Graphene or graphite may be a multilayer film in which a plurality of layers are stacked. Providing graphene or graphite enables a nitride semiconductor (e.g., an n-type GaN semiconductor layer including crystals) to be easily formed thereover. Furthermore, providing a p-type GaN semiconductor layer including crystals or the like thereover can form the LED. Note that an AlN layer may be provided between graphene or graphite and the n-type GaN semiconductor layer including crystals. The GaN semiconductor layers included in the LED may be formed by MOCVD. Note that when the graphene is provided, the GaN semiconductor layers included in the LED can also be formed by a sputtering method.

Embodiment 3

In this embodiment, an application example of the semiconductor device described in the foregoing embodiments to an electronic component, application examples of the electronic component to a display module, an application example of the display module, and application examples of an electronic device will be described with reference to FIGS. 26A and 26B, FIGS. 27A and 27B, FIG. 28, and FIGS. 29A to 29E.

Figure 26A:
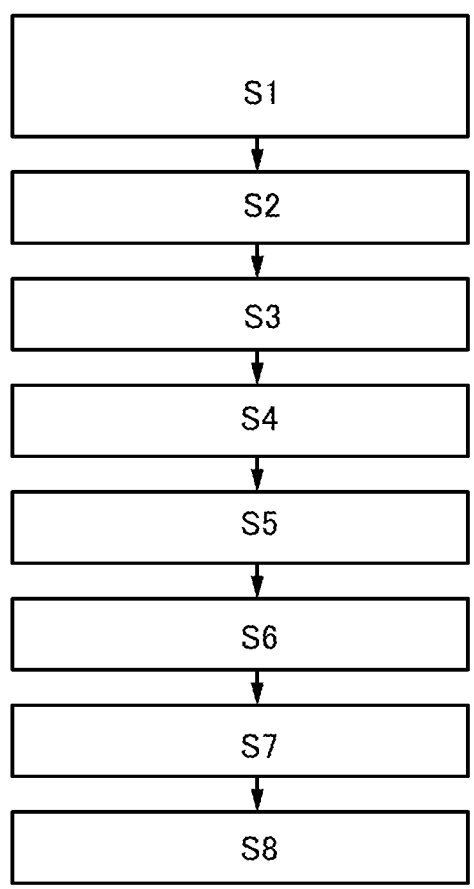
FIG. 26A is a flowchart showing a fabrication process of an electronic component.

FIG. 26A shows an example where the semiconductor device described in the foregoing embodiment is used to make an electronic component. Note that an electronic component is also referred to as a semiconductor package or an IC package. For the electronic component, there are various standards and names corresponding to the direction of terminals or the shape of terminals; hence, one example of the electronic component will be described in this embodiment.

A semiconductor device including the transistors illustrated in FIGS. 14A and 14B or FIGS. 15A and 15B is completed by integrating detachable components on a printed circuit board through the assembly process (post-process).

The post-process can be completed through steps shown in FIG. 26A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to an interposer is performed (Step S3). To bond a chip and an interposer in the die bonding step, resin bonding, tape-automated bonding, or the like is selected as appropriate depending on products.

Next, wire bonding for electrically connecting a wire of the interposer and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, printing process (marking) is performed on a surface of the package (Step S6). Then, through a final test step (Step S7), the electronic component is completed (Step S8).

Since the electronic component described above includes the semiconductor device described in the foregoing embodiment, it is possible to obtain a small and highly reliable electronic component.

Figure 26B:
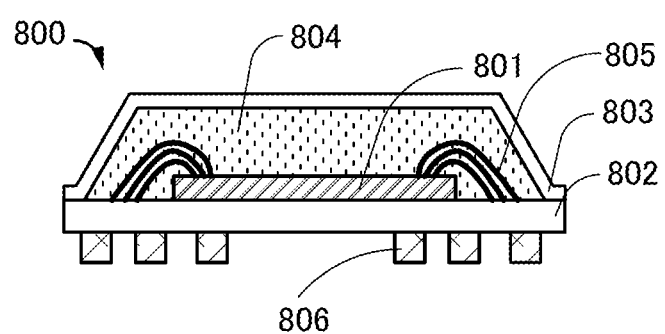
FIG. 26B is a schematic cross-sectional view of the electronic component.

FIG. 26B is a schematic cross-sectional view of a completed electronic component. In an electronic component 800 illustrated in FIG. 26B, a semiconductor device 801 is provided on a surface of an interposer 802. The semiconductor device 801 is connected to a wiring on the surface of the interposer 802 via a wire 805 to be electrically connected to a bump terminal 806 provided on the back surface of the interposer 802. The semiconductor device 801 over the interposer 802 is sealed by a package 803 with a space between the interposer 802 and the package 803 filled with an epoxy resin 804.

The electronic component 800 in FIG. 26B is mounted on a flexible printed circuit (FPC) or a display panel, for example.

Next, examples where the electronic component in FIG. 26B is mounted on a display panel will be described with reference to FIGS. 27A and 27B.

Figure 27A:
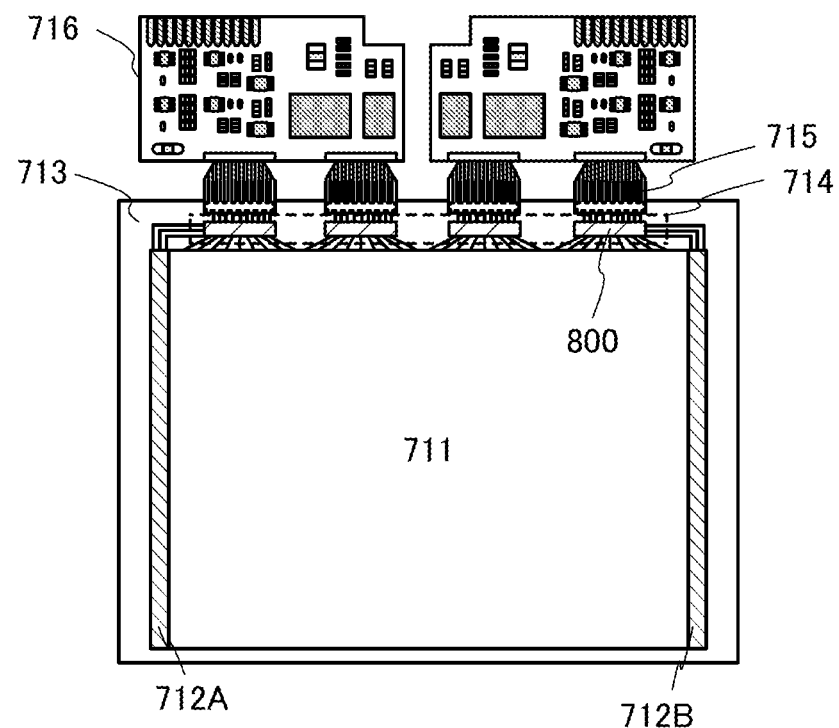
FIGS. 27A and 27B each illustrate a display panel including an electronic component.

FIG. 27A illustrates an example where a source driver 714 and gate drivers 712A and 712B are provided around a display portion 711 and a plurality of electronic components 800 are mounted on a substrate 713 as the source driver 714.

The electronic components 800 are mounted on the substrate 713 using an anisotropic conductive adhesive and an anisotropic conductive film.

The electronic components 800 are connected to an external circuit board 716 via FPCs 715.

Figure 27B:
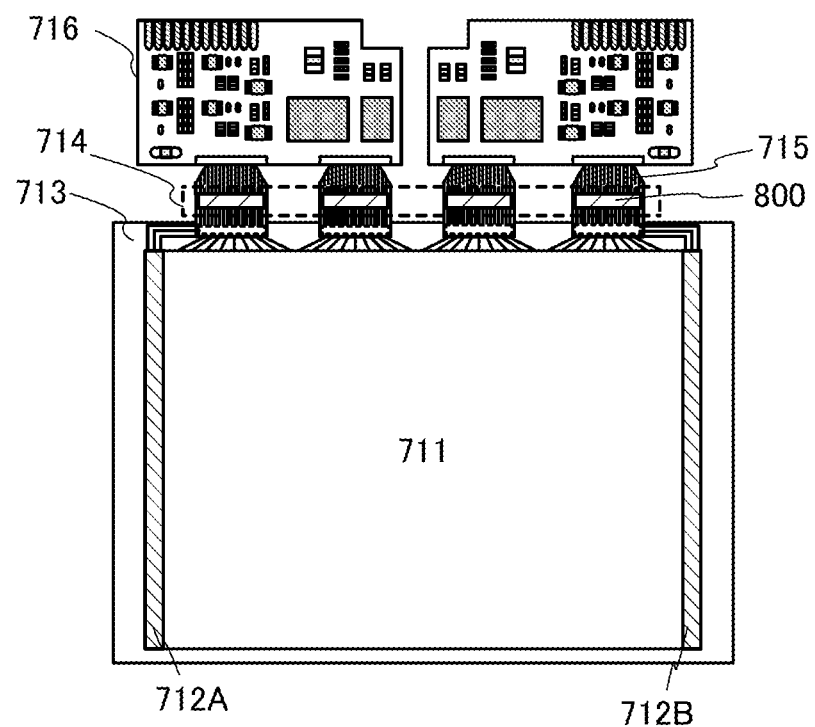

FIG. 27B illustrates an example where the source driver 714 and the gate drivers 712A and 712B are provided around the display portion 711 and a plurality of electronic components 800 are mounted on the FPCs 715 as the source driver 714.

Mounting the electronic components 800 on the FPCs 715 allows a larger display portion 711 to be provided over the substrate 713, resulting in a narrower frame.

Next, an application example of a display module using the display panel illustrated in FIG. 27A or FIG. 27B will be described with reference to FIG. 28.

Figure 28:
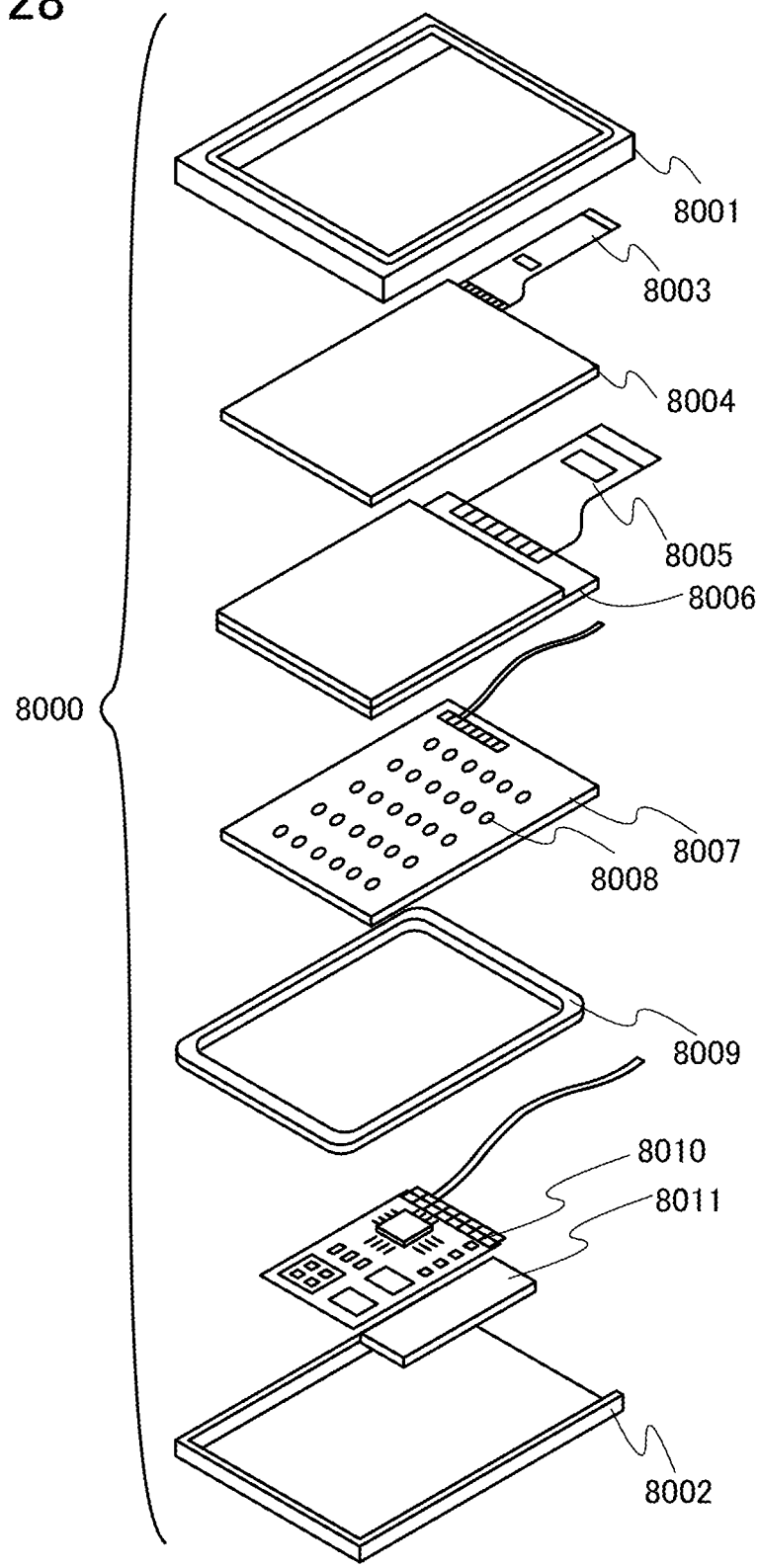
FIG. 28 illustrates a display module including a display panel.

In a display module 8000 illustrated in FIG. 28, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The display panel illustrated in FIG. 27A or FIG. 27B can be used as the display panel 8006 in FIG. 28.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can be formed to overlap with the display panel 8006. It is also possible to provide a touch panel function for a counter substrate (sealing substrate) of the display panel 8006. Alternatively, a photosensor may be provided in each pixel of the display panel 8006 to form an optical touch panel. Further alternatively, an electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

Next, the description is made on the case where a display panel including the above electronic component is used as a display panel of an electronic device such as a computer, a portable information appliance (including a mobile phone, a portable game machine, and an audio reproducing device), electronic paper, a television device (also referred to as a television or a television receiver), or a digital video camera.

Figure 29A:
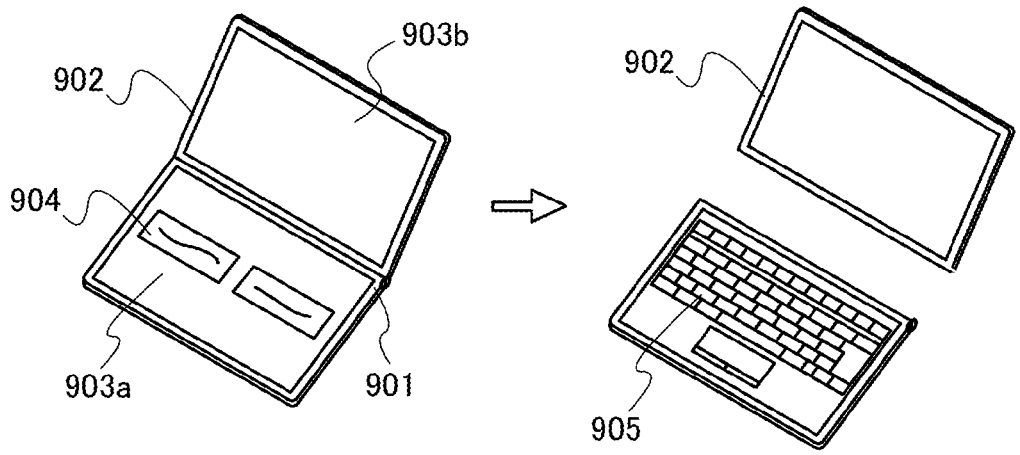
FIGS. 29A to 29E are electronic devices using electronic components.

FIG. 29A illustrates a portable information appliance that includes a housing 901, a housing 902, a first display portion 903a, a second display portion 903b, and the like. At least one of the housings 901 and 902 is provided with the electronic component including the semiconductor device of the foregoing embodiment. It is thus possible to obtain a small and highly reliable portable information appliance.

The first display portion 903a is a panel having a touch input function, and for example, as illustrated in the left of FIG. 29A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 29A. Thus, letters can be input quickly by key input as in a conventional information appliance, for example.

One of the first display portion 903a and the second display portion 903b can be detached from the portable information appliance as shown in the right of FIG. 29A. Providing the second display portion 903b with a touch input function makes the information appliance convenient because a weight to carry around can be further reduced and the information appliance can operate with one hand while the other hand supports the housing 902.

The portable information appliance in FIG. 29A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance in FIG. 29A may transmit and receive data wirelessly. Through wireless communication, desired book data or the like can be purchased and downloaded from an e-book server.

In addition, the housing 902 in FIG. 29A may be equipped with an antenna, a microphone function, and a wireless communication function to be used as a mobile phone.

Figure 29B:
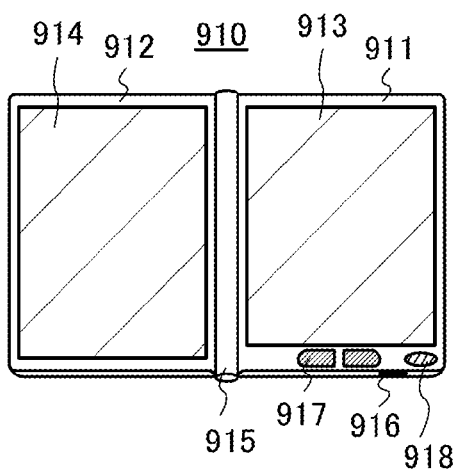

FIG. 29B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the semiconductor device of the foregoing embodiment is provided in at least one of the housings 911 and 912. It is thus possible to obtain a small and highly reliable e-book reader.

Figure 29C:
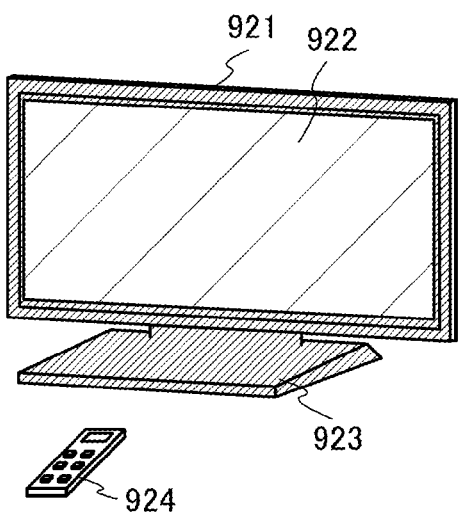

FIG. 29C illustrates a television device including a housing 921, a display portion 922, a stand 923, and the like. The television device can be controlled by a switch of the housing 921 and a remote controller 924. The electronic component including the semiconductor device of the foregoing embodiment is mounted on the housing 921 and the remote controller 924. Thus, it is possible to obtain a small and highly reliable television device.

Figure 29D:
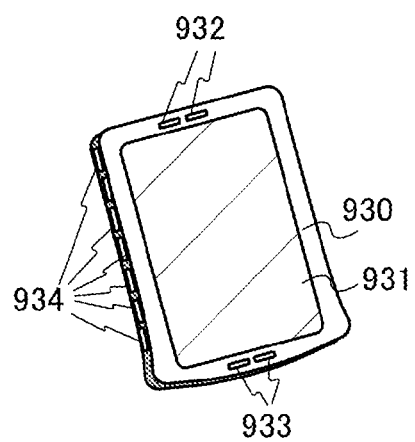

FIG. 29D illustrates a smartphone in which a main body 930 is provided with a display portion 931, a speaker 932, a microphone 933, an operation button 934, and the like. The electronic component including the semiconductor device of the foregoing embodiment is provided in the main body 930. It is therefore possible to obtain a small and highly reliable smartphone.

Figure 29E:
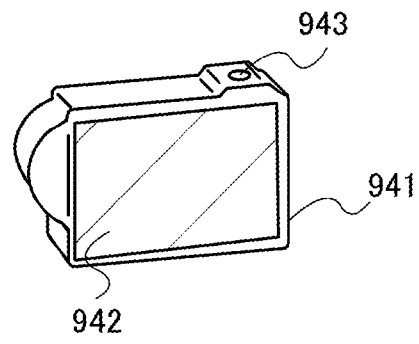

FIG. 29E illustrates a digital camera including a main body 941, a display portion 942, an operation switch 943, and the like. The electronic component including the semiconductor device of the foregoing embodiment is provided in the main body 941. Consequently, it is possible to obtain a small and highly reliable digital camera.

As described above, the electronic device shown in this embodiment incorporates the electronic component including the semiconductor device of the foregoing embodiment, thereby being reduced in size and having high reliability.

Embodiment 4

In this embodiment, the structure of a display panel of one embodiment of the present invention will be described with reference to FIGS. 30A, 30B1, and 30B2, FIGS. 31A to 31C, FIG. 32, and FIGS. 33A, 33B1, and 33B2.

FIGS. 30A, 30B1, and 30B2 illustrate the structure of a display panel 700 of one embodiment of the present invention. FIG. 30A is a bottom view of the display panel 700 of one embodiment of the present invention. FIG. 30B1 is a bottom view illustrating a part of FIG. 30A, and FIG. 30B2 is a bottom view illustrating the part illustrated in FIG. 30B1 in which some components are omitted.

FIGS. 31A to 31C illustrate the structure of the display panel 700 of one embodiment of the present invention. FIG. 31A is a cross-sectional view taken along dashed-dotted lines X3-X4, X5-X6, X7-X8, X9-X10, X11-X12, and X13-X14 in FIG. 30A. FIG. 31B is a cross-sectional view illustrating the structure of part of the display panel, and FIG. 31C is a cross-sectional view illustrating the structure of another part of the display panel.

Figure 32:
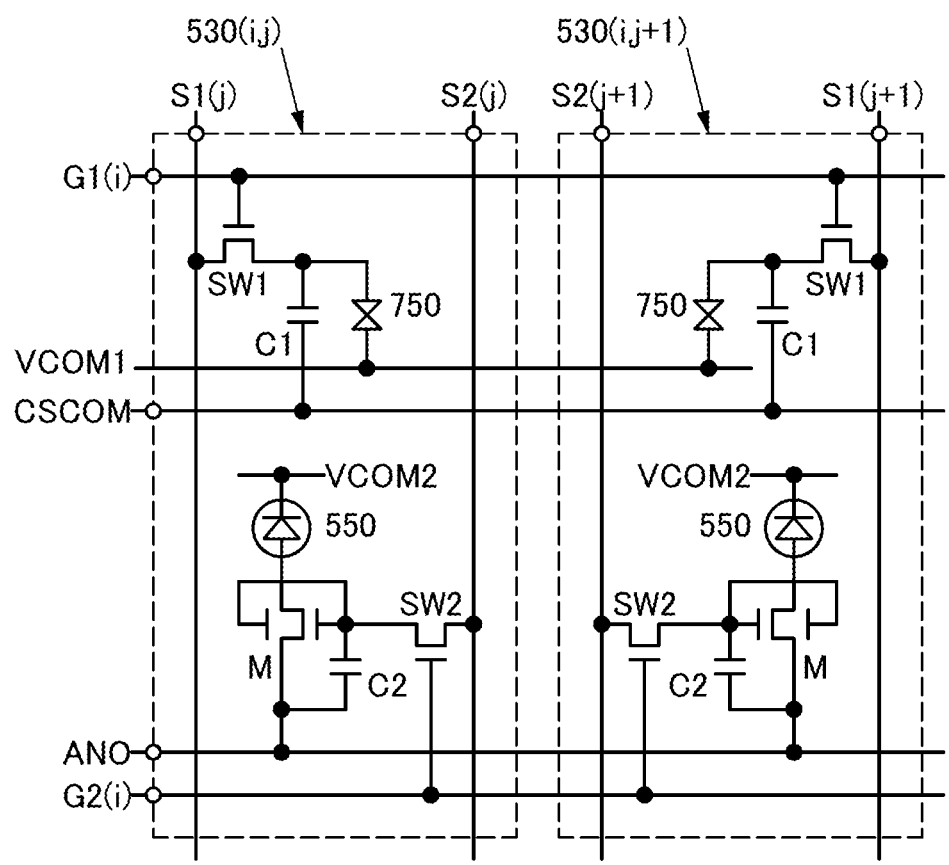
FIG. 32 is a circuit diagram illustrating a pixel circuit of an embodiment.

FIG. 32 illustrates the structure of the display panel 700, which is one embodiment of the present invention. FIG. 32 is a circuit diagram illustrating a pixel circuit 530($i,j$) and a pixel circuit 530($i,j$+1) that can be used as pixel circuits included in the display panel 700 of one embodiment of the present invention.

FIGS. 33A, 33B1, and 33B2 illustrate the structure of the display panel 700 of one embodiment of the present invention. FIG. 33A is a block diagram illustrating arrangement of pixels, wirings, and the like that can be used in the display panel 700 of one embodiment of the present invention. FIGS. 33B1 and 33B2 are schematic diagrams each illustrating arrangement of openings 751H that can be used in the display panel 700 of one embodiment of the present invention.

<Structure Example 1 of Display Panel>

The display panel 700 described in this embodiment includes a signal line S1($j$) and a pixel 702($i,j$) (see FIGS. 30B1 and 30B2).

The pixel 702($i,j$) is electrically connected to the signal line S1($j$).

The pixel 702($i,j$) includes a first display element 750($i,j$), a first conductive film, a second conductive film, an insulating film 501C, the pixel circuit 530($i,j$), and a second display element 550($i,j$) (see FIG. 31A and FIG. 32).

The first conductive film is electrically connected to the first display element 750($i,j$) (see FIG. 31A). For example, the first conductive film can be used for a first electrode 751($i,j$) of the first display element 750($i,j$).

The second conductive film includes a region overlapping with the first conductive film. For example, the second conductive film can be used for a conductive film 512B serving as a source electrode or a drain electrode of a transistor that can be used for a switch SW1.

The insulating film 501C includes a region interposed between the second conductive film and the first conductive film.

The pixel circuit 530($i,j$) is electrically connected to the second conductive film. For example, a transistor using the second conductive film for the conductive film 512B serving as a source electrode or a drain electrode can be used for the switch SW1 of the pixel circuit 530($i,j$) (see FIG. 31A and FIG. 32).

The second display element 550($i,j$) is electrically connected to the pixel circuit 530($i,j$).

The insulating film 501C has an opening 591A (see FIG. 31A).

The second conductive film is electrically connected to the first conductive film through the opening 591A. For example, the conductive film 512B is electrically connected to the first electrode 751($i,j$) doubling as the first conductive film.

The pixel circuit 530($i,j$) is electrically connected to the signal line S1($j$) (see FIG. 32). Note that the conductive film 512A is electrically connected to the signal line S1($j$) (see FIG. 31A and FIG. 32).

The first electrode 751($i,j$) has an edge portion embedded in the insulating film 501C.

The pixel circuit 530($i,j$) of the display panel described in this embodiment includes the switch SW1. The switch SW1 includes a transistor that includes an oxide semiconductor.

The second display element 550($i,j$) of the display panel described in this embodiment is configured to perform display in the same direction as the display direction of the first display element 750($i,j$). For example, in the drawing, dashed arrows show the direction in which the first display element 750($i,j$) displays images by controlling the intensity of external light reflection. In addition, a solid arrow shows the direction in which the second display element 550($i,j$) displays images (see FIG. 31A).

Furthermore, the second display element 550($i,j$) of the display panel described in this embodiment has a function of displaying images in a region surrounded by a region in which the first display element 750($i,j$) displays images. Note that the first display element 750($i,j$) displays images in a region overlapping with the first electrode 751($i,j$), and the second display element 550($i,j$) displays images in a region overlapping with the opening 751H.

The first display element 750($i,j$) of the display panel described in this embodiment of the present invention includes a reflective film having a function of reflecting incident light and has a function of controlling the intensity of reflected light. The reflective film has the opening 751H. Note that the first conductive film, the first electrode 751($i,j$), or the like can be used for the reflective film of the first display element 750($i,j$).

The second display element 550($i,j$) has a function of emitting light toward the opening 751H.

The display panel described in this embodiment includes the pixel 702($i,j$), a group of pixels 702($i$,1) to 702($i,n$), another group of pixels 702(1,$j$) to 702($m,j$), and a scan line G1($i$) (see FIG. 33A). Note that i is an integer greater than or equal to 1 and less than or equal to m, j is an integer greater than or equal to 1 and less than or equal to n, and each of m and n is an integer greater than or equal to 1.

The display panel described in this embodiment also includes a scan line G2($i$), a wiring CSCOM, and a wiring ANO.

The group of pixels 702($i$,1) to 702($i,n$) include the pixel 702($i,j$) and are arranged in the row direction (the direction shown by the arrow R in drawings).

The another group of pixels 702(1,j) to 702(m,j) include the pixel 702(i,j) and are arranged in the column direction (the direction shown by the arrow C in drawings) intersecting the row direction.

The scan line G1(i) is electrically connected to the group of pixels 702(i,1) to 702(i,n) arranged in the row direction.

The another group of pixels 702(1,j) to 702(m,j) arranged in the column direction are electrically connected to the signal line S1(j).

For example, the pixel 702(i,j+1) adjacent to the pixel 702(i,j) in the row direction has an opening in a position different from that of the opening 751H in the pixel 702(i,j) (see FIG. 33B1).

For example, the pixel 702(i+1,j) adjacent to the pixel 702(i,j) in the column direction has an opening in a position different from that of the opening 751H in the pixel 702(i,j) (see FIG. 33B2). Note that for example, the first electrode 751(i,j) can be used for the reflective film.

The display panel of one embodiment of the present invention includes a first display element, a first conductive film, a second conductive film, an insulating film, a pixel circuit, and a second display element. The first conductive film is electrically connected to the first display element. The second conductive film includes a region overlapping with the first conductive film. The insulating film includes a region located between the second conductive film and the first conductive film. The pixel circuit is electrically connected to the second conductive film. The second display element is electrically connected to the pixel circuit. The insulating film has an opening. The second conductive film is electrically connected to the first conductive film through the opening.

Thus, the first display element and the second display element that displays an image using a method different from that of the first display element can be driven using pixel circuits that can be formed in the same process. Thus, the novel display panel can be highly convenient or reliable.

The display panel described in this embodiment also includes a terminal 519B and a conductive film 511B (see FIG. 31A).

The insulating film 501C includes a region interposed between the terminal 519B and the conductive film 511B. The insulating film 501C has an opening 591B.

The terminal 519B is electrically connected to the conductive film 511B through the opening 591B. In addition, the conductive film 511B is electrically connected to the pixel circuit 530(i,j). For example, in the case where the first electrode 751(i,j) or the first conductive film is used as the reflective film, a surface serving as a contact of the terminal 519B faces in the same direction as a surface of the first electrode 751(i,j) that faces light incident on the first display element 750(i,j).

Thus, power or a signal can be supplied to the pixel circuit through the terminal. Thus, the novel display panel can be highly convenient or reliable.

The first display element 750(i,j) of the display panel described in this embodiment includes a layer 753 containing a liquid crystal material, the first electrode 751(i,j), and a second electrode 752. The second electrode 752 is positioned such that an electric field which controls the alignment of the liquid crystal material is generated between the second electrode 752 and the first electrode 751(i,j).

The display panel described in this embodiment also includes an alignment film AF1 and an alignment film AF2. The alignment film AF2 is provided such that the layer 753 containing a liquid crystal material is interposed between the alignment film AF1 and the alignment film AF2.

The second display element 550(i,j) of the display panel described in this embodiment includes a third electrode 551(i,j), a fourth electrode 552, and a layer 553(j) containing a light-emitting organic compound.

The fourth electrode 552 includes a region overlapping with the third electrode 551(i,j). The layer 553(j) containing a light-emitting organic compound is provided between the third electrode 551(i,j) and the fourth electrode 552. The third electrode 551(i,j) is electrically connected to the pixel circuit 530(i,j) at a connection portion 522.

The pixel 702(i,j) of the display panel described in this embodiment includes a coloring film CF1, a light-blocking film BM, an insulating film 771, and a functional film 770P.

The coloring film CF1 includes a region overlapping with the first display element 750(i,j). The light-blocking film BM has an opening in a region overlapping with the first display element 750(i,j).

The insulating film 771 is provided between the coloring film CF1 and the layer 753 containing a liquid crystal material or between the light-blocking film BM and the layer 753 containing a liquid crystal material. The insulating film 771 can reduce unevenness due to the thickness of the coloring film CF1. Furthermore, the insulating film 771 can prevent impurities from diffusing from the light-blocking film BM, the coloring film CF1, or the like to the layer 753 containing a liquid crystal material.

The functional film 770P includes a region overlapping with the first display element 750(i,j). The functional film 770P is provided such that a substrate 770 is interposed between the functional film 770P and the first display element 750(i,j).

The display panel described in this embodiment also includes a substrate 570, the substrate 770, and a functional layer 520.

The substrate 770 includes a region overlapping with the substrate 570. The functional layer 520 is provided between the substrate 570 and the substrate 770.

The functional layer 520 includes the pixel circuit 530(i,j), the second display element 550(i,j), an insulating film 521, and an insulating film 528. The functional layer 520 includes an insulating film 518 and an insulating film 516.

The insulating film 521 is provided between the pixel circuit 530(i,j) and the second display element 550(i,j).

The insulating film 528 is provided between the insulating film 521 and the substrate 570, and has an opening in a region overlapping with the second display element 550(i,j). The insulating film 528 formed along the outer edge of the third electrode 551 can prevent a short circuit between the third electrode 551 and the fourth electrode 552.

The insulating film 518 includes a region interposed between the insulating film 521 and the pixel circuit 530(i,j), and the insulating film 516 includes a region interposed between the insulating film 518 and the pixel circuit 530(i,j).

The display panel described in this embodiment also includes a bonding layer 505, a sealing material 705, and a structure body KB1.

The bonding layer 505 is provided between the functional layer 520 and the substrate 570, and has a function of bonding the functional layer 520 and the substrate 570 together.

The sealing material 705 is provided between the functional layer 520 and the substrate 770, and has a function of bonding the functional layer 520 and the substrate 770 together.

The structure body KB1 has a function of providing a certain space between the functional layer 520 and the substrate 770.

The display panel described in this embodiment also includes a terminal 519C, a conductive film 511C, and a conductor CP.

The insulating film 501C includes a region interposed between the terminal 519C and the conductive film 511C. The insulating film 501C has an opening 591C.

The terminal 519C is electrically connected to the conductive film 511C through the opening 591C. The conductive film 511C is electrically connected to the pixel circuit 530($i,j$).

The conductor CP is interposed between the terminal 519C and the second electrode 752, and electrically connects the terminal 519C and the second electrode 752. For example, a conductive particle can be used as the conductor CP.

The display panel described in this embodiment also includes a driver circuit GD and a driver circuit SD (see FIG. 30A and FIG. 33A).

The driver circuit GD is electrically connected to the scan line G1($i$). The driver circuit GD includes a transistor MD, for example. Specifically, a transistor including a semiconductor film that can be formed in the same process as the transistor included in the pixel circuit 530($i,j$) can be used as the transistor MD (see FIGS. 31A and 31C).

The driver circuit SD is electrically connected to the signal line S1($j$). The driver circuit SD is electrically connected to a terminal that can be formed in the same process as, for example, the terminal 519B or the terminal 519C with the use of a conductive material.

The driver circuit SD preferably includes a PTL circuit of one embodiment of the present invention. The use of the PTL circuit in the driver circuit SD enables high integration of the driver circuit SD. For the driver circuit SD, the description of the source driver 100 in Embodiment 2 can be referred to, for example.

Individual components included in the display panel will be described below. Note that these units cannot be clearly distinguished and one unit also serves as another unit or may include part of another unit.

For example, the first conductive film can be used for the first electrode 751($i,j$). Furthermore, the first conductive film can also be used for the reflective film.

The second conductive film can be used for the conductive film 512B serving as a source electrode or a drain electrode of a transistor.

Structure Example 1

The display panel of one embodiment of the present invention includes the substrate 570, the substrate 770, the structure body KB1, the sealing material 705, and the bonding layer 505.

The display panel of one embodiment of the present invention also includes the functional layer 520, the insulating film 521, and the insulating film 528.

The display panel of one embodiment of the present invention also includes the signal line S1($j$), a signal line S2($j$), a scan line G1($i$), the scan line G2($i$), the wiring CSCOM, and the wiring ANO.

The display panel of one embodiment of the present invention also includes a first conductive film and a second conductive film.

The display panel of one embodiment of the present invention also includes the terminal 519B, the terminal 519C, the conductive film 511B, and the conductive film 511C.

The display panel of one embodiment of the present invention also includes the pixel circuit 530($i,j$) and the switch SW1.

The display panel of one embodiment of the present invention also includes the first display element 750($i,j$), the first electrode 751($i,j$), a reflective film, the opening 751H, and the layer 753 containing a liquid crystal material, and the second electrode 752.

The display panel of one embodiment of the present invention also includes the alignment film AF1, the alignment film AF2, the coloring film CF1, the light-blocking film BM, the insulating film 771, and the functional film 770P.

The display panel of one embodiment of the present invention also includes the second display element 550($i,j$), the third electrode 551($i,j$), the fourth electrode 552, and the layer 553($j$) containing a light-emitting organic compound.

The display panel of one embodiment of the present invention also includes the insulating film 501C.

The display panel of one embodiment of the present invention also includes the driver circuit GD and the driver circuit SD.

<<Substrate 570>>

The substrate 570 or the like can be formed using a material having heat resistance high enough to withstand heat treatment in the manufacturing process. Specifically, non-alkali glass with a thickness of 0.7 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramic, or metal can be used for the substrate 570 or the like.

Specifically, non-alkali glass, soda-lime glass, potash glass, crystal glass, quartz, sapphire, or the like can be used for the substrate 570 or the like. Specifically, an inorganic oxide film, an inorganic nitride film, an inorganic oxynitride film, or the like can be used for the substrate 570 or the like. For example, silicon oxide, silicon nitride, silicon oxynitride, or aluminum oxide can be used for the substrate 570 or the like. For example, SUS or aluminum can be used for the substrate 570 or the like.

For example, a single crystal semiconductor substrate or a polycrystalline semiconductor substrate of silicon or silicon carbide, a compound semiconductor substrate of silicon germanium or the like, or an SOI substrate can be used as the substrate 570 or the like. Thus, a semiconductor element can be provided over the substrate 570 or the like.

For example, an organic material such as a resin, a resin film, or plastic can be used for the substrate 570 or the like. Specifically, a resin film or resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, inorganic material, or the like into a resin film can be used for the substrate 570 or the like. For example, a composite material formed by dispersing a fibrous or particulate resin, organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, and a silicon oxynitride film are stacked can be used for the substrate 570 or the like.

Specifically, a resin film, a resin plate, a stack thereof, or the like can be used for the substrate 570 or the like. Here, a resin film preferably includes, for example, a resin having a siloxane bond, an acrylic resin, polyester, polyolefin, polyamide, polyimide, polycarbonate, polyurethane, or the like.

Specifically, polyethylene terephthalate (PET), polyethylene naphthalate (PEN), polyethersulfone (PES), acrylic, or the like can be used for the substrate 570 or the like.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like formed on a substrate for use in manufacturing processes which can withstand heat applied in the manufacturing process can be transferred to the substrate 570 or the like. Thus, a transistor, a capacitor, or the like can be formed over a flexible substrate, for example.

<<Substrate 770>>

For example, a light-transmitting material can be used for the substrate 770. Specifically, any of the materials that can be used for the substrate 570 can be used for the substrate 770. Specifically, non-alkali glass polished to a thickness of approximately 0.7 mm or 0.1 mm can be used.

<<Structure Body KB1>>

The structures KB1 or the like can be formed using an organic material, an inorganic material, or a composite material of an organic material and an inorganic material. This allows a predetermined space to be provided between components between which the structure KB1 or the like is interposed.

Specifically, for the structure body KB1 or the like, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Sealing Material 705>>

For the sealing material 705 or the like, an inorganic material, an organic material, a composite material of an inorganic material and an organic material, or the like can be used.

For example, an organic material such as a thermally fusible resin or a curable resin can be used for the sealing material 705 or the like.

For example, an organic material such as a reactive curable adhesive, a light curable adhesive, a thermosetting adhesive, and/or an anaerobic adhesive can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the sealing material 705 or the like.

<<Bonding Layer 505>>

For example, any of the materials that can be used for the sealing material 705 can be used for the bonding layer 505.

<<Insulating Film 521>>

For example, an insulating inorganic material, an insulating organic material, an insulating composite material containing an inorganic material and an organic material, or the like can be used for the insulating film 521 or the like.

Specifically, for example, an inorganic oxide film, an inorganic nitride film, an inorganic oxynitride film, or a material obtained by stacking any of these films and the like can be used as the insulating film 521 or the like. For example, a film including any of a silicon oxide film, a silicon nitride film, a silicon oxynitride film, an aluminum oxide film, and the like or a film including a stack of any of these films can be used as the insulating film 521 or the like.

Specifically, for the insulating film 521 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating film 521, for example, can be reduced.

<<Insulating Film 528>>

For example, any of the materials that can be used for the insulating film 521 can be used for the insulating film 528 or the like. Specifically, a 1-μm-thick polyimide-containing film can be used as the insulating film 528.

<<Insulating Film 501C>>

For example, any of the materials that can be used for the insulating film 521 can be used for the insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

Note that the insulating film 501C has the opening 591A, the opening 591B, or the opening 591C.

<<Wiring, Terminal, and Conductive Film>>

A conductive material can be used for the wiring or the like. Specifically, a conductive material can be used for the signal line S1(*j*), the signal line S2(*j*), the scan line G1(*i*), the scan line G2(*i*), the wiring CSCOM, the wiring ANO, the terminal 519B, the terminal 519C, the conductive film 511B, the conductive film 511C, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is preferably used in microfabrication using a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film containing graphene formed by reducing a film containing graphene oxide can be used. The reduction can be performed by applying heat, using a reducing agent, or the like.

Specifically, a conductive high molecular compound can be used for the wiring or the like.

<<First Conductive Film and Second Conductive Film>>

For example, any of the materials that can be used for the wiring or the like can be used for the first conductive film or the second conductive film.

Alternatively, a first electrode $571(i,j)$, the wiring, or the like can be used for the first conductive film.

The wiring, the conductive film $512B$ of the transistor that can be used for the switch SW1, or the like can be used for the second conductive film.

<<Pixel Circuit $530(i,j)$>>

The pixel circuit $530(i,j)$ is electrically connected to the signal line $S1(j)$, the signal line $S2(j)$, the scan line $G1(i)$, the scan line $G2(i)$, the wiring CSCOM, and the wiring ANO (see FIG. 32).

The pixel circuit $530(i,j+1)$ is electrically connected to a signal line $S1(j+1)$, a signal line $S2(j+1)$, the scan line $G1(i)$, the scan line $G2(i)$, the wiring CSCOM, and the wiring ANO.

In the case where the voltage of a signal supplied to the signal line $S2(j)$ is different from the voltage of a signal supplied to the signal line $S1(j+1)$, the signal line $S1(j+1)$ is positioned apart from the signal line $S2(j)$. Specifically, the signal line $S2(j+1)$ is positioned adjacent to the signal line $S2(j)$.

The pixel circuit $530(i,j)$ includes the switch SW1, a capacitor C1, a switch SW2, a transistor M, and a capacitor C2.

For example, a transistor including a gate electrode electrically connected to the scan line $G1(i)$ and a first electrode electrically connected to the signal line $S1(j)$ can be used for the switch SW1.

The capacitor C1 includes a first electrode electrically connected to a second electrode of the transistor used for the switch SW1 and a second electrode electrically connected to the wiring CSCOM.

For example, a transistor including a gate electrode electrically connected to the scan line $G2(i)$ and a first electrode electrically connected to the signal line $S2(j)$ can be used for the switch SW2.

The transistor M includes a gate electrode electrically connected to a second electrode of the transistor used for the switch SW2 and a first electrode electrically connected to the wiring ANO.

Note that a transistor including a conductive film provided such that a semiconductor film is interposed between a gate electrode and the conductive film can be used as the transistor M. For example, a conductive film electrically connected to the wiring capable of supplying a potential equal to that supplied to the first electrode of the transistor M can be used.

The capacitor C2 includes a first electrode electrically connected to the second electrode of the transistor used for the switch SW2 and a second electrode electrically connected to the first electrode of the transistor M.

Note that a first electrode and a second electrode of the first display element $750$ are electrically connected to the second electrode of the transistor used for the switch SW1 and the wiring VCOM1, respectively. This enables the first display element $750$ to be driven.

Note that a first electrode and a second electrode of the second display element $550$ are electrically connected to the second electrode of the transistor M and the wiring VCOM2, respectively. This enables the second display element $550$ to be driven.

<<Switch SW1, Switch SW2, Transistor M, and Transistor MD>>

For example, a bottom-gate or top-gate transistor can be used for the switch SW1, the switch SW2, the transistor M, the transistor MD, and the like.

For example, a transistor including a semiconductor containing an element belonging to Group 14 can be used. Specifically, a semiconductor containing silicon can be used for a semiconductor film. For example, single crystal silicon, polysilicon, microcrystalline silicon, amorphous silicon, or the like can be used for the semiconductor films of the transistors.

For example, a transistor using an oxide semiconductor for a semiconductor film can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used for the switch SW1, the switch SW2, the transistor M, the transistor MD, and the like. Specifically, a transistor using an oxide semiconductor for a semiconductor film $508$ can be used for the switch SW1, the switch SW2, the transistor M, the transistor MD, and the like.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the data processing device can be reduced, and power consumption for driving can be reduced.

The transistor that can be used for the switch SW1 includes the semiconductor film $508$ and a conductive film $504$ including a region overlapping with the semiconductor film $508$ (see FIG. 31B). The transistor that can be used for the switch SW1 also includes the conductive film $512A$ and the conductive film $512B$.

Note that the conductive film $504$ and the insulating film $506$ serve as a gate electrode and a gate insulating film, respectively. The conductive film 512A has one of a function of a source electrode and a function of a drain electrode, and the conductive film 512B has the other.

A transistor including a conductive film 524 provided such that the semiconductor film 508 is interposed between the conductive film 504 and the conductive film 524 can be used as the transistor M (see FIG. 31C).

A conductive film formed by stacking a 10-nm-thick film containing tantalum and nitrogen and a 300-nm-thick film containing copper in this order can be used as the conductive film 504.

A material obtained by stacking a 400-nm-thick film containing silicon and nitrogen and a 200-nm-thick film containing silicon, oxygen, and nitrogen can be used for the insulating film 506.

A 25-nm-thick film containing indium, gallium, and zinc can be used as the semiconductor film 508.

A conductive film formed by stacking a 50-nm-thick containing tungsten, a 400-nm-thick film containing aluminum, and a 100-nm-thick film containing titanium in this order can be used as the conductive film 512A or the conductive film 512B.

<<First Display Element 750(i,j)>>

For example, a display element having a function of controlling transmission or reflection of light can be used as the first display element 750(i,j). For example, a combined structure of a polarizing plate and a liquid crystal element or a MEMS shutter display element can be used. The use of a reflective display element can reduce power consumption of a display panel. Specifically, a reflective liquid crystal display element can be used as the first display element 750(i,j).

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

<<First Electrode 751(i,j)>>

For example, the material that is used for the wiring or the like can be used for the first electrode 751(i,j). Specifically, a reflective film can be used for the first electrode 751(i,j).

<Reflective Film>

For example, a material that reflects visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example. This allows the first display element 750 to serve as a reflective liquid crystal element. Alternatively, for example, a material with unevenness on its surface can be used for the reflective film. In that case, incident light can be reflected in various directions so that a white image can be displayed.

Note that the first electrode 751(i,j) is not necessarily used for the reflective film and any of other structures may be employed. For example, the reflective film can be provided between the layer 753 containing a liquid crystal material and the first electrode 751(i,j). Alternatively, the first electrode 751(i,j) having a light-transmitting property can be provided between the reflective film and the layer 753 containing a liquid crystal material.

<<Opening 751H>>

If the ratio of the total area of the opening 751H to the total area of the reflective film other than the opening is excessively high, an image displayed using the first display element 750(i,j) is dark. If the ratio of the total area of the opening 751H to the total area of the reflective film other than the opening is excessively low, an image displayed using the second display element 550(i,j) is dark.

If the area of the opening 751H in the reflective film is too small, light emitted from the second display element 550(i,j) is not efficiently extracted for display.

The opening 751H may have a polygonal shape, a quadrangular shape, an elliptical shape, a circular shape, a cross shape, a stripe shape, a slit-like shape, or a checkered pattern. The opening 751H may be close to the adjacent pixel. The opening 751H is preferably provided close to a pixel that has a function of emitting light of the same color, in which case an undesired phenomenon in which light emitted from the second display element 550 enters a coloring film of the adjacent pixel, which is called cross talk, can be suppressed.

<<Second Electrode 752>>

For example, a material having a visible-light-transmitting property and conductivity can be used for the second electrode 752.

For example, a conductive oxide, a metal film thin enough to transmit light, or a metal nanowire can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

The alignment films AF1 and AF2 can be formed using a material containing polyimide or the like, for example. Specifically, a material formed to have alignment in the predetermined direction by rubbing treatment or an optical alignment technique can be used.

For example, a film containing soluble polyimide can be used for the alignment films AF1 or AF2.

<<Coloring Film CF1>>

The coloring film CF1 can be formed using a material transmitting light of a predetermined color, and can thus be used as a color filter or the like.

The coloring film CF1 can be formed using a material transmitting light of blue, green, red, yellow, or white, for example.

<<Light-Blocking Film BM>>

A material that prevents light transmission can be used for the light-blocking film BM, in which case the light-blocking film BM serves as a black matrix, for example.

<<Insulating Film 771>>

The insulating film 771 can be formed using polyimide, an epoxy resin, an acrylic resin, or the like.

<<Functional Film 770P>>

For example, a polarizing plate, a retardation plate, a diffusing film, an anti-reflective film, a condensing film, or the like can be used as the functional film 770P. Alternatively, a polarizing plate containing a dichromatic pigment can be used for the functional film 770P.

Alternatively, an antistatic film preventing the attachment of a foreign substance, a water repellent film suppressing the attachment of stain, a hard coat film suppressing a scratch in use, or the like can be used as the functional film 770P.

<<Second Display Element 550($i,j$)>>

A light-emitting element, for example, can be used as the second display element 550($i,j$). Specifically, an organic electroluminescence element, an inorganic electroluminescence element, a light-emitting diode, or the like can be used for the second display element 550($i,j$).

For example, a stack formed so as to emit blue, green, or red light, or the like can be used for the layer 553($j$) containing a light-emitting organic compound.

For example, a belt-like stack that extends in the column direction along the signal line S1($j$) can be used for the layer 553($j$) containing a light-emitting organic compound. Furthermore, a belt-like stack that extends in the column direction along the signal line S1($j$+1) that emits light of a color different from that of light emitted from the layer 553($j$) containing a light-emitting organic compound can be used for a layer 553($j$+1) containing a light-emitting organic compound.

For example, a stack formed so as to emit white light can be used for the layer 553($j$) containing a light-emitting organic compound and the layer 553($j$+1) containing a light-emitting organic compound. Specifically, a stack of a layer containing a light-emitting organic compound including a fluorescent material that emits blue light, and a layer containing a material that is other than a fluorescent material and that emits green light and/or red light or a layer containing a material that is other than a fluorescent material and that emits yellow light can be used for the layer 553($j$) containing a light-emitting organic compound and the layer 553($j$+1) containing a light-emitting organic compound.

For example, any of the materials that can be used for the wiring or the like can be used for the third electrode 551($i,j$) or the fourth electrode 552.

For example, a material that transmits visible light among the materials that can be used for the wiring or the like can be used for the third electrode 551($i,j$).

Specifically, conductive oxide, indium-containing conductive oxide, indium oxide, indium tin oxide, indium zinc oxide, zinc oxide, zinc oxide to which gallium is added, or the like can be used for the third electrode 551($i,j$). Alternatively, a metal film that is thin enough to transmit light can be used as the third electrode 551($i,j$).

For example, a material that reflects visible light among the materials that can be used for the wiring or the like can be used for the fourth electrode 552.

<<Driver Circuit GD>>

Any of a variety of sequential circuits such as a shift register can be used as the driver circuit GD. For example, the transistor MD, a capacitor, and the like can be used in the driver circuit GD. Specifically, a transistor including a semiconductor film that can be formed in the same step as the transistor M can be used.

As the transistor MD, a transistor different from the transistor that can be used for the switch SW1 can be used. Specifically, a transistor including the conductive film 524 can be used for the transistor MD (see FIG. 31C).

The semiconductor film 508 is provided between the conductive films 524 and 504. The insulating film 516 is provided between the conductive film 524 and the semiconductor film 508. The insulating film 506 is provided between the semiconductor film 508 and the conductive film 504. For example, the conductive film 524 is electrically connected to a wiring that supplies a potential equal to that supplied to the conductive film 504.

Note that the transistor MD can have the same structure as the transistor M.

<<Driver Circuit SD>>

As the driver circuit SD, the source driver 100 described in Embodiment 2 can be used, for example.

For example, a chip on glass (COG) method can be used to mount the driver circuit SD on a pad electrically connected to the pixel circuit 530($i,j$). Specifically, an anisotropic conductive film can be used to mount the integrated circuit on the pad.

Note that the pad can be formed in the same process as the terminal 519B or the terminal 519C.

<Method for Controlling Resistivity of Oxide Semiconductor Film>

The method for controlling the resistivity of an oxide semiconductor film will be described.

An oxide semiconductor film with a predetermined resistivity can be used for the semiconductor film 508, the conductive film 524, or the like.

For example, a method for controlling the concentration of impurities such as hydrogen and water contained in the oxide semiconductor film and/or the oxygen vacancies in the film can be used as the method for controlling the resistivity of the oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, whereby hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor film with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$ can be suitably used as the conductive film 524.

On the other hand, an oxide semiconductor film with a high resistivity can be used for a semiconductor film where a channel of a transistor is formed. Specifically, the oxide semiconductor film can be suitably used for as the semiconductor film 508.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancy is filled with oxygen and the concentration of hydrogen is reduced can be referred to as a highly purified intrinsic or substantially highly purified intrinsic oxide semiconductor film. The term "substantially intrinsic" refers to a state where an oxide semiconductor film has a carrier density lower than $8\times10^{11}$/cm$^3$, preferably lower than $1\times10^{11}$/cm$^3$, more preferably lower than $1\times10^{10}$/cm$^3$. A highly purified intrinsic or substantially highly purified intrinsic oxide semiconductor film has few carrier generation sources, and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor film having a hydrogen concentration which is measured by secondary ion mass spectrometry (SIMS) of lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 508 is used as the conductive film 524.

A film whose hydrogen concentration is twice or more, preferably ten times or more the hydrogen concentration in the semiconductor film 508 can be used as the conductive film 524.

A film whose resistivity is greater than or equal to $1\times10^{-8}$ times and less than $1\times10^{-1}$ times the resistivity of the semiconductor film 508 can be used as the conductive film 524.

Specifically, a film with a resistivity of greater than or equal to $1\times10^{-3}$ Ωcm and less than $1\times10^4$ Ωcm, preferably greater than or equal to $1\times10^{-3}$ Ωcm and less than $1\times10^{-1}$ Ωcm can be used as the conductive film 524.

This embodiment can be combined with any of the other embodiments in this specification as appropriate.

Embodiment 5

In this embodiment, the structure of a data processing device of one embodiment of the present invention will be described with reference to FIGS. 34A to 34C.

Figure 34A:
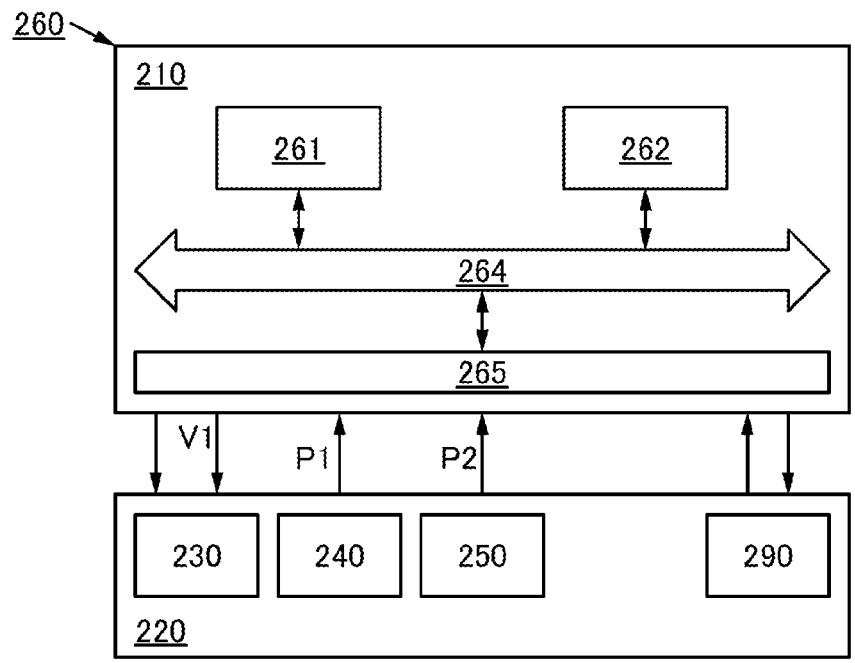
FIG. 34A is a block diagram and FIGS. 34B and 34C are projection views each illustrating a structure of a data processing device of an embodiment.
Figure 34B:
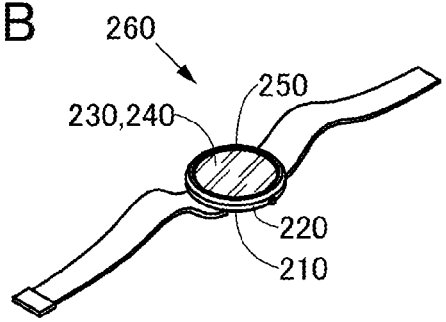
Figure 34C:
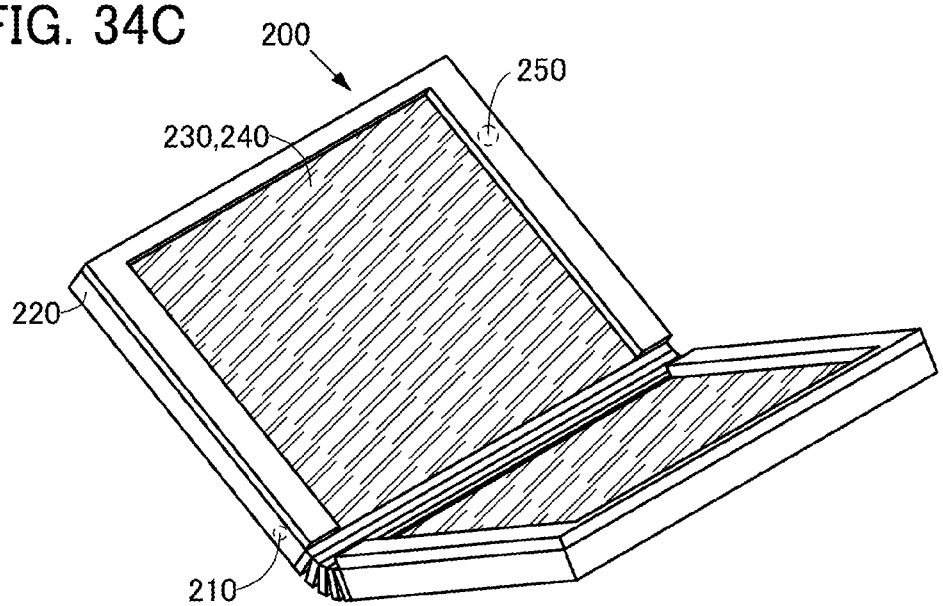

FIG. 34A is a block diagram illustrating the structure of a data processing device 260. FIGS. 34B and 34C are each a projection view illustrating an example of an external view of the data processing device 260.

<Configuration Example of Data Processing Device>

The data processing device 260 described in this embodiment includes an arithmetic device 210 and an input/output device 220 (see FIG. 34A).

The arithmetic device 210 has a function of receiving positional data P1 and supplying image data V and control data.

The input/output device 220 has a function of supplying the positional data P1 and receiving the image data V and the control data.

The input/output device 220 includes the display portion 230 that displays the image data V and an input portion 240 that supplies the positional data P1.

The display portion 230 includes a first display element 235LC and a second display element 235EL overlapping with the first display element 235LC. The display portion 230 further includes a first pixel circuit for driving the first display element 235LC and a second pixel circuit for driving the second display element 235EL.

The input portion 240 has a function of determining the position of a pointer and supplying the positional data P1 determined in accordance with the position.

The arithmetic device 210 has a function of determining the moving speed of the pointer in accordance with the positional data P1.

The arithmetic device 210 has a function of determining the contrast or brightness of the image data V in accordance with the moving speed.

The data processing device 260 described in this embodiment includes the input/output device 220 that supplies the positional data P1 and receives the image data V and the arithmetic device 210 that receives the positional data P1 and supplies the image data V. The arithmetic device 210 has a function of determining the contrast or brightness of the image data V in accordance with the moving speed of the positional data P1.

With this structure, eyestrain on a user caused when the display position of image data is moved can be reduced, that is, eye-friendly display can be achieved. Moreover, the power consumption can be reduced and excellent visibility can be provided even in a bright place exposed to direct sunlight, for example. Thus, the novel data processing device that is highly convenient or reliable can be provided.

<Configuration>

The data processing device of one embodiment of the present invention includes the arithmetic device 210 or the input/output device 220.

<<Arithmetic Device 210>>

The arithmetic device 210 includes an arithmetic unit 261 and a memory unit 262. The arithmetic device 210 further includes a transmission path 264 and an input/output interface 265 (see FIG. 34A).

<<Arithmetic Unit 261>>

The arithmetic unit 261 has a function of, for example, executing a program.

<<Memory Unit 262>>

The memory unit 262 has a function of, for example, storing the program executed by the arithmetic unit 261, initial data, setting data, an image, or the like.

Specifically, a hard disk, a flash memory, a memory including a transistor including an oxide semiconductor, or the like can be used for the memory unit 262.

<<Input/output Interface 265, Transmission Path 264>>

The input/output interface 265 includes a terminal or a wiring and has a function of supplying and receiving data. For example, the input/output interface 265 can be electrically connected to the transmission path 264 and the input/output device 220.

The transmission path 264 includes a wiring and has a function of supplying and receiving data. For example, the transmission path 264 can be electrically connected to the input/output interface 265. Alternatively, the transmission path 264 can be electrically connected to the arithmetic unit 261, the memory unit 262, or the input/output interface 265.

<<Input/Output Device 220>>

The input/output device 220 includes the display portion 230, the input portion 240, a sensor portion 250, or a communication portion 290.

<<Display Portion 230>>

The display portion 230 includes a display region 231, a driver circuit GD, and a driver circuit SD.

Here, as the display portion 230, any of the display devices described in Embodiment 2 or any of the display panels described in Embodiment 4 can be used.

<<Input Portion 240>>

Any of a variety of human interfaces or the like can be used as the input portion 240 (see FIG. 34A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a certain operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of acquiring data P2 by determining the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image data is displayed using the first display element 235LC. When the arithmetic device 210 determines that it is dim, image data is displayed using the first display element 235LC and the second display element 235EL. When the arithmetic device 210 determines that it is dark, image data is displayed using the second display element 235EL.

Specifically, an image is displayed with a reflective liquid crystal element and an organic EL element in accordance with the ambient brightness.

Thus, image data can be displayed in such a manner that, for example, a reflective display element is used under strong ambient light, a reflective display element and a self-luminous display element are used in dim light, and a self-luminous display element is used in dark light. Thus, a novel data processing device which has low power consumption and is highly convenient or reliable can be provided.

For example, a sensor having a function of determining the chromaticity of ambient light, such as a CCD camera, can be used in the sensor portion 250; thus, white balance can be adjusted in accordance with the chromaticity of ambient light determined by the sensor portion 250.

Specifically, in the first step, disruption of white balance of ambient light is detected.

In the second step, the intensity of light of a color which is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel data processing device which can display an image with low power consumption or with adjusted white balance and which is highly convenient and reliable can be provided.

<<Communication Portion 290>>

The communication portion 290 has a function of supplying and acquiring data to/from a network.

Image data may be generated based on the usage ambience of the data processing device acquired by the sensor portion 250. For example, user's favorite color can be used as the background color of the image data in accordance with the acquired ambient brightness or the like (see FIG. 34B).

Image data may be generated in accordance with received data delivered to a specific space using the communication portion 290. For example, educational materials can be fed from a classroom of, for example, a school or a university and displayed to be used as a schoolbook. Alternatively, materials distributed from a conference room in, for example, a company can be received and displayed (see FIG. 34C).

Thus, favorable environment can be provided for a user of a data processing device 200.

This embodiment can be combined with any of the other embodiments in this specification as appropriate.

This application is based on Japanese Patent Application serial no. 2015-157366 filed with Japan Patent Office on Aug. 7, 2015, the entire contents of which are hereby incorporated by reference.

What is claimed is:

1. A semiconductor device comprising:
   a first transistor, a second transistor, a third transistor, a fourth transistor, a fifth transistor, and a sixth transistor,
   wherein a gate of the first transistor and a gate of the third transistor are electrically connected to a first wiring,
   wherein a gate of the second transistor and a gate of the fourth transistor are electrically connected to a second wiring,
   wherein a gate of the fifth transistor is electrically connected to a third wiring,
   wherein a gate of the sixth transistor is electrically connected to a fourth wiring,
   wherein one of a source and a drain of the fifth transistor is electrically connected to one of a source and a drain of the sixth transistor,
   wherein the other of the source and the drain of the fifth transistor is electrically connected to one of a source and a drain of the first transistor and one of a source and a drain of the second transistor,
   wherein the other of the source and the drain of the sixth transistor is electrically connected to one of a source and a drain of the third transistor and one of a source and a drain of the fourth transistor,
   wherein the first transistor, the third transistor, and the fifth transistor are arranged in line, and
   wherein a channel region of the fifth transistor is located between a channel region of the first transistor and a channel region of the third transistor.

2. The semiconductor device according to claim 1, wherein a semiconductor layer comprising the channel region of the fifth transistor is located between a semiconductor layer comprising the channel region of the first transistor and a semiconductor layer comprising the channel region of the third transistor when seen from above.

3. The semiconductor device according to claim 1, wherein the first transistor, the second transistor, the third transistor, the fourth transistor, the fifth transistor, and the sixth transistor have the same conductivity type.

4. The semiconductor device according to claim 1,
   wherein the first transistor, the second transistor, and the fifth transistor are p-channel transistors, and
   wherein the third transistor, the fourth transistor, and the sixth transistor are n-channel transistors.

5. The semiconductor device according to claim 1,
   wherein the first wiring is configured to be supplied with a first signal,
   wherein the second wiring is configured to be supplied with an inverted signal of the first signal,
   wherein the third wiring is configured to be supplied with a second signal, and
   wherein the fourth wiring is configured to be supplied with an inverted signal of the second signal.

6. The semiconductor device according to claim 1, wherein a channel width of each of the fifth transistor and the sixth transistor is greater than twice and less than five times a channel width of each of the first transistor, the second transistor, the third transistor, and the fourth transistor.

7. The semiconductor device according to claim 1, further comprising a seventh transistor,
   wherein one of a source and a drain of the seventh transistor is electrically connected to the one of the source and the drain of the fifth transistor and the one of the source and the drain of the sixth transistor, and
   wherein the first transistor, the third transistor, the fifth transistor, and the seventh transistor are arranged in line.

8. The semiconductor device according to claim 1, further comprising a seventh transistor,
   wherein one of a source and a drain of the seventh transistor is electrically connected to the one of the source and the drain of the fifth transistor and the one of the source and the drain of the sixth transistor,
   wherein the first transistor, the third transistor, the fifth transistor, and the seventh transistor are arranged in line, and
   wherein a channel width of the seventh transistor is greater than twice and less than five times a channel width of each of the first transistor, the second transistor, the third transistor, the fourth transistor, the fifth transistor, and the sixth transistor.

9. The semiconductor device according to claim 1, further comprising a seventh transistor, an eighth transistor, a ninth transistor, a tenth transistor, an eleventh transistor, a twelfth transistor, a thirteenth transistor, a fourteenth transistor, and a fifteenth transistor,
   wherein one of a source and a drain of the seventh transistor is electrically connected to the one of the source and the drain of the fifth transistor and the one of the source and the drain of the sixth transistor,
   wherein a gate of the eighth transistor, a gate of the tenth transistor, a gate of the twelfth transistor, and a gate of the fourteenth transistor are electrically connected to a fifth wiring,
   wherein a gate of the ninth transistor, a gate of the eleventh transistor, a gate of the thirteenth transistor, and a gate of the fifteenth transistor are electrically connected to a sixth wiring,
   wherein one of a source and a drain of the eighth transistor is supplied with a first voltage,
   wherein one of a source and a drain of the ninth transistor is supplied with a second voltage,
   wherein one of a source and a drain of the tenth transistor is supplied with a third voltage,
   wherein one of a source and a drain of the eleventh transistor is supplied with a fourth voltage,
   wherein one of a source and a drain of the twelfth transistor is supplied with a fifth voltage,
   wherein one of a source and a drain of the thirteenth transistor is supplied with a sixth voltage, wherein one of a source and a drain of the fourteenth transistor is supplied with a seventh voltage, wherein one of a source and a drain of the fifteenth transistor is supplied with an eighth voltage, wherein the other of the source and the drain of the eighth transistor and the other of the source and the drain of the ninth transistor are electrically connected to the other of the source and the drain of the first transistor, wherein the other of the source and the drain of the tenth transistor and the other of the source and the drain of the eleventh transistor are electrically connected to the other of the source and the drain of the second transistor, wherein the other of the source and the drain of the twelfth transistor and the other of the source and the drain of the thirteenth transistor are electrically connected to the other of the source and the drain of the third transistor, wherein the other of the source and the drain of the fourteenth transistor and the other of the source and the drain of the fifteenth transistor are electrically connected to the other of the source and the drain of the fourth transistor, wherein the fifth wiring is supplied with a third signal, wherein the sixth wiring is supplied with an inverted signal of the third signal, wherein a channel width of each of the fifth to seventh transistors is greater than twice and less than five times a channel width of each of the eighth to fifteenth transistors, wherein the first to fifteenth transistors have the same conductivity type, and wherein gate electrodes of the eighth to fifteenth transistors are continuous.

10. An electronic component comprising:
the semiconductor device according to claim 1; and
a bump terminal electrically connected to the semiconductor device.

11. An electronic device comprising:
the electronic component according to claim 10; and
a display device.

12. A semiconductor device comprising:
a first circuit;
a second circuit; and
a third circuit,
wherein the first circuit is configured to select one of first to 2N-th potentials which are k-bit potentials,
wherein the second circuit is configured to select one of (2N+1)-th to 4N-th potentials which are k-bit potentials,
wherein the third circuit is configured to select one of the potential selected by the first circuit and the potential selected by the second circuit,
wherein N is an integer of 1 or more,
wherein k satisfies $2N=2^k$,
wherein each of the first circuit and the second circuit comprises a plurality of transistors with a first channel width,
wherein the third circuit comprises a plurality of transistors with a second channel width,
wherein the second channel width is larger than the first channel width, and
wherein the first circuit, the second circuit, and the third circuit are arranged in line.

13. The semiconductor device according to claim 12, wherein the plurality of transistors included in the first circuit are 2N transistors to which the first to 2N-th potentials are supplied, respectively, and
wherein gate electrodes of the 2N transistors are continuous.

14. The semiconductor device according to claim 12, wherein the second channel width is greater than twice and less than five times the first channel width.

15. An electronic component comprising:
the semiconductor device according to claim 12; and
a bump terminal electrically connected to the semiconductor device.

16. An electronic device comprising:
the electronic component according to claim 15; and
a display device.

17. A semiconductor device comprising:
a first transistor, a second transistor, a third transistor, a fourth transistor, a fifth transistor, and a sixth transistor,
wherein a gate of the first transistor and a gate of the third transistor are electrically connected to a first wiring,
wherein a gate of the second transistor and a gate of the fourth transistor are electrically connected to a second wiring,
wherein a gate of the fifth transistor is electrically connected to a third wiring,
wherein a gate of the sixth transistor is electrically connected to a fourth wiring,
wherein one of a source and a drain of the fifth transistor is electrically connected to one of a source and a drain of the sixth transistor,
wherein the other of the source and the drain of the fifth transistor is electrically connected to one of a source and a drain of the first transistor and one of a source and a drain of the second transistor,
wherein the other of the source and the drain of the sixth transistor is electrically connected to one of a source and a drain of the third transistor and one of a source and a drain of the fourth transistor,
wherein the first transistor, the third transistor, and the fifth transistor are arranged in line, and
wherein a semiconductor layer comprising a channel region of the fifth transistor is located between a semiconductor layer comprising a channel region of the first transistor and a semiconductor layer comprising a channel region of the third transistor when seen from above.

18. The semiconductor device according to claim 17, wherein the first transistor, the second transistor, the third transistor, the fourth transistor, the fifth transistor, and the sixth transistor have the same conductivity type.

19. The semiconductor device according to claim 17, wherein the first transistor, the second transistor, and the fifth transistor are p-channel transistors, and
wherein the third transistor, the fourth transistor, and the sixth transistor are n-channel transistors.

20. The semiconductor device according to claim 17, wherein the first wiring is configured to be supplied with a first signal,
wherein the second wiring is configured to be supplied with an inverted signal of the first signal,
wherein the third wiring is configured to be supplied with a second signal, and
wherein the fourth wiring is configured to be supplied with an inverted signal of the second signal.

21. The semiconductor device according to claim 17, wherein a channel width of each of the fifth transistor and the sixth transistor is greater than twice and less than five times a channel width of each of the first transistor, the second transistor, the third transistor, and the fourth transistor.

22. The semiconductor device according to claim 17, further comprising a seventh transistor,
  wherein one of a source and a drain of the seventh transistor is electrically connected to the one of the source and the drain of the fifth transistor and the one of the source and the drain of the sixth transistor, and
  wherein the first transistor, the third transistor, the fifth transistor, and the seventh transistor are arranged in line.

23. The semiconductor device according to claim 17, further comprising a seventh transistor,
  wherein one of a source and a drain of the seventh transistor is electrically connected to the one of the source and the drain of the fifth transistor and the one of the source and the drain of the sixth transistor,
  wherein the first transistor, the third transistor, the fifth transistor, and the seventh transistor are arranged in line, and
  wherein a channel width of the seventh transistor is greater than twice and less than five times a channel width of each of the first transistor, the second transistor, the third transistor, the fourth transistor, the fifth transistor, and the sixth transistor.

* * * * *